(12) United States Patent
Ishikawa et al.

(10) Patent No.: US 11,940,729 B2
(45) Date of Patent: Mar. 26, 2024

(54) PHOTOSENSITIVE COMPOSITION, NEGATIVE PHOTOSENSITIVE COMPOSITION, PIXEL DIVISION LAYER AND ORGANIC EL DISPLAY DEVICE

(71) Applicant: TORAY INDUSTRIES, INC., Tokyo (JP)

(72) Inventors: Akihiro Ishikawa, Otsu (JP); Takashi Honma, Otsu (JP); Yoko Momiyama, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 17/777,731

(22) PCT Filed: Nov. 17, 2020

(86) PCT No.: PCT/JP2020/042729
§ 371 (c)(1),
(2) Date: May 18, 2022

(87) PCT Pub. No.: WO2021/111860
PCT Pub. Date: Jun. 10, 2021

(65) Prior Publication Data
US 2023/0127537 A1    Apr. 27, 2023

(30) Foreign Application Priority Data
Dec. 2, 2019   (JP) ................ 2019-217792

(51) Int. Cl.
*G03F 7/004* (2006.01)
*C09B 67/08* (2006.01)
(Continued)

(52) U.S. Cl.
CPC ........ *G03F 7/0048* (2013.01); *C09B 67/0007* (2013.01); *C09B 67/002* (2013.01);
(Continued)

(58) Field of Classification Search
None
See application file for complete search history.

(56) References Cited

U.S. PATENT DOCUMENTS

| 6,114,464 A * | 9/2000 | Reck ................ D04H 1/587 |
| | | 525/329.9 |
| 2015/0311268 A1* | 10/2015 | Cheng ............... H10K 59/352 |
| | | 257/40 |

(Continued)

FOREIGN PATENT DOCUMENTS

| JP | 2002-296803 A | 10/2002 |
| JP | 2008-108533 A | 5/2008 |

(Continued)

OTHER PUBLICATIONS

International Search Report, issued in PCT/JP2020/042729, PCT/ISA/210, dated Feb. 2, 2021.
(Continued)

*Primary Examiner* — Anthony J Frost
(74) *Attorney, Agent, or Firm* — Birch, Stewart, Kolasch & Birch, LLP

(57) ABSTRACT

The present invention provides a photosensitive composition which can suppress the generation of a development residue on the surface of an electrode and the corrosion of the electrode to form a black pixel division layer, and also can suppress the generation of off-pixel in an organic EL display device comprising the pixel division layer. Disclosed is a photosensitive composition comprising (a) a pigment, (b) a resin having two or more tertiary amino groups in the molecule, and (c) a photosensitive agent, wherein the component (b) contains a resin having a structure represented by the general formula (1).

14 Claims, 4 Drawing Sheets

(51) Int. Cl.

| | | |
|---|---|---|
| *C09B 67/18* | (2006.01) | |
| *C09C 3/12* | (2006.01) | |
| *G03F 7/038* | (2006.01) | |
| *G03F 7/105* | (2006.01) | |
| *H10K 59/122* | (2023.01) | |
| *H10K 102/00* | (2023.01) | |

(52) U.S. Cl.
CPC .............. *C09C 3/12* (2013.01); *G03F 7/0384* (2013.01); *G03F 7/0387* (2013.01); *G03F 7/105* (2013.01); *H10K 59/122* (2023.02); *H10K 2102/3026* (2023.02); *H10K 2102/351* (2023.02)

(56) References Cited

U.S. PATENT DOCUMENTS

| | | | |
|---|---|---|---|
| 2017/0077210 A1 | 3/2017 | Moon et al. | |
| 2018/0010005 A1 | 1/2018 | Hibino et al. | |
| 2018/0259852 A1 | 9/2018 | Tanigaki et al. | |
| 2018/0286930 A1* | 10/2018 | Gai | G02F 1/13306 |
| 2018/0342386 A1* | 11/2018 | Onishi | G03F 7/038 |
| 2018/0356729 A1* | 12/2018 | Tanigaki | H10K 50/00 |
| 2019/0072851 A1 | 3/2019 | Tanigaki et al. | |
| 2019/0198783 A1 | 6/2019 | Kim et al. | |
| 2020/0356005 A1 | 11/2020 | Togo et al. | |
| 2021/0011381 A1 | 1/2021 | Tanigaki et al. | |

FOREIGN PATENT DOCUMENTS

| | | |
|---|---|---|
| JP | 2008-250196 A | 10/2008 |
| JP | 2008-256769 A | 10/2008 |
| JP | 2017-516271 A | 6/2017 |
| JP | 2018-155878 A | 10/2018 |
| JP | 2019-113847 A | 7/2019 |
| TW | 201730677 A | 9/2017 |
| TW | 201740188 A | 11/2017 |
| TW | 201804251 A | 2/2018 |
| WO | WO 2017/057281 A1 | 4/2017 |
| WO | WO 2019/150938 A1 | 8/2019 |

OTHER PUBLICATIONS

Written Opinion of the International Searching Authority, issued in PCT/JP2020/042729, PCT/ISA/237, dated Feb. 2, 2021.

* cited by examiner

PHOTOSENSITIVE COMPOSITION, NEGATIVE PHOTOSENSITIVE COMPOSITION, PIXEL DIVISION LAYER AND ORGANIC EL DISPLAY DEVICE

TECHNICAL FIELD

The present invention relates to a photosensitive composition, a negative photosensitive composition, a pixel division layer and an organic EL display device.

BACKGROUND ART

In recent years, there have been developed many display devices equipped with organic electroluminescence (EL) displays in technical fields such as smartphones, televisions and in-vehicle monitors, and products with various designs typified by flexible displays have been proposed. In general, in a light emitting element provided in an organic EL display device, a laminated film in which a transparent conductive film is laminated on the surface of a metal reflective layer is used as an electrode arranged on the opposite side of the light extraction direction. As the transparent conductive film, indium tin oxide (ITO), indium tin zinc oxide (ITZO) or indium zinc oxide (IZO) is used. Meanwhile, as the metal reflective layer, a silver alloy such as Ag/Cu or Ag/Pd/Cu is particularly widely used because of excellent reflectance and conductivity of visible light. For example, Patent Literature 1 discloses a bottom emission type organic EL display device capable of winding a display unit, and exemplifies the use of a silver alloy as a metal reflective layer of a light emitting element. Patent Literature 2 discloses a top emission type organic EL display including a light emitting element which includes an anode electrode made of a patterned laminated film in which a transparent conductive film (thickness 10 nm) is formed on the surface of a silver alloy (thickness 100 nm). Patent Literature 3 discloses that, when electrical short circuit occurs in a light emitting element, the light emitting output of each of a large number of arranged pixels is lowered, or off-pixel is partially generated, leading to deterioration of the quality of the display device.

By the way, a self-luminous organic EL display device has a problem that the visibility is likely to deteriorate when external light such as sunlight is incident on a display unit. In recent years, for the purpose of suppressing deterioration of the visibility, attention has been paid to a technique in which a pixel division layer to be formed for dividing between pixels of each of red/blue/green light emitting elements is blackened to impart the light-shielding property. Since the pixel division layer is required to have high insulating property and low permittivity, there has been proposed, as a coloring material for imparting the light-shielding property, a photosensitive composition containing an organic pigment exhibiting black, and various dispersants are used to refine the organic pigment and stabilize the dispersion. For example, Patent Literature 4 discloses a negative photosensitive composition containing a polyether-based dispersant having one tertiary amino group as a pigment adsorption group in the molecule, or a negative photosensitive composition containing a urethane-based dispersant having a heterocyclic ring. Patent Literature 5 also discloses a negative photosensitive composition containing an acrylic dispersant having a quaternary ammonium base and a tertiary amino group as a pigment adsorption group.

CITATION LIST

Patent Literature

[Patent Literature 1]
JP 2019-113847 A
[Patent Literature 2]
JP 2008-108533 A
[Patent Literature 3]
JP 2017-516271 W
[Patent Literature 4]
WO 2017/057281
[Patent Literature 5]
JP 2018-155878 A

SUMMARY OF INVENTION

Technical Problem

However, in case a first electrode is a laminated film containing a silver alloy film, there was a problem that, when the negative photosensitive composition disclosed in Patent Literature 4 and Patent Literature 5 is used to form the pixel division layer, a development residue is generated to form convex portions on the surface of an electrode located at openings of the pixel division layer. In addition, there was a problem that raised objects are generated due to corrosion of the electrode and convex portions are formed. Meanwhile, the photosensitive composition for forming a pixel division layer is often used for a long period of time at a constant temperature of −15° C. or lower for the purpose of inactivating components such as a photosensitive agent and a thermosetting agent which tend to be easily degraded by heat. There was also a problem that, in such a frozen environment, the dispersion stabilizing function, which should be originally developed by the dispersant should originally develop, is likely to be impaired, and convex portions on the electrode are more likely to occur. The generation of the convex portions causes electrical short circuit when the organic EL display device is driven, leading to one of the factors which cause off-pixel. Therefore, there has been earnestly desired a photosensitive composition or a negative photosensitive composition, which can suppress the generation of the development residue and the corrosion of the electrode to form a pixel division layer, and also has excellent frozen storage stability. There has also been earnestly desired an organic EL display device which suppresses the generation of off-pixel.

Means for Solving the Problems

A first aspect of the present invention is directed to a photosensitive composition comprising: (a) a pigment, (b) a resin having two or more tertiary amino groups in the molecule, and (c) a photosensitive agent, wherein the component (b) contains a resin having a structure represented by the general formula (1).

A second aspect of the present invention is directed to, a negative photosensitive composition comprising: (a-1) an organic black pigment or (a-2) a mixed organic black pigment, (b) a resin having two or more tertiary amino groups in the molecule and (c) a photosensitive agent, wherein the component (b) contains a resin having a structure represented by the general formula (1).

A third aspect of the present invention is directed to an organic EL display device comprising a pixel division layer which contains a resin having two or more tertiary amino groups in the molecule and having a structure represented by the general formula (1).

Advantageous Effects of the Invention

The photosensitive composition or the negative photosensitive composition of the present invention enable suppression of the generation of a development residue on the surface of an electrode composed of a laminated film of a transparent conductive film and a silver alloy film, and corrosion of the electrode to form a pixel division layer having the light-shielding property, and enables storage under freezing, and enables suppression of the generation of off-pixel in an organic EL display device comprising the pixel division layer.

According to the organic EL display device of the present invention, it is possible to suppress the generation of off-pixel.

DESCRIPTION OF EMBODIMENTS

Figure 1:
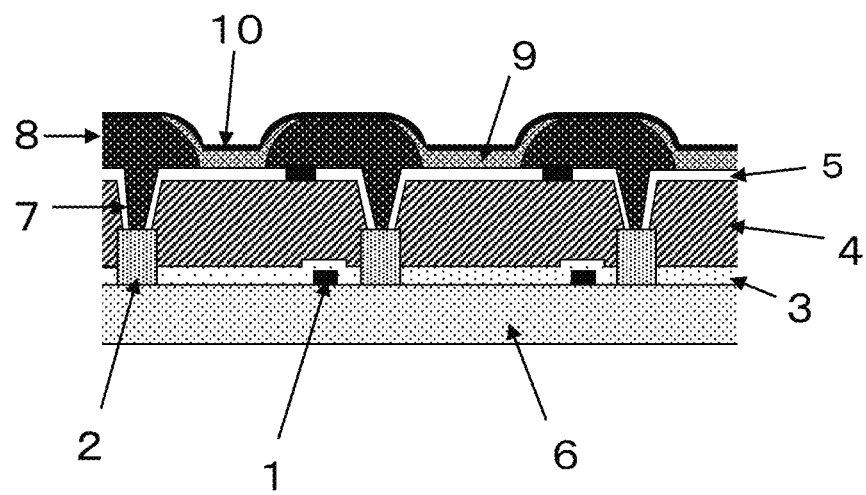
FIG. 1 is a cross-sectional view of a TFT substrate of a top emission type organic EL display device comprising a pixel division layer, which shows an example of the embodiment of the present invention.

Hereinafter, the present invention will be described in detail. The numerical range represented by using "-" means the range including the numerical values before and after "-" as the lower limit value and the upper limit value. The pixel division layer means a pixel division layer included in the organic EL display device. Visible light means light in the region having a wavelength of 380 nm or more and less than 780 nm, and near ultraviolet light means light in the region having a wavelength of 200 nm or more and less than 380 nm. Light shielding means the function of lowering the intensity of the transmitted light as compared with the intensity of the light incident in the direction perpendicular to a cured film, and the light-shielding property means the degree of shielding visible light.

The negative photosensitive composition means a negative photosensitive composition which has the photosensitivity to near ultraviolet light and is alkali-developable, and has include neither a composition having no photosensitivity to near ultraviolet light, nor an organic solvent-developable composition. As used herein, the resin means a compound having a polymer chain and having a weight-average molecular weight of 1,000 or more, and does not include a low molecular weight compound having a weight-average molecular weight of less than 1,000. The weight-average molecular weight (Mw) is the value obtained by analyzing by gel permeation chromatography using tetrahydrofuran as a carrier, and being converted using a calibration curve with standard polystyrene.

The description of a developing solution means an aqueous organic alkali solution unless otherwise specified. "C.I." used to name the coloring material is an abbreviation for Color Index Generic Name, and is based on the color index issued by The Society of Dyers and Colorists. Regarding the coloring material which has already been registered in the Color Index, Color Index Generic Name is the chemical structure and crystal form of the pigment or dye.

Regarding the color classification, for example, the yellow pigment includes pigments belonging to "C.I. Pigment Yellow", the blue pigment includes pigments belonging to "C.I. Pigment Blue", the red pigment includes pigments belonging to "C.I. Pigment Red" and the violet pigment includes pigments belonging to "C.I. Pigment Violet", and the same applies to the descriptions of the orange pigment, the brown pigment, the green pigment, the black pigment and the like. The specific structure of the coloring material, which has not been registered in the Color Index, will be illustrated.

Carbon black to be classified into C.I. Pigment Black 7 or the like is classified as an inorganic black pigment regardless of its crystallinity and insulating property. Azine-based compounds typified by aniline black or the like are classified as black dyes. Therefore, C.I. Pigment Blacks 1 and 21 corresponding thereto are not included in the organic black pigments herein. Azo-based black pigments do not include inorganic black pigments surface-modified with an organic group having an azo group.

The first aspect and the second aspect of the present invention will be described.

The photosensitive composition according to the first aspect of the present invention (hereinafter sometimes referred to as photosensitive composition) is a photosensitive composition comprising (a) a pigment, (b) a resin having two or more tertiary amino groups in the molecule, and (c) a photosensitive agent, and the component (b) contains a resin having a structure represented by the general formula (1).

The negative photosensitive composition according to the second aspect of the present invention (hereinafter sometimes referred to as negative photosensitive composition) is a negative photosensitive composition comprising (a-1) an organic black pigment or (a-2) a mixed organic black pigment, (b) a resin having two or more tertiary amino groups in the molecule, and (c) a photosensitive agent, and the component (b) contains a resin having a structure represented by the general formula (1).

[Chemical Formula 1]

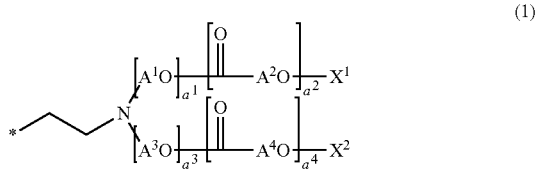

In the general formula (1), * represents a bonding site to a carbon atom or a nitrogen atom. $A^1O$, $A^2O$, $A^3O$ and $A^4O$ each independently represent an oxyalkylene group having 1 to 5 carbon atoms. $a^1$ and $a^3$ are integers and each independently represent 1 to 100. $a^2$ and $a^4$ are integers and each independently represent 0 to 100. $X^1$ and $X^2$ each independently represent a hydrogen atom or a hydrocarbon group having 1 to 5 carbon atoms.

The resin having two or more tertiary amino groups in the molecule (b) and the photosensitive agent (c) in the first aspect and the second aspect in the present invention are common components between the first aspect and the second aspect.

The photosensitive composition according to the first aspect of the present invention contains (a) a pigment. The pigment used herein refers to a pigment having a property of absorbing light having a wavelength of at least a part of visible light of particle components contained in the photosensitive composition. Based on the common general knowledge of those skilled in the art, fillers made of metals such as silver and copper do not belong to the category of the pigment (a) regardless of optical properties. By containing the pigment (a), it is possible to impart the light-shielding property to the pixel division layer obtained by curing the photosensitive composition of the present invention. Examples of the pigment (a) include known organic pigments or inorganic pigments, and those exhibiting black are preferable in view of excellent light-shielding property.

Examples of the organic pigment include (a-1) an organic black pigment and (a-2) a mixed organic black pigment mentioned later. The mixed organic black pigment (a-2) used herein refers to a pigment mixture which does not contain the organic black pigment (a-1), and is composed of (a-2-1) at least one pigment selected from the group consisting of an organic yellow pigment, an organic red pigment and an organic orange pigment, and (a-2-2) a mixture of an organic blue pigment and/or an organic violet pigment, the ratio of the component (a-2-2) being in the range of 20 to 90% by weight based on the total amount of the component (a-2-1) and the component (a-2-2). By subtractive color mixing of the component (a-2-1) and the component (a-2-2), a pseudo-blackened pixel division layer can be obtained. In the case of containing the organic black pigment (a-1), it is defined as belonging to the category of organic black pigments (a-1) even if the organic pigment belonging to the component (a-2-1) component and/or the component (a-2-2) component is/are contained.

Examples of the inorganic pigment include carbon black, titanium nitride, titanium oxynitride, zirconium nitride, zirconium oxynitride and the like. In view of high insulating property and low permittivity, it is preferable to contain at least an organic pigment to obtain desired light-shielding property. The organic pigment preferably contains the component (a-1) or the component (a-2).

The content of the pigment (a) is preferably 15 to 45% by weight in the total solid component of the photosensitive composition in order to achieve both light-shielding property and developability of the pixel division layer. The solid component means a component other than the solvent contained in the photosensitive composition.

The organic pigment and the inorganic pigment may be used as a mixture, however, in order to improve the exposure alignment using near infrared light, that is, the alignment accuracy between an exposure mask and a substrate mentioned later, it is desired that the organic pigment is contained in the pigment (a) in the amount of 50% by weight or more to obtain desired light-shielding property.

The photosensitive composition of the present invention has either negative or positive photosensitivity. The photosensitive composition may have negative photosensitivity, wherein the exposed area of the film is photo-cured by pattern exposure via an exposure mask to have lower alkali solubility, and the unexposed area of the film is removed using an alkali developing solution to form a pattern. Alternatively, the photosensitive composition may have the positive photosensitivity, wherein the alkali solubility of the exposed area of the film is made relatively higher by pattern exposure via an exposure mask than that of the unexposed area of the film, and the exposed area of the film is removed using an alkali developing solution to form a pattern. The composition preferably has the negative photosensitivity in that the negative photosensitivity makes it possible to decrease the necessary minimum exposure amount for obtaining pixel division layer having desired light-shielding property, thus enhancing the productivity.

The negative photosensitive composition according to the second aspect of the present invention contains (a-1) an organic black pigment or (a-2) a mixed organic black pigment. The organic black pigment (a-1) and the mixed organic black pigment (a-2) are the same as those described in the first aspect mentioned above.

Examples of the organic black pigment (a-1) include benzodifuranone-based black pigments, perylene-based black pigments, azo-based black pigments and anthraquinone-based black pigments. Of these, benzodifuranone-based black pigments and perylene-based black pigments are preferable in view of excellent heat resistance and dispersibility, and benzodifuranone-based black pigments are more preferable in view of excellent light-shielding property.

The benzodifuranone-based black pigment refers to an organic black pigment having a polycyclic structure in which two furanone rings are fused with one benzene ring in the molecule, and includes, for example, bis-oxodihydroindolylene-benzodifuranone mentioned in WO 2009/010521. Of these, in view of the heat resistance, the benzodifuranone-based black pigment represented by the general formula (2) or the general formula (3) is preferably exemplified. Isomers include geometric isomers and tautomers. The isomers may be contained as a mixture, or a plurality of compounds having an isomer relationship may be mixed to form one crystallite or primary particles.

[Chemical Formula 2]

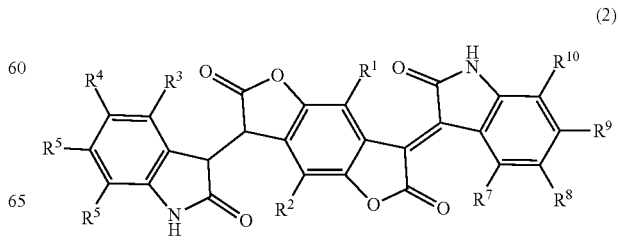

(3)

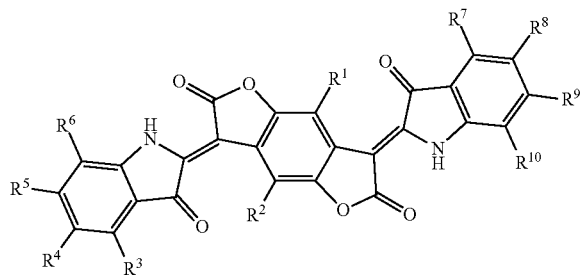

In the general formula (2) and the general formula (3), $R^1$ and $R^2$ each independently represent a hydrogen atom or a methyl group. $R^3$, $R^4$, $R^5$, $R^6$, $R^7$, $R^8$, $R^9$, $R^{10}$ each independently represent a hydrogen atom or an alkyl group having 1 to 12 carbon atoms.

Above all, in view of excellent heat resistance, it is preferable to contain a benzodifuranone-based black pigment having a lactam ring structure in which $R^1$ to $R^{10}$ are hydrogen atoms. That is, the benzodifuranone-based black pigment represented by the structural formula (4) is more preferable. Since the pigment itself has excellent heat resistance, it can be preferably used for a pixel division layer which requires high heat resistance of 230° C. or higher from the viewpoint of suppressing the generation of off-pixel. The benzodifuranone-based black pigment represented by the general formula (2) or the general formula (3) can be synthesized by reacting isatin or a derivative thereof with 2,5-dihydrobenzene-1,4-diacetic acid. In order to suppress corrosion of the silver alloy film, it is desirable to purify the pigment so that the residual amount of isatin or a derivative thereof is 100 ppm or less in the pigment. As the benzodifuranone-based black pigment represented by the structural formula (4), commercially available products may be used, and examples thereof include "Irgaphor" (registered trademark) Black S0100 (manufactured by BASF Corporation).

[Chemical Formula 3]

(4)

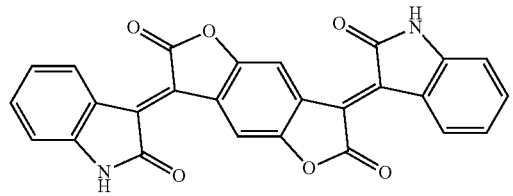

The perylene-based black pigment refers to an organic black pigment having a perylene skeleton in the molecule, and examples thereof include a perylene-based black pigment represented by the structural formula (5) or (6) and C.I. Pigment Black 31 and 32.

[Chemical Formula 4]

(5)

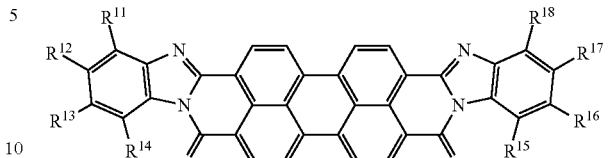

(6)

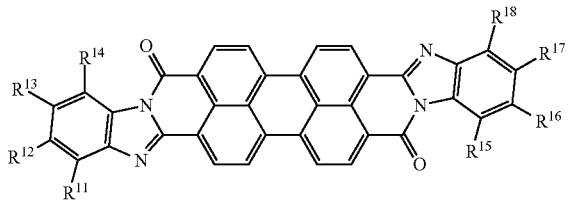

$R^{11}$ to $R^{18}$ each independently represent a hydrogen atom, an alkyl group having 1 to 12 carbon atoms, an alkoxy group having 1 to 6 carbon atoms, or a hydroxyl group.

Of these, more preferred is a perylene-based composed of an isomer mixture of a compound represented by the structural formula (7) as the cis form, and a compound represented by the structural formula (8) as the trans form, in view of excellent light-shielding property and heat resistance. It is more preferable to contain 30% by weight or more of the trans form based on the total of the cis form and the trans form, in view of high ultraviolet transmittance and excellent photocurability.

[Chemical Formula 5]

(7)

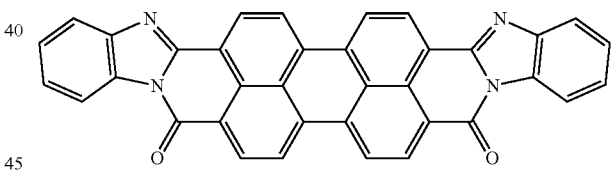

(8)

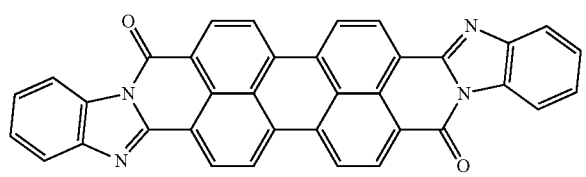

The isomer mixture of the compound represented by the structural formula (5) as the cis form and the compound represented by the structural formula (6) as the trans form can be synthesized by reacting o-phenylenediamine or a derivative thereof with perylene-3,4,9,10-tetracarboxylic dianhydride. In order to suppress the corrosion of the silver alloy film, it is desirable to purify o-phenylenediamine or a derivative thereof so that the residual amount is 100 ppm or less in the pigment.

The azo-based black pigment refers to an organic black pigment having an azo bond in the molecule, and examples thereof are preferably azo-based black pigments mentioned in JP 2010-116549 A and JP 2017-193689 A. These azo-based black pigments can be synthesized by an azo coupling reaction. In order to suppress the corrosion of the silver alloy film, it is desirable to purify the pigment so that the residual amount of free chlorine produced as a by-product is 100 ppm or less in the pigment.

The anthraquinone-based black pigment refers to a black pigment having an anthraquinone skeleton in the molecule, and examples thereof include anthraquinone-based black pigments having two lactam rings in the molecule mentioned in JP 2018-145353 A. These anthraquinone-based black pigments can be synthesized by reacting isatin or a derivative thereof with 1,5-diaminoanthraquinone. In order to suppress the corrosion of the silver alloy film, it is desirable to purify isatin or a derivative thereof and 1,5-diaminoanthraquinone so that the residual amount of each is 100 ppm or less in the pigment.

Next, specific examples of the organic pigment constituting the mixed organic black pigment (a-2) will be described.

Examples of the organic yellow pigment belonging to (a-2-1) include C.I. Pigment Yellow 120, 138, 139, 151, 175, 180, 185, 181, 192 and 194, and these pigments may be used alone or in combination.

Examples of the organic orange pigment belonging to (a-2-1) include C.I. Pigment Orange 13, 36, 43, 61, 64, 71 and 72, and these pigments may be used alone or in combination. Perinone-based orange pigments are preferable in view of excellent developability on the silver alloy film and heat resistance, and of these, C.I. Pigment Orange 43 represented by the structural formula (9) is preferable. C.I. Pigment Orange 43 can be synthesized by reacting naphthalenetetracarboxylic anhydride with o-phenylenediamine to remove by-produced trans isomers. In order to suppress the corrosion of the silver alloy film, it is desirable to purify o-phenylenediamine so that the residual amount is 100 ppm or less in the pigment.

[Chemical Formula 6]

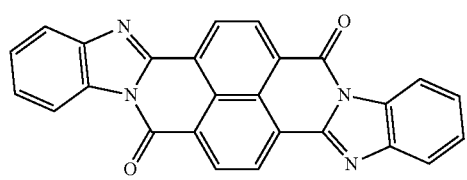

(9)

Examples of the organic red pigment belonging to (a-2-1) are preferably C.I. Pigment Red 122, 123, 149, 179, 180, 189, 190, 202, 209, 254, 255 and 264, and these pigments may be used alone or in combination of a plurality thereof. Perylene-based red pigments are preferable in view of excellent developability on the silver alloy film and heat resistance, and of these, C.I. Pigment Red 179 is preferable. C.I. Pigment Red 179 can be synthesized by reacting perylene-3,4,9,10-tetracarboxylic dianhydride with methylamine. In order to suppress the corrosion of the silver alloy film, it is desirable to purify o-phenylenediamine so that the residual amount is 100 ppm or less in the pigment.

[Chemical Formula 7]

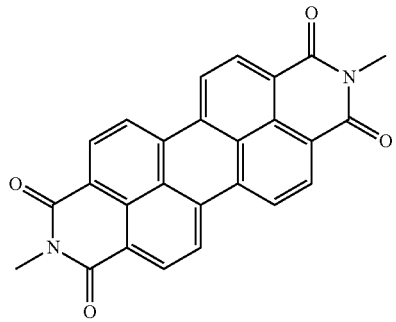

(10)

Examples of the organic blue pigment belonging to (a-2-2) are preferably C.I. Pigment Blue 15, 15:1, 15:2, 15:3, 15:6, 16, 25, 26, 56, 57, 60, 61, 64, 65, 66, 75, 79 and 80. These pigments can be used alone or in combination of a plurality thereof. In view of excellent developability on the silver alloy film and heat resistance, preferred are C.I. Pigment Blue 60 represented by structural formula (11) as the indanthrene-based blue pigment and C.I. Pigment Blue 65 represented by structural formula (12) as the violanthrone-based blue pigment.

C.I. Pigment Blue 60 can be synthesized by alkali-melting 2-aminoanthraquinone and subjecting to a condensation reaction. In order to suppress the corrosion of the silver alloy film, it is desirable to purify the pigment so that the residual amount of 2-aminoanthraquinone is 100 ppm or less in the pigment. Meanwhile, C.I. Pigment Blue 65 can be synthesized by a dimerization coupling reaction of benzanthron. Further, in order to enhance the exposure sensitivity, it is preferable to use C.I. Pigment Blue 25 and 26 after mixing with C.I. Pigment Blue 60 and 65 having excellent near ultraviolet transmittance.

[Chemical Formula 8]

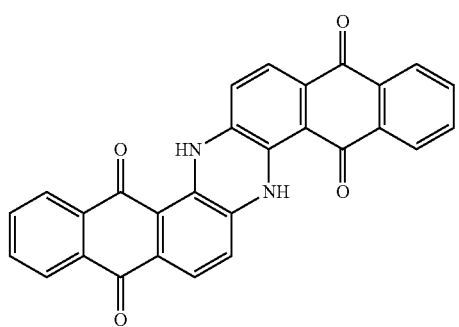

(11)

-continued

[Chemical Formula 9]

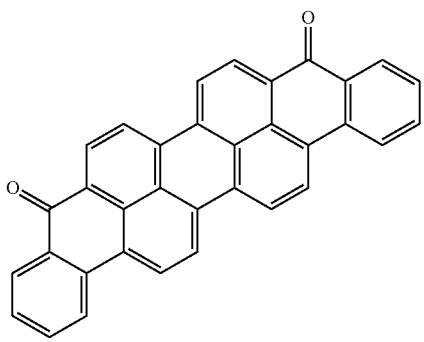

(12)

Examples of the organic violet pigment belonging to (a-2-2) include C.I. Pigment Violet 19, 23, 29, 32 and 37, and these pigments may be used alone or in combination of a plurality thereof. In view of excellent developability on the silver alloy film and heat resistance, C.I. Pigment Violet 29 as the perylene-based violet pigment or C.I. Pigment Violet 37 as the dioxazine-based violet pigment is preferable.

After obtaining a concentrate of a photosensitive composition or a negative photosensitive composition by centrifugation or a treatment under reduced pressure, the chemical structure of the above components (a-1) and (a-2) can be identified by combining time-of-flight type secondary ion mass spectrometry (TOF-SIMS), time-of-flight mass spectrometry (TOF-MS), direct sample introduction method-ion trap type mass spectrometry, NMR analysis, LC-MS, ICP mass spectrometry, infrared absorption spectrum and powder X-ray diffraction by CuKα ray. A solution dissolved in an amide-based organic solvent such as dimethylformamide or N-methylpyrrolidone may be used as an analysis sample to enhance the identification accuracy.

In order to reduce the adsorptivity to the surface of the transparent conductive film and the silver alloy film to obtain more excellent developability, it is preferable that the component (a-1) and component (a-2) contained in the photosensitive composition or the negative photosensitive composition of the present invention has a coating layer on the surface thereof, and the coating layer contains at least one coating material selected from the group consisting of silica, metal oxide and metal hydroxide. It is more preferable that the benzodifuranone-based black pigment represented by the general formula (2) or the general formula (3) has a coating layer on the surface thereof, and the coating layer contains at least one coating material selected from the group consisting of silica, metal oxide and metal hydroxide. Above all, it is still more preferable that the coating layer contains silica since it is inert to the silver alloy and has high insulating property, and also has an isoelectric point on the negative side. Silica obtained by reacting an organic acid or an inorganic acid with an alkali metal silicate is more preferable since it has high alkali resistance to a developing solution and has high Mohs hardness, and also can obtain a dense silica layer. Specific example of the method include a method in which an aqueous dilute solution of sulfuric acid and an aqueous dilute solution of an alkali metal silicate are added in parallel to an aqueous medium maintained at pH 2 to 7 to precipitate a silica hydrate on the surface of the pigment, which is then subjected to dehydration sintering by heating to form a silica layer. The heating temperature is preferably 200° C. or higher in order to suppress the generation of moisture from the pixel division layer and prevent deterioration of the light emitting element, and more preferably 230° C. or higher in order to obtain high hardness for suppressing chipping of the coating layer in a wet media dispersion treatment mentioned later and high adhesion to the pigment surface for suppressing peeling. The temperature is preferably 300° C. or lower in order to suppress crystal transition and thermal decomposition of the organic pigment, and more preferably 280° C. or lower in order to suppress the generation of sublimated foreign substances. From the same viewpoint, the heating time is preferably 1 to 6 hours.

The organic pigment constituting a nucleus preferably has high hydrophilicity, high acid resistance and high heat resistance, and most preferred is a benzodifuranone-based black pigment represented by the general formula (2) or the general formula (3) among the components (a-1) and (a-2). In order to further enhance the alkali resistance of the coating layer containing silica to a developing solution, a part of zirconium atoms may be further contained in a part of the matrix structure composed of silicon atoms and oxygen atoms to introduce a composite structure of —Si—O—Zr—O—Si—. A zirconium atom can be introduced into a part of the coating layer by adhering a zirconium source to the coating layer containing silica, followed by firing. It is possible to use, as the zirconium source, tetraalkoxyzirconium such as zirconium tetra-n-propoxide, zirconium tetra-iso-propoxide, zirconium tetraethoxide or zirconium tetra-n-butoxide.

As the component (a-1) or the component (a-2) contained in the photosensitive composition or the negative photosensitive composition of the present invention, most preferred is an organic black pigment composed of a coating layer containing silica and a nucleus containing a benzodifuranone-based black pigment represented by the general formula (2) or the general formula (3) or an isomer thereof, in view of high light-shielding property and excellent developability on the silver alloy film. By having the coating layer containing silica, it is possible to enhance the adsorptivity of the resin having a structure represented by the general formula (1) mentioned later to the pigment surface, and to reduce reaggregation of the pigment due to contact with the developing solution in the development step, and the generation of the development residue due to reattachment.

The content of the component (a-1) is preferably 15 to 40% by weight in the total solid component of the photosensitive composition or the negative photosensitive composition in order to achieve both the light-shielding property and the developability of the pixel division layer. From the same viewpoint, the content of the component (a-2) is preferably 25 to 45% by weight in the total solid component. The total solid content means components other than the solvent contained in the photosensitive composition or the negative photosensitive composition.

In order to enhance the dispersion stabilizing effect and the development residue suppressing effect of the resin having a structure represented by the general formula (1), the specific surface area of each of the organic pigments constituting the component (a-1) and the component (a-2) is preferably 10 m²/g or more in order to avoid the mixture of coarse particles and suppress the generation of off-pixel. When finely divided to desired average dispersion particle size, the specific surface area is preferably 80 m²/g or less in order to suppress an increase in viscosity of the pigment dispersion liquid. The specific surface area can be measured by the BET method based on the amount of nitrogen gas adsorbed.

In addition, as the component contributing to optical properties of the pixel division layer, a dye may be contained as long as it does not adversely affect the effect of the present invention, thus finely adjusting the spectral reflectance of the pixel division layer and the light scattering property inside the film.

The photosensitive composition or the negative photosensitive composition of the present invention contains (b) a resin having two or more tertiary amino groups in the molecule, and contains a resin having a structure represented by the general formula (1) as the component (b). There is no particular limitation on the bonding site in the molecule, and the tertiary amino group includes not only a tertiary amino group as the terminal group or the side chain, but also a tertiary amino group as the main chain derived from polyamine and the linking group.

The resin having a structure represented by the general formula (1) has, as the first effect, the high dispersion stabilizing effect on the pigment (a), particularly the component (a-1) and the component (a-2). Therefore, it is possible to sufficiently promote miniaturization during the production of the pigment dispersion liquid mentioned later, and it is excellent in the effect of stabilizing the dispersed state even when stored under freezing for a long period of time, thus making it possible to suppress the generation of undesired convex portions on the electrode due to the development residue containing pigment aggregates. The pigment agglomerates include not only pigment agglomerates which can be formed in the photosensitive composition or the negative photosensitive composition, but also pigment agglomerates which can be formed by contact with a developing solution during the development step. As the second effect, it is possible to suppress the generation of the development residue due to an insoluble component of the dispersant itself without crystallization or concentration gradient even under freezing. Thirdly, the resin does not promote corrosion even when it comes into contact with the surface of the silver alloy film, but rather has the function of preventing corrosion and has the effect of suppressing the generation of raised objects.

[Chemical Formula 10]

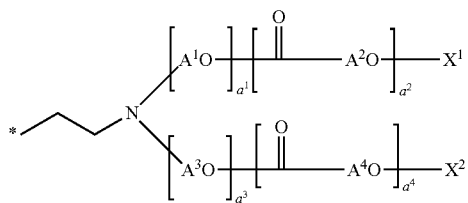

(1)

In the general formula (1), * represents a bonding site to a carbon atom or a nitrogen atom. $A^1O$, $A^2O$, $A^3O$ and $A^4O$ each independently represent an oxyalkylene group having 1 to 5 carbon atoms. $a^1$ and $a^3$ are integers and each independently represent 1 to 100. $a^2$ and $a^4$ are integers and each independently represent 0 to 100. $X^1$ and $X^2$ each independently represent a hydrogen atom or a hydrocarbon group having 1 to 5 carbon atoms.

In the general formula (1), when the number of repeating units $a^1$ is 2 or more, the partial structure represented by $[A^1O]a^1$ may be composed of repeating units having a plurality of alkylene groups each having different number of carbon atoms. The same applies to the partial structures represented by $[CO-A^2O]a^2$, $[A^3O]a^3$, and $[CO-A^4O]a^4$.

Examples of $A^1O$, $A^2O$, $A^3O$ and $A^4O$ include an oxymethylene group, an oxyethylene group (hereinafter sometimes referred to as "$C_2H_4O$"), an oxypropylene group (hereinafter sometimes referred to as "$C_3H_6O$") and an oxybutylene group (hereinafter sometimes referred to as "$C_4H_8O$") and an oxypentylene group. As $A^1O$ and $A^3O$, an oxyethylene group and an oxypropylene group are preferable in view of excellent dispersibility of the organic pigment and high developability on the silver alloy film. In order to achieve both the dispersibility and the developability, it is more preferable to contain both an oxyethylene group and an oxypropylene group. As $A^2O$ and $A^4O$, an oxypropylene group, an oxybutylene group and an oxypentylene group are preferable in view of excellent dispersion stabilizing effect and ease of synthesis. Examples of $X^1$ and $X^2$ include a hydrogen atom, a methyl group, an ethyl group, a propyl group, a butyl group and a pentyl group. Of these, a hydrogen atom and a methyl group are preferable, and a hydrogen atom is more preferable in view of excellent developability.

$a^1$ and $a^3$ are integers representing the number of repeating units are integers, and each is preferably 5 to 60 are preferable, and more preferably 10 to 40, in order to achieve both the dispersion stabilizing effect and the developability. From the same viewpoint as in $a^1$ and $a^3$, $a^2$ and $a^4$ are preferably 0 to 20, and more preferably 0 to 10.

The partial structure represented by $[A^1O]a^1$ and $[A^3O]a^3$, that is, the (poly)oxyalkylene group can be obtained, for example, by adding a cyclic ether such as ethylene oxide or propylene oxide, an alkylene glycol such as ethylene glycol or propylene glycol, a homopolymer of a polyalkylene glycol such as polyethylene glycol or polypropylene glycol, and a block type polyalkylene glycol of polyethylene glycol and polypropylene glycol, and converting the hydrogen atom of a primary amino group (or a primary amine and a secondary amino group) possessed by an aliphatic amine having a primary amino group mentioned later. As the block type polyalkylene glycol, commercially available products having various number of carbon numbers/repeating units are industrially available, and examples thereof include "Synperonic" (registered trademark) F108, L35, L64 and 121, and "Poloxamer" (registered trademark) 237 (all of which are manufactured by SIGMA-ALDRICH); and "Pluronic" (registered trademark) P65, P84, P102, 105, F38, F77 and F87 (all of which are manufactured by BASF Corporation). Meanwhile, the partial structure represented by $[CO-A^2O]a^2$ and $[CO-A^4O]a^4$, that is, the (poly)oxyalkylene carbonyl structure can be obtained, for example, by adding a cyclic ester compound (or a polycondensate thereof) such as α-lactone, β-propiolactone, γ-butyrolactone, δ-valerolactone or ε-caprolactone to the terminal hydroxyl group of the (poly)oxyalkylene group.

As the sequence of the repeating unit, at least one of $[A^1O]a^1$ and $[A^3O] a^3$ preferably has a block-type polyoxyalkylene group composed of a polyoxyethylene structure and a polyoxypropylene structure in that higher dispersion stabilizing effect can be obtained. The block type refers to the sequence in which two or more oxyalkylene groups having a specific number of carbon atoms are bonded in a series by five or more repeating units in a polyoxyalkylene chain composed of repeating unit having a plurality of alkylene groups each having a different number of carbon atoms.

$X^1$ and $X^2$ are each preferably a hydrogen atom or a methyl group, and it is desirable that at least one of them is a hydrogen atom in order to enhance the hydrophilicity to improve the developability.

Specific examples of the structure having a block-type polyoxyalkylene group composed of a polyoxyethylene structure and a polyoxypropylene group and having a hydrogen atom at the end of the polyoxyalkylene chain include a structure represented by the general formula (13), a structure represented by the general formula (14) and a structure represented by the general formula (15), and of these, the structure represented by the general formula (13) is more preferable in view of excellent developability on the silver alloy film. The total of $a^5$ and $a^6$ corresponds to the number of repeating units $a^1$ in the general formula (1), and the total of $a^7$ and $a^8$ corresponds to the number of repeating units $a^3$ in the general formula (1). The same applies to $a^9$ to $a^{18}$. Two or more tertiary amino groups may be partially quaternized, but it is desirable that the tertiary amino groups are not quaternized at all from the viewpoint of improving the developability on the silver alloy film. In other words, it is preferable that the resin having a structure represented by the general formula (1) does not have a group having a quaternary ammonium cation or a quaternary ammonium base in the molecule.

[Chemical Formula 11]

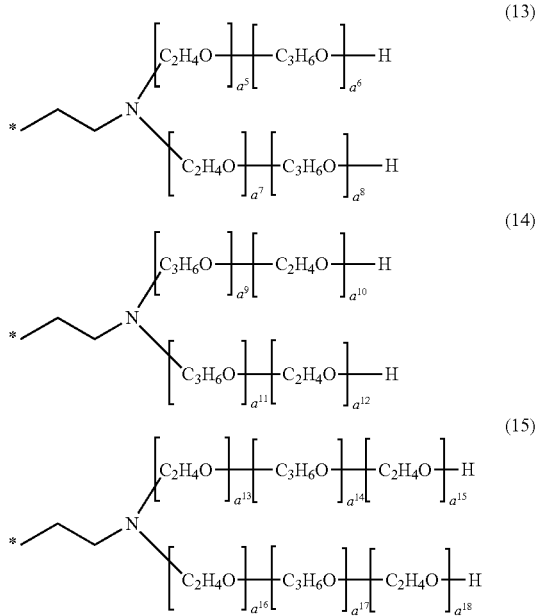

In the general formula (13), $a^5$, $a^6$, $a^7$ and $a^8$ are integers, the total of $a^5$ and $a^6$ is 1 to 100, and the total of $a^7$ and $a^8$ is 1 to 100.

In the general formula (14), $a^9$, $a^{10}$, $a^{11}$ and $a^{12}$ are integers, the total of $a^9$ and $a^{10}$ is 1 to 100, and the total of $a^{11}$ and $a^{12}$ is 1 to 100.

In the general formula (15), $a^{13}$, $a^{14}$, $a^{15}$, $a^{16}$, $a^{17}$ and $a^{18}$ are integers, the total of $a^{13}$, $a^{14}$ and $a^{15}$ is 1 to 100, and the total of $a^{16}$, $a^{17}$ and $a^{18}$ is 1 to 100.

It is preferable that the resin having a structure represented by the general formula (1) contains a resin in which the value obtained by dividing the total number of mols of repeating units containing an oxyalkylene group having 1 and 2 carbon atoms by the total number of mols of repeating units containing an oxyalkylene group having 3 to 5 carbon atoms is 0.76 to 4.00. In other words, when the total number of repeating units containing an oxyalkylene groups having 1 to 5 carbon atoms is 100 mol %, the total number of repeating units containing an oxyalkylene group having 1 to 2 carbon atoms preferably accounts for 43.20 to 80.00 mol %. When it is 0.76 or more, it is possible to obtain the prominent effect that the development time required to dissolve and remove the film of the unexposed area in the vicinity of the surface of the silver alloy film is shortened as compared with the development time required to dissolve and remove the film of the unexposed area in the vicinity of the surface of the transparent conductive film in the development step mentioned later. Therefore, when the development is usually performed with the development time to be optimized and appropriately set based on the necessary minimum development time on the transparent conductive film, the development residue on the silver alloy film can be further reduced as a result. The value is more preferably 1.00 or more. Meanwhile, when the value is 4.00 or less, the hydrophobicity is appropriately imparted, thus making it possible to suppress the generation of the development residue due to peeling of the film in the exposed area during the development step. The value is more preferably 3.00 or less.

The weight-average molecular weight is preferably 2,000 or more in order to improve the dispersion stability, and preferably 10,000 or less in order to improve the developability. The amine value is preferably 5 (mgKOH/g) or more in order to enhance the dispersion stability, and preferably 100 (mgKOH/g) or less in order to enhance the developability. The amine value can be measured by the potentiometric titration method based on "JIS K2501 (2003)". The content of the resin having a structure represented by the general formula (1) is preferably 5 to 60% by weight relative to the pigment (a). When the component (a-1) or the component (a-2) is contained, the content is preferably 5% by weight or more, and more preferably 15% by weight or more, relative to the total of the components (a-1) and the component (a-2) in order to enhance the dispersion stability. In order to enhance the photocurability in the exposure step and to enhance a residual film ratio after development mentioned later, the content is preferably 60% by weight or less, and more preferably 40% by weight or less.

Preferred specific examples of the resin having a structure represented by the general formula (1) include a resin having a structure represented by the general formula (16) and a resin having a structure represented by the general formula (17). From the viewpoint of the developability on the silver alloy film, the resin having a structure represented by the general formula (16) is more preferable.

[Chemical Formula 12]

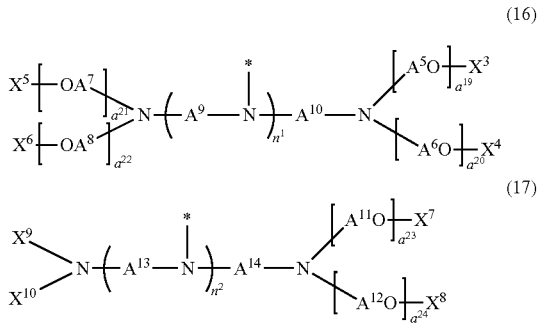

In the general formula (16), * represents a bonding site to a carbon atom. $A^5O$, $A^6O$, $OA^7$ and $OA^8$ each independently represent an oxyalkylene group having 1 to 5 carbon atoms. $A^9$ and $A^{10}$ each independently represent an alkylene group having 2 to 6 carbon atoms.

$n^1$ is an integer and represents 0 to 7. $X^3$ to $X^6$ each independently represent a hydrogen atom or a hydrocarbon group having 1 to 5 carbon atoms. $a^{19}$ to $a^{22}$ are integers and each independently represent 1 to 100.

In the general formula (17), * represents a bonding site to a carbon atom. $A^{11}O$, $A^{12}O$ each independently represent an oxyalkylene group having 1 to 5 carbon atoms. $A^{13}$ and $A^{14}$ each independently represent an alkylene group having 2 to 6 carbon atoms.

$n^2$ is an integer and represents 0 to 7. $X^7$ and $X^8$ each independently represent a hydrogen atom or a hydrocarbon group having 1 to 5 carbon atoms. $X^9$ and $X^{10}$ are the same as each other, and represent an alkyl group having 1 to 4 carbon atoms. $a^{23}$ to $a^{24}$ are integers and each independently represent 1 to 100.

The total number of tertiary amino groups contained in the resin having a structure represented by the general formula (16) in the molecule of is 2 to 9, but $n^1$ is preferably 1 or more in that excellent effect of suppressing the development residue on the silver alloy film derived from pigment aggregates is exerted by enhancing the adsorptivity to the pigment surface. $n^1$ is preferably 5 or less in that excellent effect of suppressing the development residue on the silver alloy film derived from the dispersant is exerted by suppressing bridge adsorption between the surface of the pigment and the surface of the silver alloy film. In other words, the total number of tertiary amino groups contained in the molecule is preferably in the range of 3 to 7. In view of excellent dispersion stabilizing effect, $A^9$ and $A^{10}$ are preferably an alkylene group having 2 to 4 carbon atoms, respectively, and of these, a linear alkylene group is preferable. In other words, specifically, an ethylene group, a propylene group or a butylene group is preferable. * is preferably a bonding site to an alkylene group having 1 to 5 carbon atoms or an alkyl group having 1 to 5 carbon atoms, and more preferably an alkylene group having 1 to 5 carbon atoms. The above viewpoint is similarly applied to the resin having a structure represented by the general formula (17).

Examples of the method for synthesizing these resins include a method in which a polyoxyalkylene chain is subjected to addition polymerization by the above method using an aliphatic amine having a primary amino group as the base raw material. Examples of the aliphatic amine having a primary amino group include ethylenediamine (number of nitrogen atoms: 2), diethylenetriamine (number of nitrogen atoms: 3), triethylenetetramine (number of nitrogen atoms: 4), tetraethylenepentamine (number of nitrogen atoms: 5), pentaethylenehexamine (number of nitrogen atoms: 6), heptaethyleneoctamine (number of nitrogen atoms: 8), dipropylenetriamine (number of nitrogen atoms: 3), propylenediamine (number of nitrogen atoms: 2), hexamethylenediamine (number of nitrogen atoms: 2), N,N-bis(3-aminopropyl)methylamine (number of nitrogen atoms: 3), 3-diethylaminopropylamine (number of nitrogen atoms: 2), 3-dimethylaminopropylamine (number of nitrogen atoms: 2), 3-diethylaminoethylamine (number of nitrogen atoms: 2), 3-diethylaminoethylamine (number of nitrogen atoms: 2) and spermine (number of nitrogen atom: 4). In order to enhance the dispersion stability and developability on the silver alloy film, all the primary amino groups (or primary amino groups and secondary amino groups) derived from the raw materials should be converted into tertiary amino groups. In order to make each polyoxyalkylene chain length in the molecule uniform, it is preferable to synthesize in the presence of a catalyst.

It is possible to use, as the catalyst, an inorganic alkali catalyst such as sodium hydroxide or potassium hydroxide. In order to avoid adverse effects on emission characteristics of the organic EL display device, it is preferable to remove the inorganic alkali catalyst with a catalyst scavenger after completion of the reaction before using as the dispersant. The catalyst scavenger is preferably a solid acid adsorbent, and examples thereof include synthetic aluminum silicate. The residual aliphatic amine having a primary amino group can be determined by the release of nitrogen gas generated by diazotization and decomposition by allowing sodium nitrite to act under acidic conditions. Using the infrared absorption spectrum, the existence or non-existence of a residual secondary amino group can be confirmed by the absorption peak at a wavelength of 1,550 $cm^{-1}$, while the existence or non-existence of a primary amino group can be confirmed by the absorption peak at 1,600 $cm^{-1}$. The structure of the resin having a structure represented by the general formula (1) can be analyzed, after the photosensitive composition or the negative photosensitive composition is concentrated by a method such as centrifugation and column-separated, using known methods such as NMR, IR and mass spectrum.

The tertiary polyamine main chain of the resin having a structure represented by the general formula (16) may be either linear or branched, but is preferably linear in view of excellent dispersion stabilizing effect. When the tertiary polyamine main chain is linear, the structure represented by the general formula (1) is arranged only at both ends of the tertiary polyamine main chain. In other words, the negative photosensitive composition of the present invention preferably has, as the component (b), a resin having a structure represented by the general formula (16) and having two structures represented by the general formula (1) in the molecule. As specific examples, linear tertiary polyamine resins represented by the general formula (18) and the general formula (19) and a branched tertiary polyamine resin represented by the general formula (20) are exemplified below. Examples of the resin having a structure represented by the general formula (17) include a resin represented by the general formula (21).

[Chemical Formula 13]

(18)

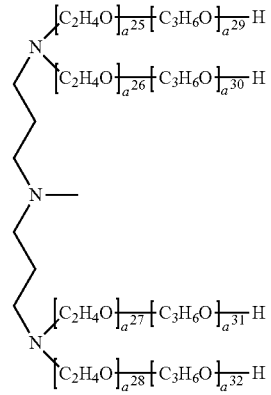

[Chemical Formula 14]

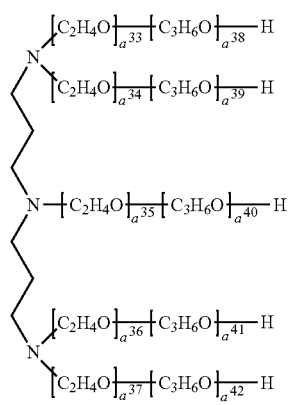
(19)

[Chemical Formula 15]

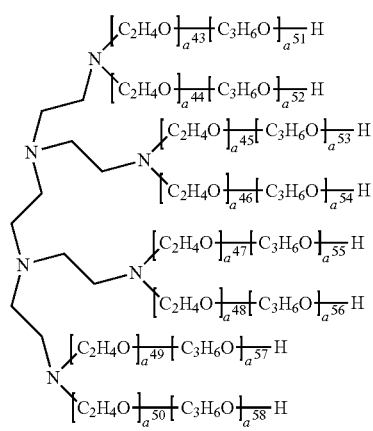
(20)

In the general formula (18), the general formula (19) and the general formula (20), $a^{25}$ to $a^{58}$ are integers and each independently represent 1 to 20.

[Chemical Formula 16]

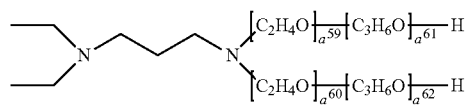
(21)

In the general formula (21), $a^{59}$ to $a^{62}$ are integers and each independently represent 1 to 20.

When the photosensitive composition of the present invention has negative photosensitivity, it is preferable that the negative photosensitive composition of the present invention further contains a resin represented by the general formula (22) as the component (b). The resin represented by the general formula (22) exerts, in addition to the effect of stabilizing the dispersed state of the above component (a-1) or component (a-2) to suppress the development residue derived from the unexposed area, the effect of promoting photocuring in the exposure step mentioned later to suppress the generation of the development residue due to insufficient curing of the bottom of the pattern edge of the exposed area.

[Chemical Formula 17]

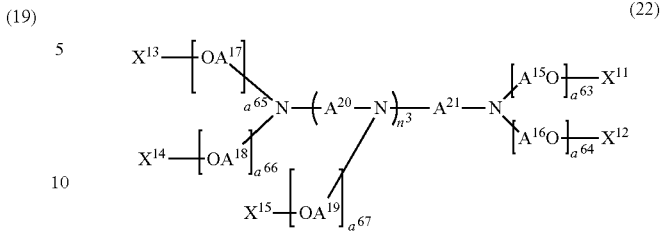
(22)

In the general formula (22), $A^{15}O$, $A^{16}O$, $OA^{17}$, $OA^{18}$ and $OA^{19}$ each independently represent an oxyalkylene group having 1 to 5 carbon atoms.

$A^{20}$ and $A^{21}$ each independently represent an alkylene group having 2 to 6 carbon atoms. $n^3$ is an integer and represents 0 to 9. $X^{11}$ to $X^{15}$ each independently represent a hydrogen atom, a hydrocarbon group having 1 to 5 carbon atoms, an organic group represented by the general formula (23) or an organic group represented by the general formula (24). However, at least one of $X^{11}$ and $X^{12}$ and at least one of $X^{13}$ and $X^{14}$ are an organic group represented by the general formula (23) or an organic group represented by the general formula (24). $a^{63}$ to $a^{67}$ are integers and each independently represent 1 to 100.

[Chemical Formula 18]

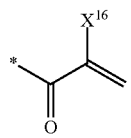
(23)

(24)

In the general formula (23), * represents a bonding site to an oxygen atom. $X^{16}$ represents a hydrogen atom or a methyl group.

In the general formula (24), * represents a bonding site to an oxygen atom. $X^{17}$ represents a hydrogen atom or a methyl group. $A^{22}O$ represents an oxyalkylene group having 1 to 5 carbon atoms. $a^{68}$ is an integer and represents 1 to 5.

The resin represented by the general formula (22) can be synthesized by deriving a resin having a structure represented by the general formula (16). Specific example of derivatization include a method in which a radically polymerizable acyl halide compound such as acryloyl chloride and/or methacryloyl chloride is reacted in a solution, and after converting the terminal hydrogen atom of the polyoxyalkylene chain into an organic group represented by the general formula (23), chlorine ions are removed. Example of derivatization also includes a method in which a radically polymerizable isocyanate compound such as 2-isocyanatoethyl methacrylate, 2-isocyanatoethyl acrylate and/or 2-(2-methacryloyloxyethyloxy)ethyl isocyanate is reacted in a solution and then the terminal hydrogen atom is converted into an organic radical represented by the general formula (24). The number of organic groups represented by the general formula (23) and/or organic groups represented by the general formula (24) introduced can be controlled by adjusting the ratio of the hydrogen atom located at the end of the polyoxyalkylene chain of the resin having a structure represented by the general formula (16) to the hydrocarbon group having 1 to 5 carbon atoms.

As for the preferable range of $A^{15}O$, $A^{16}O$, $OA^{17}$, $OA^{18}$, $OA^{19}$, $A^{20}$, $A^{21}$ and $n^3$, the same viewpoint as the preferable range in the resin having a structure represented by the above general formula (16) is applied. Specific examples of the resin represented by the general formula (22) include a resin represented by the structural formula (25) and a resin represented by the structural formula (26).

[Chemical Formula 19]

(25)

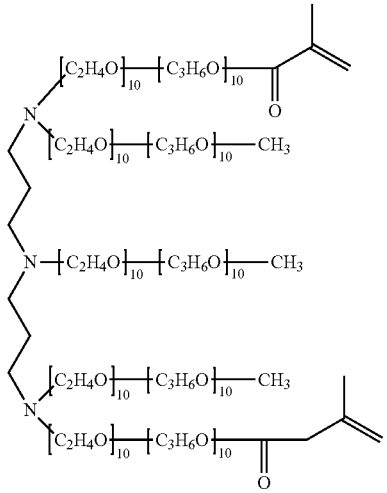

[Chemical Formula 20]

(26)

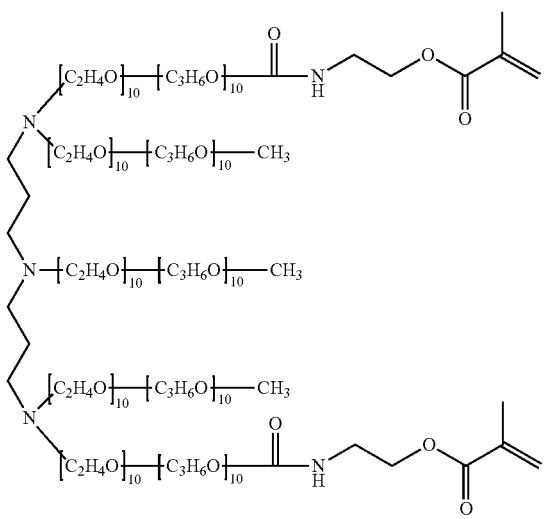

In the photosensitive composition or the negative photosensitive composition of the present invention, a resin having no structure represented by the general formula (1) may be used in combination as the component (b). Examples of the resin belonging to the component (b) and having no structure represented by the general formula (1) are preferably a polyamide polyester resin, a block polymerization type acrylic resin including a block A having a tertiary amino group and a block B having no tertiary amino group, and a random polymerization type acrylic resin in which a structural unit having no tertiary amino group and a structural unit having a tertiary amino group are irregularly arranged in the polymer side chain.

These resins can be used after mixing with a resin having a structure represented by the general formula (1) as long as the effect of the present invention is not impaired, and the dissolution rate and exposure sensitivity of the film of the unexposed area to the developing solution may be adjusted so as to have an appropriate development time in a desired range. Examples of the polyamide polyester-based resin include "DISPERBYK" (registered trademark)-2200 (manufactured by BYK-Chemie); and "Solsperse" (registered trademark) 11200, 28000, 32000, 32500, 32600, 33500 and M385 (all of which are manufactured by Lubrizol Corporation). Specific examples of the block polymerization type acrylic resin include "DISPERBYK" (registered trademark)-2000 and "BYK" (registered trademark)-6919 (all of which are manufactured by BYK-Chemie), and resins mentioned in JP 2019/89954 A. Examples of the random polymerization type acrylic resin include the resin in which a radically polymerizable group is introduced mentioned in JP 2013/245221 A.

As a form of existence of the resin having a structure represented by the general formula (1) in the photosensitive composition or the negative photosensitive composition, at least a part of the tertiary amino groups may form a salt with other components contained. The salt-forming component is preferably a phosphoric acid ester-based resin, and examples thereof include a linear polyether (or polyether polyester)-based resin having a phosphoric acid group at one end, and a linear polyether (or polyether polyester)-based resin having a phosphoric acid group at both ends. In view of excellent developability, a linear polyether-based resin having a phosphoric acid group at both ends is more preferable. Specific examples of the linear polyether polyester-based resin having a phosphoric acid group at one end include "DISPERBYK" (registered trademark)-111 (manufactured by BYK-Chemie) which is a phosphoric acid monoester having a phosphoric acid group at one end of a linear block copolymer of polyethylene glycol and polycaprolactone. Examples of the linear polyether resin having a phosphoric acid group at both ends include a compound represented by the general formula (27), and the content thereof is preferably 0.5 to 20% by weight relative to the resin having a structure represented by the general formula (1), from the viewpoint of achieving both the effect of improving developability and dispersion stability.

[Chemical Formula 21]

(27)

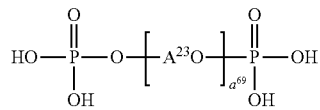

In the general formula (27), $A^{23}O$ represents an oxyalkylene group having 1 to 5 carbon atoms. $a^{69}$ are integers and represent 20 to 100.

From the viewpoint of the developability, the partial structure represented by $[A^{23}O]a^{69}$ is preferably a polyoxyalkylene chain having an oxyethylene group, an oxy n-propylene group and/or an oxyisopropylene group, and $a^{69}$ is preferably 20 to 80.

The photosensitive composition or the negative photosensitive composition of the present invention contains (c) a photosensitive agent. When the photosensitive composition of the present invention is a negative type, the photosensitive agent in the negative photosensitive composition of the present invention means a compound having no tertiary amino group and having two or more radically polymerizable groups in the molecule, and a photopolymerization initiator. By containing both components, the photosensitive agent imparts the function of being exposed to active chemical rays such as ultraviolet light to cause a radical polymerization reaction, leading to photocuring, thus making it possible to form a negative pattern in which the exposed area is insolubilized to a developing solution. Examples of the radically polymerizable group include a vinyl group and a (meth)acrylic group, and the (meth)acrylic group is preferable in view of excellent photocurability. The (meth)acrylic group means a methacrylic group or an acrylic group.

Examples of the compound having no tertiary amino group and having two or more radically polymerizable groups in the molecule include trimethylolpropane di(meth)acrylate, trimethylolpropane tri(meth)acrylate, ditrimethylolpropane tri(meth)acrylate, ditrimethylolpropane tetra(meth)acrylate, 1,9-nonanediol di(meth)acrylate, 1,10-decanediol di(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, 9,9-bis[4-(2-(meth)acryloxyethoxy)phenyl]fluorene, 9,9-bis[4-(3-(meth)acryloxypropoxy)phenyl]fluorene, 9,9-bis(4-(meth)acryloxyphenyl)fluorene, DPHA-40H (decafunctional monomer having a structure in which two molecules of dipentaerythritol pentaacrylates are connected via a urethane bond derived from hexamethylene diisocyanate (manufactured by Nippon Kayaku Co., Ltd.), ε-caprolactone-modified hexafunctional (meth)acrylate, and a bifunctional (meth)acrylate having a bisphenol A skeleton.

From the viewpoint of achieving both suppression of the development residue and the pattern edge shape, it is preferable to use a compound having five or more radically polymerizable groups in the molecule in combination with a compound having four or less radically polymerizable groups in the molecule, and it is more preferable to use a compound having six or more radically polymerizable groups in the molecule in combination with a compound having two radically polymerizable groups in the molecule.

Of these, the s-caprolactone-modified hexafunctional acrylate represented by the general formula (28) is preferable in view of excellent photocurability, and specific example of commercially available products include "KAYARAD" (registered trademark) DPCA-20 in which $n^4$ is 2 in the general formula (28), DPCA-30 in which $n^4$ is 3, DPCA-60 in which $n^4$ is 6, and DPCA-120 in which $n^4$ is 6 (all of which are manufactured by Nippon Kayaku Co., Ltd.).

Further, a bifunctional (meth)acrylate having a bisphenol A skeleton represented by the general formula (29) is preferable in that the adhesion of the pixel division layer to the transparent conductive film can be improved, and specific examples of commercially available product include "LIGHT ACRYLATE" (registered trademark) BP-4EAL in which $A^{24}O$ is an oxyethylene group, $X^{18}$ and $X^{19}$ are hydrogen atoms, and the sum of $a^{70}$ and $a^{71}$ is 4, and BP-4PA in which $A^{25}O$ is an oxyisopropylene group, $X^{18}$ and $X^{19}$ are hydrogen atoms, and the sum of $a^{70}$ and $a^{71}$ is 4 in the general formula (29) (all of which are manufactured by KYOEISHA CHEMICAL CO., LTD.). Further, in order to appropriately enhance the hydrophobicity of the film to suppress peeling during development and to make the pattern edge of the pixel division layer a low taper shape, it is preferable to use a bifunctional acrylate having a fluorene structure in combination, and specific examples thereof include OGSOL EA-0250P, EA-0200 and EA-0300 (all of which are manufactured by Osaka Gas Chemical Co., Ltd.).

[Chemical Formula 22]

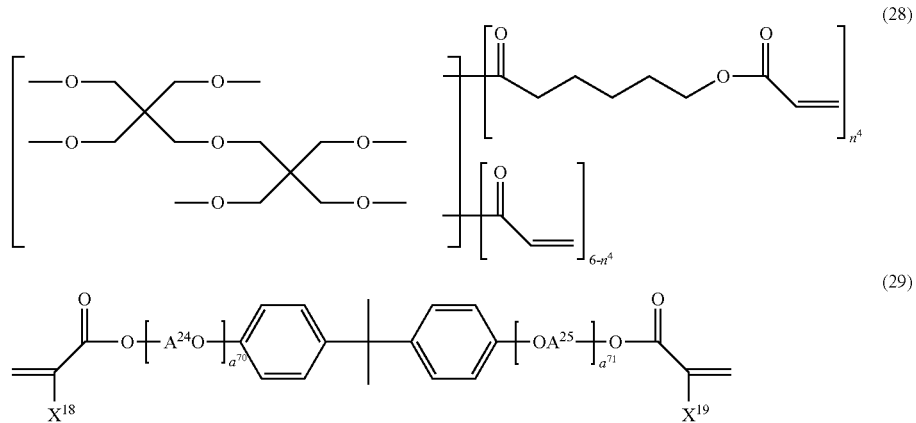

In the general formula (28), $n^4$ is an integer and represents 1 to 6.

In the general formula (29), $a^{70}$ and $a^{71}$ are integers and represent 1 to 4. $A^{24}O$ and $A^{25}O$ each independently represent an oxyalkylene group having 1 to 3 carbon atoms. $X^{18}$ and $X^{19}$ are the same as each other, and represent a hydrogen atom or a methyl group. The content of the compound having no tertiary amino group and having two or more radically polymerizable groups in the molecule is preferably 10 to 40% by weight in the total solid component of the negative photosensitive composition, from the viewpoint of achieving both suppression of the development residue and low taper shape of the pattern edge.

Examples of the photopolymerization initiator are preferably an oxime ester-based photopolymerization initiator, an alkylphenone-based photopolymerization initiator and an acylphosphine oxide-based photopolymerization initiator.

Examples of the oxime ester-based photopolymerization initiator include "ADEKA ARKLS" (registered trademark) NCI-831E (manufactured by ADEKA Corporation, "hereinafter abbreviated to NCI-831E") which is a compound represented by the structural formula (30), a compound represented by the structural formula (31), the compound mentioned in JP 2008/100955 A, the compound mentioned in WO 2006/018405, "Irgacure" (registered trademark) OXE02 (hereinafter abbreviated to "OXE02") which is a compound represented by the structural formula (32) and the like. NCI-831E has the same structure as that of NCI-831 mentioned in Patent Literature 4.

[Chemical Formula 23]

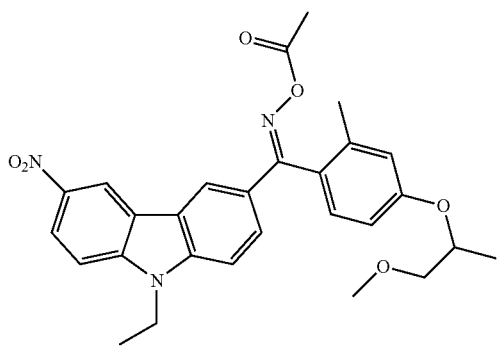

(30)

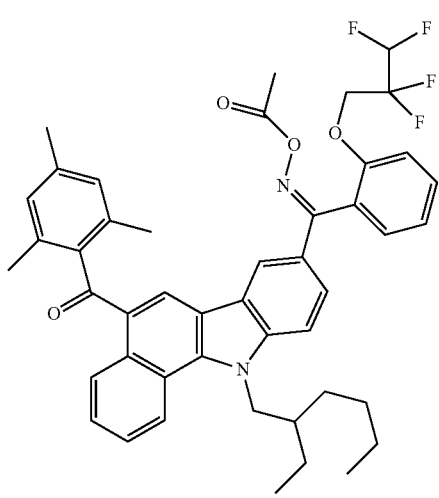

(31)

[Chemical Formula 24]

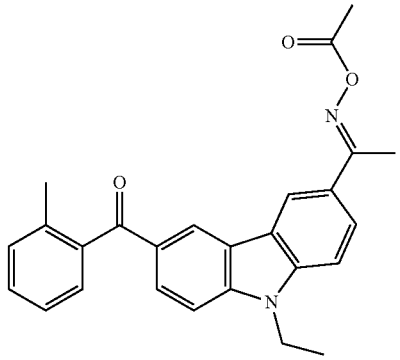

(32)

Examples of the alkylphenone-based photopolymerization initiator include "Omnirad" (registered trademark) 127 as 2-hydroxy-1-(4-(4-(2-hydroxy-2-methylpropionyl)benzyl)phenyl)-2-methylpropan-1-one, "Omnirad" (registered trademark) 369 as 2-benzyl-2-(dimethylamino)-4-morpholinobtyrophenone, and "Omnirad" (registered trademark) 379EG as 2-(dimethylamino)-2-[(4-methylphenyl)methyl]-1-[4-(4-morpholinyl)phenyl]-1-butanone (all of which are manufactured by IGM Resins). Examples of the acylphosphine oxide-based photopolymerization initiator include "Omnirad" (registered trademark) TPO H as 2,4,6-trimethylbenzoyl-diphenylphosphinoxide, and "Omnirad" (registered trademark) 819 as bis(2,4,6-trimethylbenzoyl)phenylphosphine oxide. These photopolymerization initiators may be contained in combination of two or more thereof, and of these, at least an oxime ester-based photopolymerization initiator is preferably contained in that the bottom curing property of the film during exposure is excellent and the development residue is satisfactorily suppressed. The content of the photopolymerization initiator is preferably 1 to 10% by weight in the total solid component of the negative photosensitive composition, from the viewpoint of achieving both suppression of the development residue and the tapered shape of the pattern edge.

Meanwhile, when the photosensitive composition of the present invention is a positive photosensitive composition, the photosensitive agent (c) means a quinonediazide compound, which imparts the function of being exposed to active chemical rays such as ultraviolet light to produce indencarboxylic acid, leading to an enhancement in solubility in the developing solution, thus making it possible to form a positive pattern by making the solubility of the film in the exposed area relatively higher than that of the film in the unexposed area. The quinone diazide compound is preferably a naphthoquinone diazide compound in view of excellent exposure sensitivity.

It is preferable that the photosensitive composition or the negative photosensitive composition of the present invention further contains (d) an alkali soluble resin. The alkali soluble resin refers to a resin which has a carboxyl group and/or a hydroxyl group as an alkali soluble group in a structure thereof and has neither an amino group nor a phosphoric acid group, and does not belong to the component (b). By having a carboxyl group and/or a hydroxyl group, the alkali soluble resin has the solubility in the developing solution, thus making it easy to selectively remove the unexposed or exposed area in negative or positive photolithography, leading to satisfactory patterning property of the pixel division layer.

Examples of the alkali soluble resin include an alkali soluble polyimide resin, an alkali soluble polyimide precursor (alkali soluble polyamic acid resin), an alkali soluble epoxy acrylate resin, an alkali soluble cardo resin, an alkali soluble acrylic resin, an alkali soluble urethane (meth) acrylate resin, an alkali soluble polybenzoxazole resin, an alkali soluble polybenzoxazole precursor, an alkali soluble polysiloxane resin, an alkali soluble novolac resin and the like. Two or more thereof may be contained in combination.

As used herein, the alkali soluble cardo resin means an alkali soluble cardo resin which has a cardo skeleton in the molecule and has no imide skeleton. Meanwhile, the alkali soluble polyimide resin including a structural unit having a cardo skeleton is classified as an alkali soluble polyimide resin. The cardo skeleton refers to a skeleton in which two aromatic groups are connected via a single bond to a quaternary carbon atom which is a ring carbon atom constituting a cyclic structure.

Above all, an alkali soluble polyimide resin, an alkali soluble epoxy (meth)acrylate resin and an alkali soluble acrylic resin are preferable in that the dispersion stabilizing effect of the resin having a structure represented by the general formula (1) is not impaired under freezing. It is more preferable that the component (d) contains at least an alkali soluble polyimide resin and/or an alkali soluble epoxy (meth)acrylate resin in order to improve the heat resistance of the pixel division layer.

The alkali soluble polyimide resin preferably has a phenolic hydroxyl group, and examples thereof include an alkali soluble polyimide resin having a structural unit represented by the general formula (33).

[Chemical Formula 25]

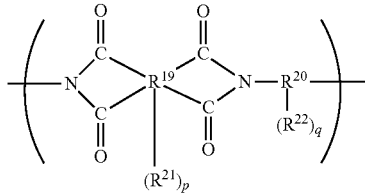

(33)

In the general formula (33), $R^{19}$ represents a tetra- to decavalent organic group. $R^{20}$ represents a di- to octavalent organic group. $R^{21}$ and $R^{22}$ represent a phenolic hydroxyl group. p and q are integers and each independently represent 0 to 6.

In the general formula (33), $R^{19}$-$(R^{21})$ p represents a residue of an acid dianhydride. $R^{19}$ is preferably an organic group having 5 to 50 carbon atoms which has an aromatic ring or a cyclic aliphatic group.

Examples of the acid dianhydride include pyromellitic dianhydride, 3,3',4,4'-biphenyltetracarboxylic dianhydride, 3,3',4,4'-benzophenonetetracarboxylic dianhydride, bis(3,4-dicarboxyphenyl)ether dianhydride, 2,2-bis(3,4-dicarboxyphenyl)hexafluoropropane dianhydride, butanetetracarboxylic dianhydride, 4,4-oxydiphthalic dianhydride, 1,2,3,4-cyclopentanetetracarboxylic dianhydride, bicyclo[2.2.2]oct-7-ene-tetracarboxylic dianhydride and bicyclo[2.2.2]octanetetracarboxylic dianhydride.

In the general formula (33), $R^{20}$-$(R^{22})$q represents a residue of diamine. $R^{20}$ is preferably an organic group having 5 to 40 carbon atoms which has an aromatic ring or a cyclic aliphatic group.

Examples of the diamine include m-phenylenediamine, p-phenylenediamine, 1,4-bis(4-aminophenoxy)benzene, 1, 3-bis(4-aminophenoxy)benzene, 1,3-bis(3-aminophenoxy) benzene, bis[4-(4-aminophenoxy)phenyl]propane, bis[4-(4-aminophenoxy)phenyl]hexafluoropropane, 9,9-bis(4-aminophenyl)fluorene, diaminodiphenyl ether, diaminodiphenylmethane, diaminodiphenylpropane, diaminodiphenylhexafluoropropane, 2,2'-bistrifluorobenzidine, 2,2'-bistrifluorobenzidine, 2,5-bis(aminomethyl)bicyclo[2.2.1]heptane and 2,6-bis(aminomethyl)bicyclo[2.2.1]heptane.

The photosensitive composition or the negative photosensitive composition of the present invention preferably contains an acetate-based solvent among solvents mentioned later in order to enhance the dispersion stabilizing effect of the resin having a structure represented by the general formula (1). In order to enhance the solubility in the acetate-based organic solvent, it is preferable that the alkali soluble polyimide resin having the structural unit represented by the general formula (33) has a fluorine atom in the molecule. Specific examples thereof are preferably a resin including a structural unit derived from acid dianhydride represented by the structural formulas (34) and/or (35) and a structural unit derived from a diamine represented by the structural formula (36).

[Chemical Formula 26]

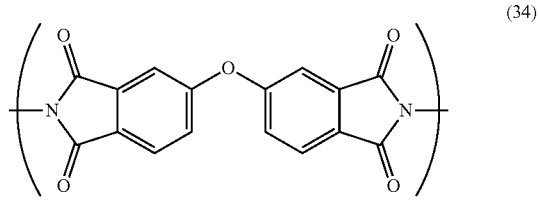

(34)

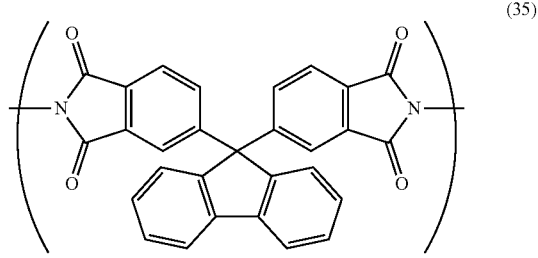

(35)

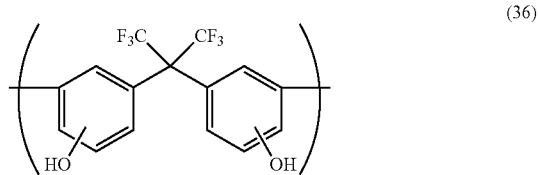

(36)

The acid value of the alkali soluble polyimide resin is preferably 100 mgKOH/g or more in order to suppress the development residue. The acid value is preferably 400 mgKOH/g or less in order to suppress peeling of the pattern edge in the development step. Using an automatic potential difference titrator (AT-510; manufactured by Kyoto Electronics Manufacturing Co., Ltd.) and using a 0.1 mol/L NaOH/ethanol solution as a titration reagent and xylene/dimethylformamide=1/1 (weight ratio) as a titration solvent, the acid value can be determined by measuring using the potential difference titration method based on "JIS K2501 (2003)".

As used herein, the alkali soluble epoxy (meth)acrylate resin refers to a resin having no cardo skeleton in the molecule among acid-modified epoxy resins obtained by performing ring-opening addition of a carboxyl group of an ethylenically unsaturated monocarboxylic acid to an epoxy group of an epoxy resin as a substrate to introduce an ethylenically unsaturated group, and adding a polybasic carboxylic acid (or an anhydride thereof) to at least a part of the hydroxyl group generated by ring-opening of the epoxy group to introduce the carboxyl group. The notation "(meth) acrylate resin" means a resin having a methacrylic group and an acrylic group.

Examples of the epoxy resin as the base material include an epoxy resin having a biphenyl structure, a bisphenol A type epoxy resin, a bisphenol F type epoxy resin, a phenol novolac type epoxy resin and a cresol novolac type epoxy resin. Examples of the ethylenically unsaturated monocarboxylic acid used for modifying the epoxy resin include an acrylic acid and a methacrylic acid. Examples of the polybasic carboxylic acid (or an anhydride thereof) include maleic anhydride, succinic anhydride and tetrahydrophthalic anhydride.

Examples of commercially available products of a PGMEA solution of the alkali soluble epoxy (meth)acrylate resin include ZAR-1494H, ZAR-2001H, ZFR-1491H, ZCR-1569H, ZCR-1797H, ZCR-1798H and ZCR-1761H (all of which are manufactured by Nippon Kayaku Co., Ltd.).

Examples of the alkali soluble epoxy (meth)acrylate resin, which can be preferably used in the photosensitive composition or the negative photosensitive composition of the present invention, include an alkali soluble epoxy (meth) acrylate resin having a structure represented by the general formula (37) which has a hydroxyl group generated by ring-opening of the epoxy group as a residue, in view of excellent developability on the silver alloy film.

[Chemical Formula 27]

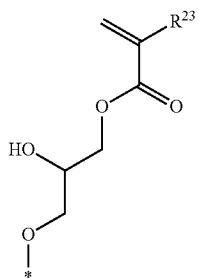

(37)

In the general formula (37), * represents a bonding site to the carbon atom constituting the aromatic ring. $R^{23}$ represents a hydrogen atom or a methyl group. Above all, those having a biphenyl structure in addition to the structure represented by the general formula (37) are preferable in view of excellent developability on the silver alloy film, and specific examples are preferably those having a structure represented by the general formula (38). Of the group of commercially available products, ZCR-1569H, ZCR-1797H, ZCR-1798H and ZCR-1761H correspond thereto.

[Chemical Formula 28]

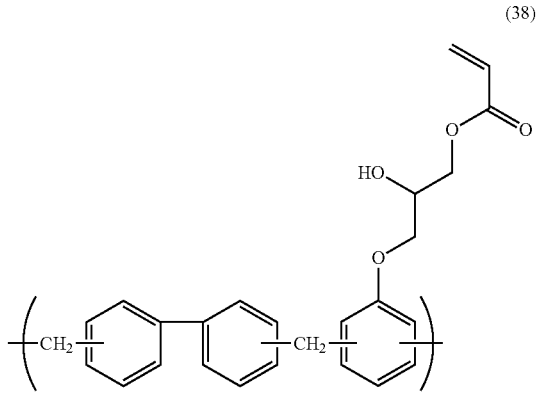

(38)

The acid value of the alkali soluble epoxy (meth)acrylate resin is preferably 30 mgKOH/g or more in order to suppress the development residue. The acid value is preferably 200 mgKOH/g or less in order to suppress peeling of the pattern edge in the development step.

Examples of the alkali soluble acrylic resin include resins obtained by selecting two or more (meth)acrylate compounds having one ethylenically unsaturated double bond in the molecule and copolymerizing them. Examples of the (meth)acrylate-based compound include benzyl (meth)acrylate, 2-ethylhexyl (meth)acrylate, methyl (meth)acrylate, n-butyl (meth)acrylate, ethyl (meth)acrylate, polyethylene glycol (meth)acrylate, isobornyl acrylate, 2-hydroxyethyl (meth)acrylate, 2-hydroxypropyl (meth)acrylate, 2-hydroxybutyl (meth)acrylate, 4-hydroxybutyl (meth)acrylate, 2-ethylhexyl (meth)acrylate, 3-(methacryloyloxymethyl) oxetane, 3-(methacryloyloxymethyl)-3-ethyloxetane, (meth) acrylic acid, glycidyl (meth)acrylate, oxazolidone (meth) acrylate, tricyclodecanyl (meth)acrylate and the like.

Above all, in order to enhance the developability on the silver alloy film, the component (d) preferably contains an alkali soluble acrylic resin having a structural unit represented by the structural formula (39). The pixel division layer having a thick film portion and a thin film portion in the plane mentioned later can be preferably used when forming by halftone processing in that appropriate exposure sensitivity and dissolution rate in the developing solution can be imparted. Of the (meth)acrylate-based compounds having one ethylenically unsaturated double bond in the molecule, the structural unit derived from 2-hydroxyethyl (meth)acrylate, 2-hydroxypropyl (meth)acrylate, 2-hydroxybutyl (meth)acrylate or 4-hydroxybutyl (meth)acrylate corresponds to the structural unit represented by the structural formula (39). Specific examples thereof are preferably a methacrylic acid/2-hydroxyethyl methacrylate/benzyl methacrylate copolymer and an acrylic acid/4-hydroxybutyl acrylate/2-ethylhexyl methacrylate copolymer.

[Chemical Formula 29]

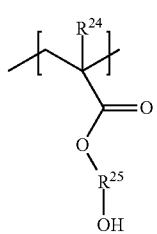

(39)

In the general formula (39), $R^{24}$ represents a hydrogen atom or a methyl group. $R^{25}$ is a divalent linking group and represents a hydrocarbon group having 2 to 6 carbon atoms.

The acid value of the alkali soluble acrylic resin is preferably 5 mgKOH/g or more in order to suppress the development residue. From the viewpoint of suppressing peeling of the pattern edge in the development step, the acid value is preferably 200 mgKOH/g or less.

It is particularly preferable to contain, as the alkali soluble resin, an alkali soluble acrylic resin having a structural unit represented by the structural formula (39), in addition to the alkali soluble polyimide resin and/or the alkali soluble epoxy (meth)acrylate resin.

It is preferable that the photosensitive composition or the negative photosensitive composition of the present invention further contains a solvent. By containing the solvent, the viscosity of the photosensitive composition can be appropriately adjusted according to desired coating method to improve the coatability.

Examples of the solvent include ether-based solvents, acetate-based solvents, ester-based solvents, ketone-based solvents, alcohol-based solvents and the like, and of which, the acetate-based solvent is preferably contained since the dispersion stabilizing effect of the resin having a structure represented by the general formula (1) can be improved.

Examples of the acetate-based organic solvent include propylene glycol monomethyl ether acetate, 3-methoxybutyl acetate, n-propyl acetate, butyl acetate, ethylene glycol monomethyl ether acetate, propylene glycol monomethyl ether acetate, ethylene glycol monobutyl ether acetate, diethylene glycol monoethyl ether acetate, diethylene glycol monobutyl ether acetate and 1,3-butylene glycol diacetate. Of these, propylene glycol monomethyl ether acetate (hereinafter abbreviated to "PGMEA") and 3-methoxybutyl acetate (hereinafter abbreviated to "MBA") are preferable from the viewpoint capable of improving the dispersion stabilizing effect. In order to adjust the drying rate during prebaking, a small amount of 3-methoxy-1-butanol (hereinafter abbreviated to "MB"), propylene glycol monomethyl ether or the like may be used in combination.

The photosensitive composition or the negative photosensitive composition of the present invention may further contain water. The dispersion stability of the pigment (a) may be improved by containing a small amount of water. The content of water in the photosensitive composition is preferably 1% by weight or less, and more preferably 0.5% by weight or less. When water is contained, it is desirable that a part of water is present as adsorbed water on the pigment surface.

The photosensitive composition or the negative photosensitive composition of the present invention may contain an organic dye derivative (synergist) as a dispersion aid. The organic dye derivative refers to a compound in which a functional group selected from an acidic functional group, a basic functional group and a neutral functional group is bonded to an organic dye skeleton, and the organic dye skeleton means a skeleton derived from a color such as a pigment or a dye. The organic dye derivative can suppress a tendency of a specific pigment to selectively reaggregate and color separation during storage by reducing a difference in force to be adsorbed of the dispersant on the surfaces of a plurality of pigments.

Examples of the base pigment include perylene-based pigments, perinone-based pigments, cyanine-based pigments, phthalocyanine-based pigments, azo-based pigments, azomethin-based pigments, anthraquinone-based pigments, quinacridone-based pigments, dioxazine-based pigments, xanthene-based pigments, triarylmethane-based pigments, indigo-based pigments, thioindigo-based pigments, indigoid-based pigments and quinophthalone-based pigments. Examples of the acidic functional group include a sulfo group represented by the structural formula (40) and an aromatic group having a carboxyl group represented by the structural formula (41). Examples of the basic functional group include an organic group having one or more tertiary amino groups at the end via a linking group composed of a sulfonamide structure or a triazine ring. Examples of the neutral functional group include an organic group having a phthalimide structure represented by the structural formula (42).

[Chemical Formula 30]

(40)

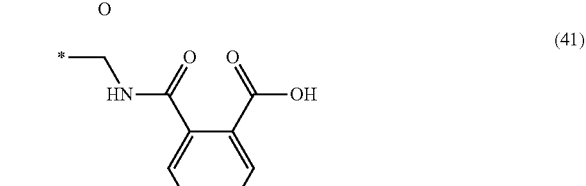
(41)

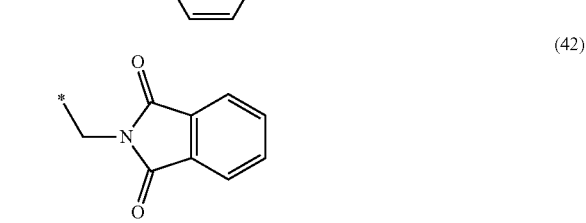
(42)

In the structural formula (40), the structural formula (41) and the structural formula (42), * represents a bonding site to a pigment skeleton.

In order to enhance the dispersion stabilizing effect to the component (a-1), for example, a compound represented by the structural formula (43) may be preferably used. In order to enhance the dispersion stabilizing effect to the component (a-2), for example, a compound represented by the structural formula (44) may be preferably used.

[Chemical Formula 31]

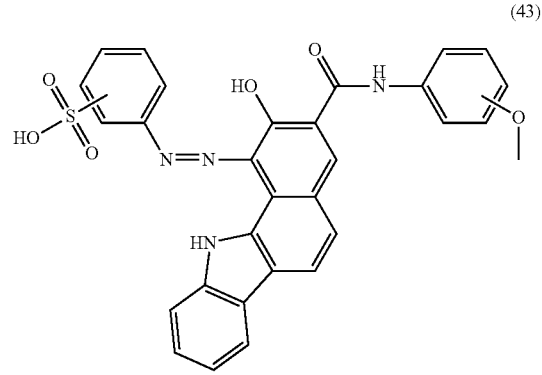
(43)

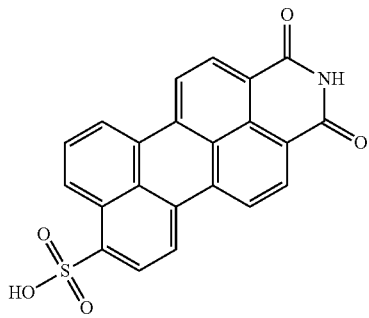

(44)

The photosensitive composition or the negative photosensitive composition of the present invention may contain a thermal crosslinking agent. By containing the thermal crosslinking agent, the smoothness of the electrode surface after forming the pixel division layer may be improved. A polyfunctional epoxy compound is preferable as the thermal crosslinking agent, and specific examples of preferable commercially available products include TEPIC-L, TEPIC-S and TEPIC-PAS (all of which are manufactured by Nissan Chemical Industries, Ltd.), and NC-3000, XD-1000 and XD-1000H (all of which are manufactured by Nippon Kayaku Co., Ltd.).

The photosensitive composition or the negative photosensitive composition of the present invention may further contain surfactants, leveling agents, antioxidants, ultraviolet absorbers and the like as other components.

The photosensitive composition or the negative photosensitive composition of the present invention may be prepared, for example, by a method in which (a) a pigment and (b) a component and a solvent, or a component (a-1) or a component (a-2), a component (b) and a solvent are mixed to fabricate a pigment dispersion liquid by a wet media dispersion treatment, and then (c) a photosensitive agent and other components are added to the pigment dispersion liquid, followed by stirring and optional filter filtration.

Examples of the disperser for wet media dispersion treatment include bead mills, for example, "Revomill" (registered trademark) (manufactured by ASADA IRON WORKS. CO., LTD.), "NANO GETTER" (registered trademark) (manufactured by Ashizawa Finetech Ltd.), "DYNO-MILL" (registered trademark) (manufactured by Willy A. Bachofen AG), "Spike Mill" (registered trademark) (manufactured by Inoue Mfg., Inc.), "Sand Grinder" (registered trademark) (manufactured by DuPont Co., Ltd.) and the like. Examples of media for disperser include zirconia beads, zircon beads or non-alkali glass beads. The diameter of the beads is preferably 0.03 to 5 mmφ, and the higher the sphericity, the more preferable. Specific examples of commercially available products include "TORAYCERAM" (registered trademark) (manufactured by Toray Industries, Inc.) and it is particularly preferable to use the bead having a diameter of 0.05 mmφ, 0.4 mmφ, 1 mmφ or 5 mmφ in order to obtain desired average dispersion particle size mentioned later.

The operating conditions of the wet disperser may be appropriately set so that the average dispersion particle size of the pigment mentioned later is within a desired range. The average dispersion particle size of all the particle components contained in the pigment dispersion liquid, or the photosensitive composition or the negative photosensitive composition obtained by mixing the pigment dispersion liquid is preferably 30 nm or more, and more preferably 50 nm or more, in order to avoid short circuit when a voltage is applied due to the generation of recrystallized foreign substances derived from the pigment in the step of forming a pixel division layer. In order to avoid short circuit when a voltage is applied due to coarse particles, the average dispersion particle size is preferably 200 nm or less, and more preferably 150 nm or less. The average dispersion particle size means the secondary particle size D50 (50% cumulative average size) of pigment particles based on the light scattering intensity to the light source (wavelength of 532 nm/10 mW, semiconductor excitation solid-state laser), and D50 can be calculated as a cumulative average size with the fine particle size side as the base point (0%) using a particle size distribution measuring device "SZ-100 (manufactured by Horiba, Ltd.)" of the dynamic light scattering method.

The photosensitive composition or the negative photosensitive composition of the present invention can be preferably used for the purpose of forming a pixel division layer.

A method for forming a pixel division layer using the photosensitive composition of the present invention or the negative photosensitive composition will be described. The pixel division layer can be obtained by, for example, a photolithography process including a coating step, a pre-baking step, an exposure step, a development step and a curing step in this order.

In the coating step, the photosensitive composition or the negative photosensitive composition is applied to a substrate to obtain a coated film. For example, in the case of producing a top emission type organic display device, examples of the coating device used in the coating step include a slit coater, a spin coater, a gravure coater, a dip coater, a curtain flow coater, a roll coater, a spray coater, a screen printing machine and an inkjet. Due to the panel configuration, the pixel division layer is formed so as to have a thickness of about 0.5 to 3 μm at the time after the curing step, so that a slit coater or a spin coater is preferable since it is suitable for thin film coating and coating defects are less likely to occur, and the thickness uniformity and productivity are excellent, and a slit coater is more preferable in view of liquid saving.

In the prebaking step, a prebaked film is obtained by heating the coated film to volatilize a solvent therefrom. Examples of the heating device include a hot-air oven, a hot plate, a far infrared oven (IR oven) and the like. Pin gap prebaking or contact prebaking may be performed. The prebaking temperature is preferably 50 to 150° C., and the prebaking time is preferably 30 seconds to 30 minutes. To further improve the thickness uniformity, the prebaking step may be performed by heating after a part of the solvent contained in the coated film is volatilized using a vacuum/vacuum dryer after the coating step.

In the exposure step, an exposed film is obtained by irradiating the film side of the prebaked film with chemical active rays via an exposure mask. Examples of the exposure device used in the exposure step include a stepper, a mirror projection mask aligner (MPA), a parallel light mask aligner (PLA) and the like. The chemical active rays to be irradiated at the time of exposure is usually a mixed line such as j-line (wavelength of 313 nm), i-line (wavelength of 365 nm), h-line (wavelength of 405 nm) and g-line (wavelength of 436 nm), or single i-line, and the exposure amount is 10 to 500 mJ/cm² (in terms of i-line).

Examples of the exposure mask include a mask in which a thin film having an exposure light-shielding property made of metal such as chromium or a black organic resin is patterned on one surface of a substrate having the translucency at an exposure wavelength, such as glass, quartz or a film. An exposed film having the exposed area and the unexposed area is obtained by performing pattern exposure by transmitting active chemical rays only at openings.

The exposed area refers to the portion irradiated with the exposure light via mask openings, and the unexposed area refers to the portion irradiated with no exposure light. When using as a layer having a spacer function in the panel member configuration, the pixel division layer may have a thin film portion and a thick film portion in the plane. Examples of the method of obtaining a pixel division layer having a thin film portion and a thick film portion include a method in which pattern exposure is performed via a halftone exposure mask formed with a plurality of openings each having different light transmittance in the exposure light region in the exposure step, so-called halftone processing.

In the development step, when the photosensitive composition of the present invention is a negative photosensitive composition, only the unexposed area is removed to obtain a patterned developed film. The unexposed area becomes the openings of the pixel division layer, and the electrodes are exposed. In the case of the positive photosensitive composition, the exposed area is removed to obtain a patterned developed film. The exposed area becomes the openings of the pixel division layer, and the electrode is exposed. The openings finally become a light emitting pixel portion in the organic EL display device. Examples of the development method include a method in which the exposed film is immersed in a developing solution as an aqueous alkali solution for 10 seconds to 5 minutes by a method such as a shower method, a dipping method, a paddle method or the like.

The paddle method refers to a method in which the unexposed area is dissolved and removed by allowing to stand immediately after coating or showering of a developing solution. As the developing solution, an aqueous 0.3 to 3.0% by weight tetramethylammonium hydroxide solution (hereinafter referred to as "TMAH") is preferable, and an aqueous 2.38% by weight TMAH solution is usually used. After development, a washing treatment by showering deionized water and/or a draining treatment by air injection may be added.

In the curing step, the developed film is thermally cured by heating to improve the heat resistance, and at the same time, components such as moisture, and permeated and residual developing solution are volatilized to obtain a pixel division layer. Examples of the heating device include a hot air oven and an IR oven. The heating temperature is preferably 230 to 300° C. in order to obtain high emission characteristics by sufficient heat curing.

Through each of the above steps, a pixel division layer including a cured film of the photosensitive composition or the negative photosensitive composition of the present invention or can be obtained.

The optical density per 1.0 μm thickness of the pixel division layer is preferably 0.5 or more, and more preferably 1.0 or more, in order to suppress external light reflection to enhance the value as a display device. In order to suppress the generation of the development residue and the generation of off-pixel, the optical density is preferably 2.5 or less, and more preferably 2.0 or less. The optical density means the value obtained by measuring an incident light intensity and a transmitted light intensity of a pixel division layer formed on a transparent substrate so as to have a thickness of 1.5 μm using an optical densitometer (manufactured by X-Rite Inc; X-Rite 361T), and dividing the value calculated from the following equation by 1.5 as the value of the thickness, and the higher the optical density is, the higher the light-shielding property is. As the transparent substrate, "TEMPAX (manufactured by AGC TECHNO GLASS Co., Ltd.)" as a transparent glass substrate can be preferably used.

$$\text{Optical density} = \log_{10}(I_0/I)$$

where
$I_0$: Incident light intensity
$I$: Transmitted light intensity

Next, an organic EL display device comprising a pixel division layer containing a cured product of the photosensitive composition or the negative photosensitive composition of the present invention will be described.

Examples of the organic EL display device include a configuration comprising a first electrode, a pixel division layer, a light emitting pixel and a second electrode. FIG. 1 shows a cross-sectional view of a TFT substrate in the organic EL display device which is preferably exemplified as a specific example of the embodiment of the present invention.

A bottom gate or top gate type TFT 1 (thin film transistor) is arranged in a matrix on the surface of a substrate 6, and a TFT insulating layer 3 is formed so as to cover the TFT 1 and a wiring 2 connected to the TFT 1. Further, a flattening layer 4 is formed on the surface of the TFT insulating layer 3, and the planarization layer 4 is provided with a contact hole 7 for opening the wiring 2. A first electrode 5 is formed in a pattern on the surface of the flattening layer 4 and is connected to the wiring 2. A pixel division layer 8 is formed so as to surround the pattern peripheral edge of the first electrode 5. The pixel division layer 8 is provided with the openings and a light emitting pixel 9 containing an organic EL light emitting material is formed in the openings, and a second electrode 10 is formed to cover the pixel division layer 8 and the light emitting pixel 9. When a voltage is directly applied to the light emitting pixel portion after sealing the TFT substrate with the above laminated structure under vacuum, the light emitting pixel 9 can be made to emit light as the organic EL display device.

The light emitting pixel 9 may be those in which different types of pixels having the respective light emitting peak wavelengths in the ranges of red, blue and green as the three primary colors of light are arranged, or those in which the light emitting pixel emitting white light is formed on the whole plane and color filters of red, blue and green are combined as a separate laminated member. Usually, the red range to be displayed has a peak wavelength of 560 to 700 nm, the blue range has a peak wavelength of 420 to 500 nm and the green range has a peak wavelength of 500 to 550 nm. As an organic EL light emitting material constituting a light emitting pixel, a material obtained by further combining an electron hole transporting layer and an electron transporting layer with a light emitting layer can be suitably used.

Examples of the method of forming a pattern of light emitting pixels include a mask vapor deposition method. The mask vapor deposition method is a method of vapor-depositing and patterning an organic compound using a vapor deposition mask, and specific examples thereof include a method in which a vapor deposition mask having a desired pattern is arranged as openings on the substrate side to perform vapor deposition. In order to obtain a highly accurate vapor deposition pattern, it is important to adhere a highly flat vapor deposition mask to the substrate. In general, it is possible to use a technique for applying tension to the vapor deposition mask, or a technique of adhering the vapor deposition mask to the substrate by a magnet disposed on the back surface of the substrate.

In the case of the top emission type organic EL display device, examples of the first electrode 5 include a laminated pattern in which a transparent conductive film is laminated on the surface of a metal reflective layer. The top emission type refers to a light emitting method in which light emitted from a light emitting pixel is extracted in the direction opposite to that of the substrate 6 via a second electrode. As the metal reflective layer, a silver alloy film is usually used because of having excellent reflectance and conductivity of visible light. The silver alloy is an alloy composed of silver and metals other than silver, the ratio of silver atoms being in the range of 60.0 to 99.9% by weight. The ratio is preferably 90.0% by weight or more is preferable in order to enhance the reflectance and conductivity of visible light, and preferably 99.5% by weight or less in order to enhance the chemical stability. Specific examples of the silver alloy are preferably Ag/Cu (an alloy of silver and copper), Ag/Cu/Pd (an alloy of silver, copper and palladium) and Ag/Cu/Nd (an alloy of silver, copper and neodymium). Examples of commercially available products of a silver alloy target for sputtering, which can be used for film formation of a first electrode or a second electrode mentioned later of the organic EL light emitting device, include "DIASILVER" (registered trademark) series (manufactured by Mitsubishi Materials Corporation).

It is possible to use, as the transparent conductive film, a conductive metal oxide such as indium tin oxide (ITO), indium tin zinc oxide (ITZO) or indium zinc oxide (IZO). Of these, ITO is usually used because of having excellent transparency and conductivity. Of these, amorphous ITO (hereinafter sometimes abbreviated to "a-ITO") or low crystalline ITO is preferable in order to suppress deterioration of the silver alloy. As used herein, the low crystalline ITO means ITO which is obtained by heat-treating an amorphous ITO film obtained by the sputtering method or the like only in the temperature range of 140 to 200° C. The amorphous ITO or the low crystalline ITO is substantially annealed at high temperature by the heat in the curing step (for example, 230° C. or higher) at the time of forming the pixel division layer, and may be converted into a form of high crystalline ITO in the finally obtained light emitting device.

In order to improve the luminance of the light emitting pixel, the thickness of the metal reflective layer is preferably 50 nm or more in order to increase the reflectance, and the thickness of the transparent conductive film is preferably 15 nm or less in order to enhance the transmittance.

As the method for forming a first electrode 5, a metal reflective layer is formed on the whole surface by a sputtering method, and then a patterned resist film is obtained from a positive resist for etching by a photolithography method. Next, only the metal reflective layer of the resist non-forming portion is removed with an etching solution and the resist film is removed with a resist stripping solution, and then a transparent conductive film having the same pattern is laminated by the same procedure. The transparent conductive film may be formed so as to cover not only the upper part of the metal reflective layer, but also the side surface portion. When the laminated structure does not cover the side surface portion, the metal reflective layer and the transparent conductive film may be collectively formed. In order to enhance the adhesion of the metal reflective layer to the substrate, a laminated structure may be composed of substrate/transparent conductive film/metal reflective layer/transparent conductive film.

It is possible to use, as the etching solution for the silver alloy film, for example, an inorganic etching solution such as a mixed acid of phosphoric acid and nitric acid. Examples of commercially available products include SEA-1, SEA-2, SEA-3 and SEA-5 (all of which are manufactured by Kanto Chemical Co., Inc.). It is possible to use, as the etching solution for crystalline ITO, for example, an inorganic acid-based etching solution containing hydrochloric acid or the like, and examples of commercially available products include ITO-02 and ITO-301 (all of which are manufactured by Kanto Chemical Co., Inc.). It is possible to use, as the etching solution for amorphous ITO and IZO, for example, an organic acid-based etching solution containing oxalic acid, and examples of commercial products include ITO-07N and ITO-101N (all of which are manufactured by Kanto Chemical Co., Inc.). It is possible to use, as the positive resist for etching, a positive photosensitive composition containing an alkali soluble novolac resin. It is possible to use, as the resist stripping solution, an aqueous organic amine-based solution, and examples of commercially available products include "UNLAST" (registered trademark) M6, M6B, TN-1-5 and M71-2 (all of which are manufactured by Mitsuwaka Pure Chemicals Research Institute Limited).

It is possible to preferably use, as the second electrode 10, a silver alloy film made of Ag/Mg (an alloy of silver and magnesium) because of having excellent transparency of visible light, and a film can be formed on the whole surface by a sputtering method. The thickness of the second electrode is preferably 10 nm or more in order to avoid disconnection of the electrode, and preferably 40 nm or less, in order to enhance the transmittance to reduce the loss of the luminance of the light emitting pixel.

If a rigid plate-shaped substrate typified by glass or the like is used as the substrate 6, it is possible to obtain a rigid type organic EL display device which cannot be bent. It is possible to suitably use, as the glass, non-alkali glass containing silicon as a main component in which the content of the alkali metal element is less than 0.5%. Of these, preferred are those having a small coefficient of thermal expansion and excellent dimensional stability in a high temperature process of 250° C. or higher. Examples thereof include OA-10G and OA-11 (all of which are manufactured by Nippon Electric Glass Co., Ltd.) and AN-100 (manufactured by Asahi Glass Co., Ltd.), and the thickness thereof is usually 0.1 to 0.5 mm from the viewpoint of the physical durability.

Meanwhile, if a flexible substrate is used as the substrate 6, it is possible to obtain a flexible type organic EL display device which can be bent. It is possible to suitably use, as the flexible substrate, a substrate made of a polyimide resin having high flexibility and excellent mechanical strength, and examples of the method for producing the same include a method in which a solution containing polyamic acid is coated on the surface of a temporary support and polyamic acid is imidized by a heat treatment at high temperature of 300 to 500° C. to convert into a polyimide resin, and then the temporary support is peeled off by a laser or the like. Polyamic acid can be synthesized by reacting tetracarboxylic acid dianhydride with a diamine compound in an amide-based solvent such as N-methyl-2-pyrrolidone. Of these, preferred is polyamic acids having a residue of aromatic tetracarboxylic dianhydride and a residue of an aromatic diamine compound because of small heat expansion coefficient and excellent dimensional stability. Specific examples thereof include polyamic acid having a residue of 3,3',4,4'-biphenyltetracarboxylic dianhydride residues and a residue of p-phenylenediamine. The thickness is usually 10 to 40 μm, and the substrate 6 can be made thinner than the case where the non-alkali glass is used.

Next, an organic EL display device according to the third aspect of the present invention will be described.

The organic EL display device according to the third aspect of the present invention has a pixel division layer containing a resin having two or more tertiary amino groups in the molecule and having a structure represented by the general formula (1).

By containing a resin having two or more tertiary amino groups in the molecule and having a structure represented by the general formula (1), the pixel division layer can suppress the generation of off-pixel.

From the viewpoint of suppressing the generation of off-pixel, the organic EL display device is preferably a top emission type.

It is preferable that the pixel division layer of the organic EL display device of the present invention includes a thin film portion having a thickness of 0.5 μm or more and less than 2.0 μm and a thick film portion having a thickness of 2.0 μm or more and 5.0 μm or less, and includes a portion in which a difference in thickness between the thin film portion and the thick film portion is 1.0 μm or more. From the viewpoint of the halftone processability, the difference in thickness between the thin film portion and the thick film portion is more preferably 1.0 μm or more and 2.0 μm or less. The thin film portion and the thick film portion used herein respectively refer to the thinnest portion and the thickest portion in the pixel division layer in the display area of the organic EL display device, except for the inclined portion of the opening edge portion.

It is preferable that the thick film portion having a thickness of 2.0 μm or more and 5.0 μm or less functions as a spacer. Meanwhile, it is preferable to provide openings for arranging light emitting pixels in the thin film portion having a thickness of 0.5 μm or more and less than 2.0 μm, and to form the thin film portion in the shape of a partition wall. By having a portion where the difference in thickness between the thin film portion and the thick film portion is 1.0 μm or more, the thick film portion functions as a convex spacer when the pattern of the light emitting pixel is formed by the above mask vapor deposition method, and thus it is possible to avoid damage of the thin film portion due to contact with the vapor deposition mask and damage of the vapor deposition mask itself, leading to an improvement in yield when an organic EL display device is produced. Such a pixel division layer may be obtained by laminating a layer having a thick film portion on the surface of a layer having a thin film portion to form two layers. However, from the viewpoint of reducing the number of processes, it is preferable to form the layer all at once by the halftone processing.

EXAMPLES

The present invention will be described in detail below by way of the Examples and Comparative Examples, but the embodiments of the present invention are not limited thereto.

First, the evaluation method in the respective Examples and Comparative Examples will be described.

<Calculation of Necessary Minimum Exposure Amount>

An amorphous ITO film was formed on the whole surface of a 150 mm×150 mm non-alkali glass substrate by a sputtering method, and low-temperature annealing treatment was performed at 150° C. for 30 minutes in a dry nitrogen atmosphere to obtain a substrate including a low crystalline ITO film having a thickness of 10 nm. The surface of the low crystalline ITO film thus obtained was coated with a negative photosensitive composition using a spin coater so that the rotation speed adjusted so that a finally obtained cured film had a thickness of 1.5 μm to obtain a coated film, and the coated film thus obtained was prebaked at 100° C. under atmospheric pressure for 2 minutes using a hot plate (SCW-636, manufactured by Dainippon Screen Mfg. Co., Ltd.) to obtain a substrate formed with a prebaked film, which was cut into two pieces. One of the substrates formed with a prebaked film was immersed in a tray containing an aqueous 2.38% by weight TMAH solution to dissolve the prebaked film, and the time when the substrate was visually observed in a part of the plane was regarded as the necessary minimum development time. Furthermore, using the other substrate formed with a prebaked film, an i-line path fighter transmitting only i-line was set in a both-surface alignment one-side surface exposure apparatus (Mask Aligner PEM-6M, manufactured by Union Optical Co., Ltd.), followed by patterning exposure with i-line (wavelength of 365 nm) of an ultra-high pressure mercury lamp via a gray scale mask for sensitivity measurement (MDRM MODEL 4000-5-FS, manufactured by Opto-Line International) to obtain an exposed film. Then, paddle-type development with an aqueous 2.38% by weight TMAH solution (development time was 1.5 times the necessary minimum development time) was performed using a small-size development apparatus for photolithography (AD-2000, manufactured by Takizawa Sangyo K.K.), followed by rinsing with deionized water for 30 seconds and further drying by air blow to obtain a substrate formed with a developed film provided with a patterned developed film. Next, using an FPD inspection microscope (MX-61L, manufactured by Olympus Corporation), the resolution pattern of the developed film thus fabricated was observed, and the exposure amount (mJ/cm$^2$: a value on an i-line illumination meter) at which the developed film was formed to have the pattern line width of 40 μm under the conditions of the mask bias+2 μm with respect to the opening size of 42 μm in the line-and-space pattern was regarded as the necessary minimum exposure amount (sensitivity) of the negative photosensitive composition. The substrate formed with a developed film fabricated for calculating the necessary minimum exposure amount was used as it was as a substrate for evaluating the development residue on a transparent conductive film mentioned later.

<Calculation of Fulltone Exposure Amount in Halftone Processing>

The surface of the low crystalline ITO film obtained by the method as mentioned above was coated with a negative photosensitive composition using a spin coater at the rotation speed adjusted so that a thick film portion formed through a fulltone exposure amount of irradiation mentioned later had a thickness of 3.0 μm in a finally obtained cured film to obtain a coated film. The coated film thus obtained was prebaked using a hot plate at 100° C. under atmospheric pressure for 2 minutes to obtain a substrate formed with a prebaked film, which was cut into two pieces. One of the substrates formed with a prebaked film was immersed in a tray containing an aqueous 2.38% by weight TMAH solution to dissolve the prebaked film, and the time when the substrate was visually observed in a part of the plane was regarded as the necessary minimum development time. Furthermore, using the other substrate formed with a prebaked film, patterning exposure with i-line of an ultra-high pressure mercury lamp was performed via a gray scale mask for sensitivity measurement by the same method as mentioned above to obtain an exposed film. Then, paddle-type development with an aqueous 2.38% by weight TMAH solution (development time was 1.5 times the necessary minimum development time) was performed using AD-2000, followed by rinsing with deionized water for 30 seconds and further drying by air blow to obtain a substrate formed with a developed film provided with a patterned developed film. Next, a substrate formed with a cured film was obtained by heating under air atmosphere at 230° C. for 30 minutes, and the exposure amount (mJ/cm$^2$: a value on an i-line illumination meter) at which the cured film was formed to have a thickness of 1.5 µm was regarded as the halftone exposure amount of the negative photosensitive composition. Separately, the value obtained by multiplying the value of the halftone exposure amount by 100 and dividing by 30 was regarded as the fulltone exposure amount. In other words, the halftone exposure amount corresponds to 30% of the fulltone exposure amount.

(1) Evaluation of Optical Density of Cured Film (OD/µm)

For substrates for evaluation of the optical density in which a cured film having a thickness of 1.5 µm was formed on the surface of TEMPAX (manufactured by AGC Techno Glass Co., Ltd.) as the transparent glass substrate obtained in Examples 1 to 16 and Comparative Examples 1 to 10, the total optical density (Total OD value) was measured at three points in the plane from the film surface side using an optical densitometer (manufactured by X-Rite Inc; X-Rite 361T) to calculate the average value. The value obtained by dividing the numerical value by 1.5 was rounded to one decimal place to afford a value rounded to one decimal place, and the value thus obtained was regarded as the OD value per 1.0 µm in thickness of the cured film (OD/µm). The evaluation was performed on the basis that the higher the OD/µm, the better the light-shielding property of the cured film. As a result of separately measuring the OD value of TEMPAX formed with no cured film, it was 0.00. Therefore, the OD value of the substrate for evaluation of an optical density was regarded as the OD value of the cured film. The thickness of the cured film was measured at three points in the plane using a stylus type film thickness measurement device (Surfcom manufactured by Tokyo Seimitsu Co., Ltd.), and the average value was rounded to one decimal place to afford a numerical value rounded to one decimal place.

(2) Evaluation of Development Residue on Transparent Conductive Film

Ten openings located in the center of the substrate for evaluation of a development residue on transparent conductive films obtained in Examples 1 to 16 and Comparative Examples 1 to 10 were optically observed using an optical microscope at a magnification of 100 times, and the number of development residues having a major axis of 0.1 µm or more and less than 3.0 µm at each opening was counted. From the average number of development residues observed per opening, evaluation was performed based on the following criteria, and AA and A to C corresponds to "pass", and D to E correspond to "rejection". However, when the residue having a major axis exceeding 3.0 µm was observed, it was rated E regardless of the average number of residues.

AA: No development residue can be observed.
A: Less than 5 development residues can be observed.
B: 5 or more and less than 10 development residues can be observed.
C: 10 or more and less than 20 development residues can be observed.
D: 20 or more development residues can be observed.
E: Development residue having a major axis exceeding 3.0 µm can be observed.

(3) Evaluation of Change in Surface Roughness of Silver Alloy Film

Figure 2:
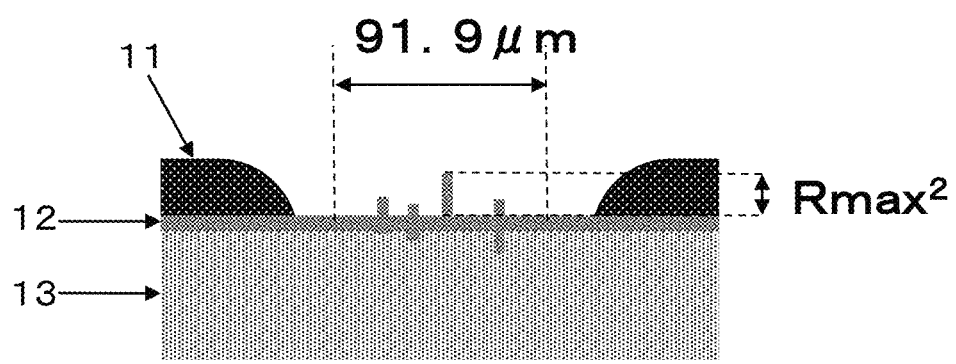
FIG. 2 is a cross-sectional view showing the measurement point of a maximum height difference $Rmax^2$ in all Examples and Comparative Examples.
Figure 3:
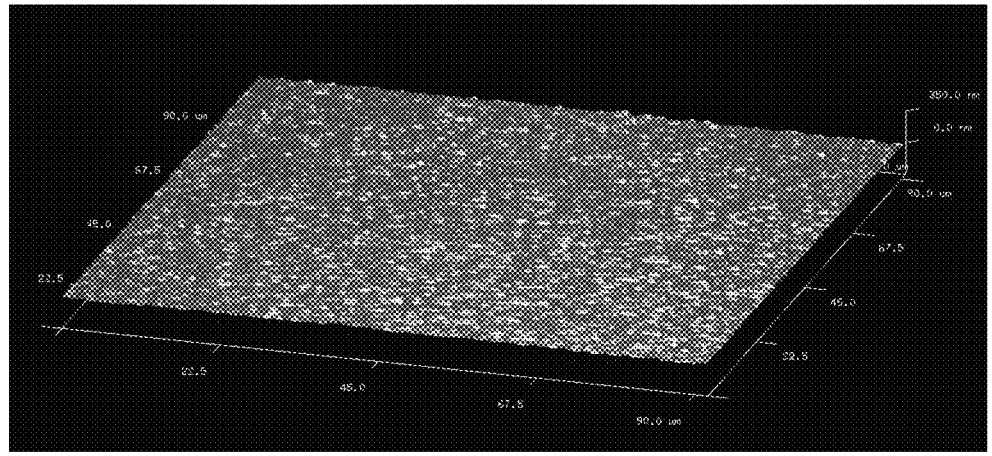
FIG. 3 is a three-dimensional measurement image by an atomic force microscope, which shows a surface state of a silver alloy film after the curing step in Reference Example 1.
Figure 4:
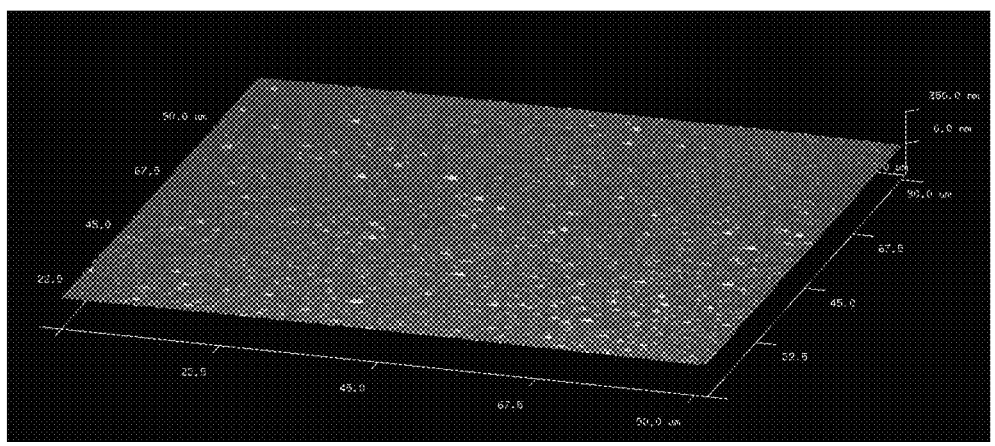
FIG. 4 is a three-dimensional measurement image by an atomic force microscope, which shows a surface state of a silver alloy film located at openings of a pixel division layer in Example 5 (evaluation after frozen storage for 3 months).
Figure 5:
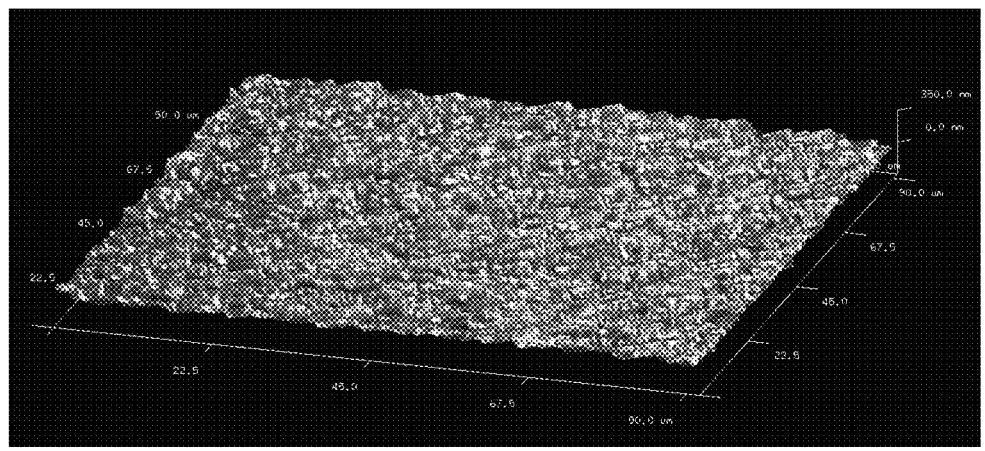
FIG. 5 is a three-dimensional measurement image by an atomic force microscope, which shows a surface state of a silver alloy film located at openings of a pixel division layer in Comparative Example 3 (evaluation after frozen storage for 3 months).
Figure 6:
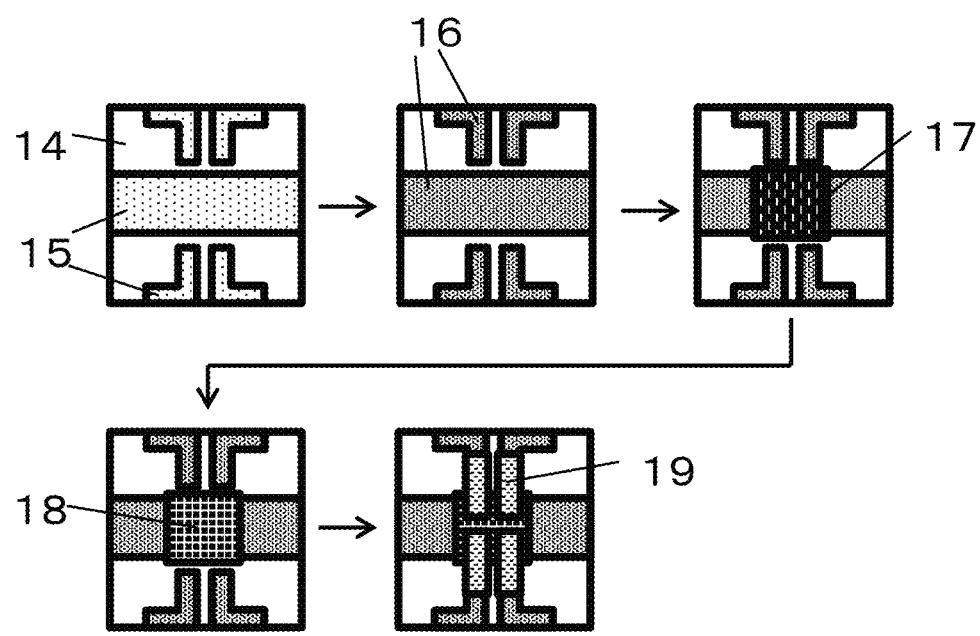
FIG. 6 is a fabrication process of a top emission type organic EL display device comprising a step of forming a pixel division layer in all Examples and Comparative Examples.

For substrates for evaluation of the surface roughness of the silver alloy film obtained in Examples 1 to 16 and Comparative Examples 1 to 10, the following measurement on the measurement items (i) and (ii) was performed using an atomic force microscope (AFM), and the value output in the unit of µm was converted into the unit of nm unit, and then the value was rounded to one decimal place to afford a numerical value rounded to one decimal place. A cross-sectional view showing measurement points of the maximum height difference Rmax$^2$ is shown in FIG. 2.

<Measurement Conditions>

Atomic force microscope: Dimension Icon (manufactured by BRUKER Corp)
Measurement area: 91.9 µm×91.9 µm (measurement at 256 points in plane)
Sample temperature: 25° C.
Output value: Maximum height difference (Rmax)
Output unit: µm <Measurement Item>

(i) Maximum height difference on the surface of the silver alloy film before coating (Rmax$^1$)
(ii) Maximum height difference on the surface of the silver alloy film located at openings after forming the pixel division layer (Rmax$^2$)

The value obtained by subtracting Rmax$^1$ from Rmax$^2$ means a change after formation of the pixel division layer based on the initial state before coating, and the smaller the value, the better the surface roughness of the silver alloy film is maintained. Evaluation was performed based on the following criteria, and AA and A to C correspond to "pass", and D to E correspond to "rejection".

AA: The difference (Rmax$^2$–Rmax$^1$) is less than 5.0 nm.
A: The difference (Rmax$^2$–Rmax$^1$) is 5.0 nm or more and less than 10.0 nm.
B: The difference (Rmax$^2$–Rmax$^1$) is 10.0 nm or more and less than 50.0 nm.
C: The difference (Rmax$^2$–Rmax$^1$) is 50.0 nm or more and less than 100.0 nm.
D: The difference (Rmax$^2$–Rmax$^1$) is 100.0 nm or more and less than 200.0 nm.
E: The difference (Rmax$^2$–Rmax$^1$) is 200.0 nm or more.

(4) Evaluation of Generation Rate (%) of Off-Pixel

Each of the top emission type organic EL display devices obtained in Examples 1 to 16 and Comparative Examples 1 to 10 was allowed to emit light for 500 hours by DC driving at 10 mA/cm$^2$. Then, 40 pixel portions in the plane per 1 part were enlarged and displayed on a monitor at a magnification of 50 times for observation. The number of off-pixel included in 10 parts of the top emission type organic EL display device manufactured under the same conditions was counted, and the generation rate (%) of off-pixel was obtained by the following equation. The value rounded to the first decimal place was calculated. The total number of all the pixels to be evaluated is 400. Evaluation was performed based on the following criteria, and A to C correspond "pass", and D to E correspond to "rejection". Generation rate of off-pixel (%)=total number of off-pixel/total number of all pixels×100

A: The generation rate of off-pixel is less than 10%.
B: The generation rate of off-pixel is 10% or more and less than 15%.
C: The generation rate of off-pixel is 15% or more and less than 20%.
D: The generation rate of off-pixel is 20% or more and less than 30%.

E: The generation rate of off-pixel is 30% or more.

Information such as chemical structure and solid content of various raw materials used in Examples and Comparative Examples is shown below.

"Dispersant 1": compound represented by the structural formula (45) (corresponding to a resin having a structure represented by the general formula (1), solid content is 100% by weight)

[Chemical Formula 32]

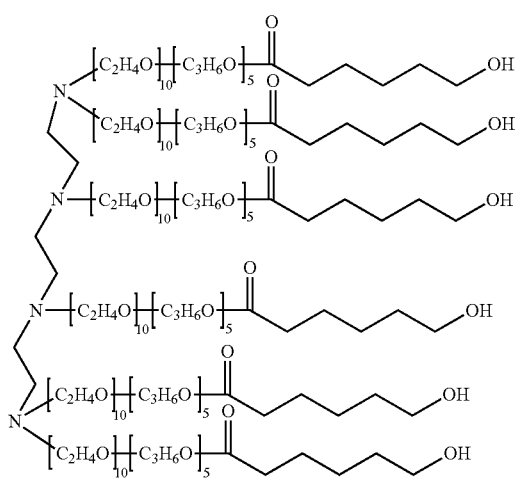

(45)

"Dispersant 2": compound represented by the structural formula (46) (corresponding to a resin having a structure represented by the general formula (1), the solid content is 100% by weight)

[Chemical Formula 33]

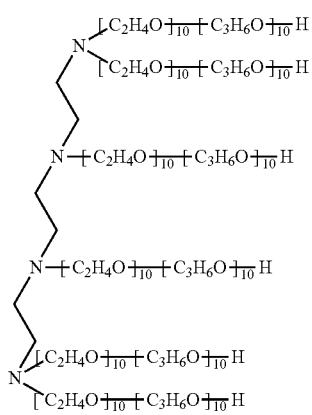

(46)

"Dispersant 3": compound represented by structural formula (47) (corresponding to a resin having a structure represented by the general formula (1), the solid content is 100% by weight)

[Chemical Formula 34]

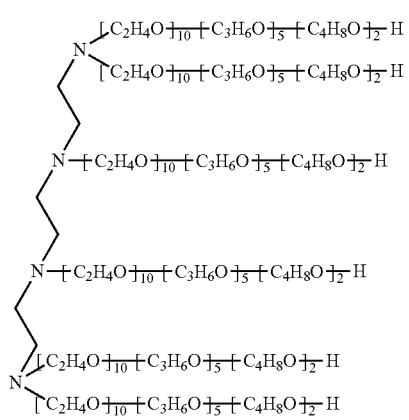

(47)

"Dispersant 4": compound represented by the structural formula (48) (corresponding to a resin having a structure represented by the general formula (1), the solid content is 100% by weight)

[Chemical Formula 35]

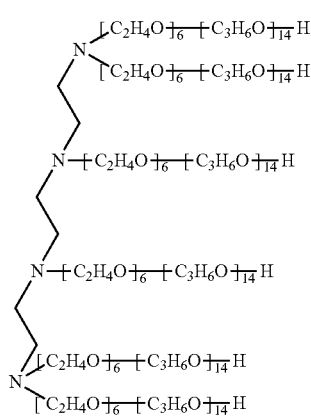

(48)

"Dispersant 5": compound represented by the structural formula (49) (corresponding to a resin having a structure represented by the general formula (1), the solid content is 100% by weight)

[Chemical Formula 36]

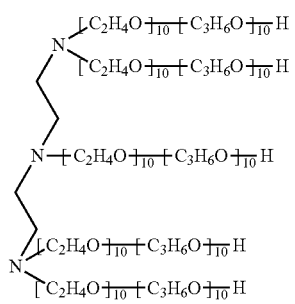

(49)

"Dispersant 6": compound represented by the structural formula (50) (corresponding to a resin having a structure represented by the general formula (1), the solid content is 100% by weight)

[Chemical Formula 37]

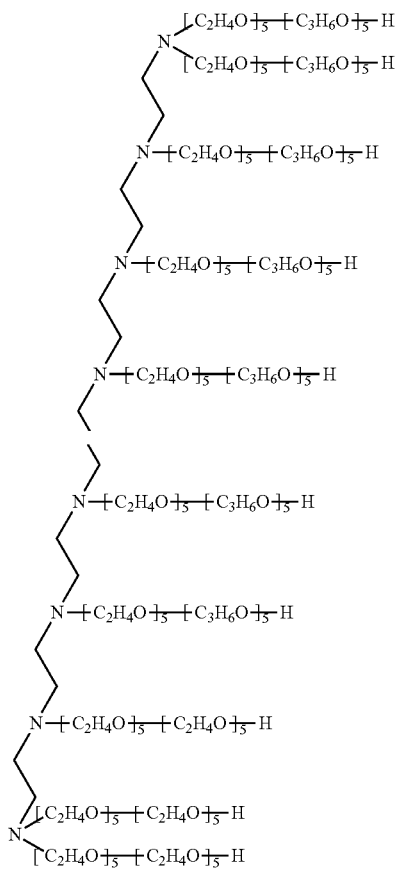

(50)

"Dispersant 7": compound represented by the structural formula (51) (corresponding to a resin having a structure represented by the general formula (1), the solid content is 100% by weight)

[Chemical Formula 38]

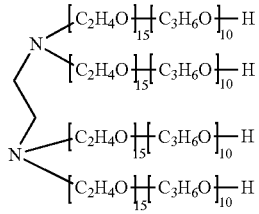

(51)

"Dispersant 8": compound represented by the structural formula (52) (corresponding to a resin having a structure represented by the general formula (1), the solid content is 100% by weight)

[Chemical Formula 39]

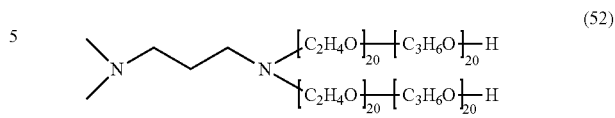

(52)

"Dispersant 9": PGMEA solution represented by the structural formula (53) (corresponding to a resin having a structure represented by the general formula (22), the solid content is 20% by weight)

[Chemical Formula 40]

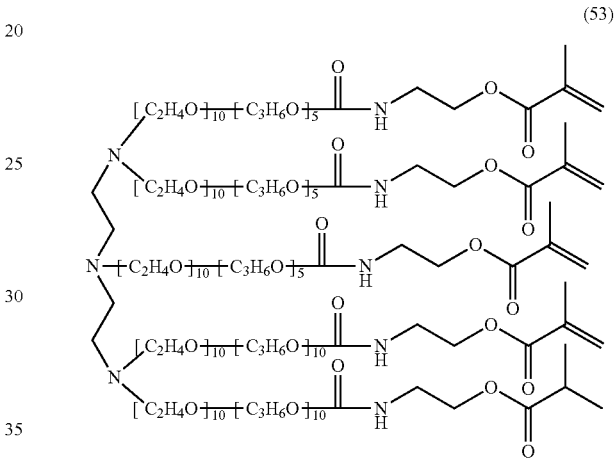

(53)

"Dispersant 10": compound represented by the structural formula (54) (resin having no structure represented by the general formula (1), the solid content is 100% by weight)

[Chemical Formula 41]

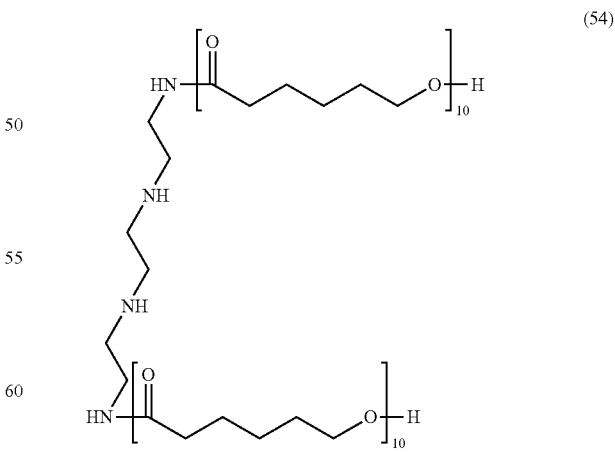

(54)

"Dispersant 11": compound represented by the structural formula (55) (having one tertiary amino group in the molecule, the solid content is 100% by weight)

[Chemical Formula 42]

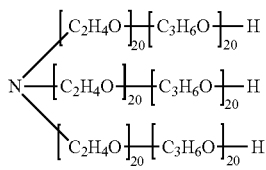
(55)

"Solsperse 24000GR": compound including a structural unit represented by the structural formula (56) in the molecule (manufactured by Lubrizol Corporation: resin having no structure represented by the general formula (1), which is a polymer obtained by grafting a plurality of side chains having an aliphatic chain on the main chain derived from polyethyleneimine, the solid content is 100% by weight)

[Chemical Formula 43]

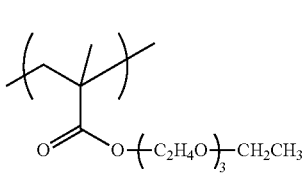
(56)

In the structural formula (56), * represents a bonding site.

"DISPERBYK-LPN21116": ethylene glycol monobutyl ether/1-methoxy-2-propyl acetate solution of a compound including a structural unit represented by the structural formula (57), a structural unit represented by the structural formula (58) and a structural unit represented by the structural formula (59) in the molecule (manufactured by BYK-Chemie: resin having no structure represented by the general formula (1), which is a block type acrylic copolymer having a quaternary ammonium salt group and a tertiary amino group, the solid content is 40% by weight)

[Chemical Formula 44]

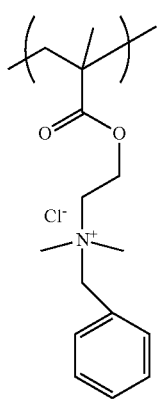
(57)

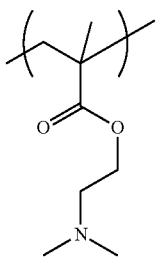
(58)

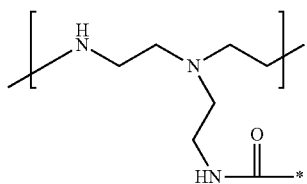
(59)

"Solsperse 20000": resin having one tertiary amino group at one end of a linear polyalkylene chain having an oxyethylene structure and an oxypropylene structure (manufactured by Lubrizol Corporation: resin having no structure represented by the general formula (1), the solid content is 100% by weight).

"DISPERBYK-167": solution of a urethane resin (with the solid content of 52% by weight) having an isocyanurate ring and a polycaprolactone chain in the molecule (manufactured by BYK-Chemie: resin having no structure represented by the general formula (1))

"DISPERBYK-111": phosphoric acid mono ester-based dispersant having a phosphoric acid at one end of a linear block copolymer of polyethylene glycol and polycaprolactone (manufactured by BYK-Chemie: resin having no structure represented by the general formula (1), the solid content is 100% by weight)

"Dispersion aid a": compound represented by the structural formula (44)

"Dispersant 12": compound represented by the structural formula (60) (low molecular weight compound which does not belong to a resin herein, the solid content is 100% by weight)

[Chemical Formula 45]

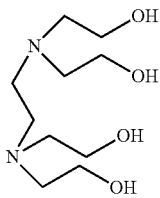
(60)

For dispersants 1 to 12, information such as the number of tertiary amino groups existing in the molecule and the existence or non-existence of the structure represented by the general formula (1) is organized and shown in Table 1.

TABLE 1

| Name of dispersant | Number of tertiary amino groups existing in the molecule | Existence or non-existence of structure represented by the general formula (1) | Existence or non-existence of structure represented by the general formula (22) | Total number of mols of repeating units containing oxyalkylene group having 1 and 2 carbon atoms | Total number of mols of repeating units containing oxyalkylene group having 3 to 5 carbon atoms | Value obtained by diving total number of mols of repeating units containing oxyalkylene group having 1 and 2 carbon atoms by total number of mols of repeating units containing oxyalkylene group having 3 to 5 carbon atoms |
|---|---|---|---|---|---|---|
| Dispersant 1 | 4 | Exist | Not exist | 60 | 36 | 1.67 |
| Dispersant 2 | 4 | Exist | Not exist | 60 | 60 | 1.00 |
| Dispersant 3 | 4 | Exist | Not exist | 60 | 42 | 1.43 |
| Dispersant 4 | 4 | Exist | Not exist | 36 | 84 | 0.43 |
| Dispersant 5 | 3 | Exist | Not exist | 50 | 50 | 1.00 |
| Dispersant 6 | 8 | Exist | Not exist | 50 | 50 | 1.00 |
| Dispersant 7 | 2 | Exist | Not exist | 60 | 40 | 1.50 |
| Dispersant 8 | 2 | Exist | Not exist | 40 | 40 | 1.00 |
| Dispersant 9 | 3 | Not exist | Exist | 55 | 25 | 2.20 |
| Dispersant 10 | 0 | Not exist | Not exist | 0 | 20 | 0.00 |
| Dispersant 11 | 1 | Exist | Not exist | 60 | 60 | 1.00 |
| Dispersant 12 | 2 | Exist | Not exist | 4 | 0 | 0.00 |

"ZCR-1569H": PGMEA solution of an alkali soluble epoxy (meth)acrylate resin including a structural unit represented by the general formula (38) (manufactured by Nippon Kayaku Co., Ltd.: solid acid value of 98 mgKOH/g: weight-average molecular weight of 4,500: solid content of 70% by weight).
"ZCR-1797H": PGMEA solution of an alkali soluble epoxy (meth)acrylate resin including a structural unit represented by the general formula (38) (manufactured by Nippon Kayaku Co., Ltd.: solid acid value of 98 mgKOH/g: weight-average molecular weight of 6,400: solid content of 62% by weight).
"WR-301": PGMEA solution of alkali soluble cardo resin (manufactured by ADEKA Corporation: solid acid value of 98 mgKOH/g: weight-average molecular weight of 5,500: solid content of 42% by weight).
"Benzodifuranone-based black pigment 1": benzodifuranone-based black pigment represented by the structural formula (4) (specific surface area by the BET method of 30 m$^2$/g).

Synthesis Example 1: Synthesis of Alkali Soluble Polyimide Resin A

Under a dry nitrogen stream, 150.15 g of 2,2-bis(3-amino-4-hydroxyphenyl)hexafluoropropane (0.41 mol), 6.20 g 1,3-bis(3-aminopropyl)tetramethyldisiloxane (0.02 mol) and 13.65 g of 3-aminophenol (0.13 mol) as an end-capping agent were dissolved in 500.00 g of N-methyl-2-pyrrolidone (hereinafter abbreviated to "NMP") as the organic solvent, and 155.10 g of bis(3,4-dicarboxyphenyl)ether dianhydride (0.50 mol) and 150 g of NMP were added, followed by stirring at 20° C. for 1 hour and further stirring at 180° C. for 4 hours while removing water. After completion of the reaction, the reaction solution was poured into 10 L of water and the precipitate thus produced was collected by filtration, washed with water five times and then dried in a vacuum dryer at 80° C. for 20 hours to synthesize a white powdered alkali soluble polyimide resin A having a weight-average molecular weight (Mw) of 25,000.

Synthesis Example 2: Synthesis of Alkali Soluble Acrylic Resin Solution B

Under a dry nitrogen stream, a mixture of 72.10 g of 4-hydroxybutyl acrylate (0.50 mol), 92.15 g of 2-ethylhexyl acrylate (0.50 mol), 1.47 g of acrylic acid (0.02 mol) and 8.16 g of a t-butylperoxy-2-ethylhexanoate as the polymerization initiator was added dropwise over 1 hour in 260.83 g of PGMEA under stirring while maintaining at a liquid temperature of 120° C. using a funnel, followed by copolymerization under stirring at 120° C. until the weight-average molecular weight of the finally obtained copolymer reached 10,000 to obtain a resin solution. The resin solution was cooled to 25° C. and then diluted with PGMEA to a solid content of 30% by weight to obtain an alkali soluble acrylic resin solution B. The alkali soluble acrylic resin solution B is a PGMEA solution containing a copolymer of 4-hydroxybutyl acrylate/2-ethylhexyl acrylate/acrylic acid at a mol % ratio of 49/49/2.

Synthesis Example 3: Synthesis of Benzodifuranone-Based Black Pigment 2 Including Coating Layer Made of Silica on Surface In a glass container containing 4500.00 g of deionized water, 500.00 g of a benzodifuranone-based black pigment represented by the structural formula (4) was charged, followed by stirring with a dissolver to obtain a preliminary stirred solution of an aqueous pigment suspension liquid. The aqueous pigment suspension liquid was sucked up by a tube pump and sent into a bead mill equipped with a vessel filled with 0.4 mmφ zirconia beads (manufactured by Toray Industries, Inc.: TORAYCERAM (registered trademark)) at a filling rate of 75% by volume, followed by dispersion for two passes at a discharge rate of 300 mL/min. The aqueous pigment suspension liquid was then sent into a bead mill equipped with a vessel filled with 0.5 mmφ zirconia beads (manufactured by Toray Industries, Inc.: TORAYCERAM (registered trademark)) at a filling rate of 75% by volume, followed by circular dispersion at a discharge rate of 300 mL/min for 6 hours, and the whole amount was discharged into the original glass container, followed by stirring again with the dissolver. When 10 mL of the aqueous pigment suspension liquid was sampled and filtered through a syringe filter having a diameter of 0.45 mm, it was confirmed that the whole amount could be passed without clogging. A pH meter was set so that the tip electrode portion was immersed in the glass container at a depth of 3 to 5 cm from the liquid surface of the aqueous pigment suspension liquid under stirring, and the pH of the obtained aqueous pigment suspension liquid was measured. As a result, the pH was 4.5 (liquid temperature of 25° C.). Then, the liquid temperature of the aqueous pigment suspension liquid was raised to 40° C. while stirring, and after 30 minutes, stirring was temporarily stopped. After 2 minutes, it was confirmed that there was no settling deposit on the bottom of the glass container, and then stirring was restarted.

A solution obtained by diluting sodium silicate ($Na_2O.nSiO_2.mH_2O$: 10% by weight as sodium oxide, 30% by weight as silicon dioxide: alkalinity) with deionized water 100 times and an aqueous 0.001 mol/L sulfuric acid solution were simultaneously added in parallel while adjusting each addition rate so as to maintain the pH of the aqueous pigment suspension liquid in the range of 2 or higher and lower than 7 so that the coating amount of silica was set at 10 parts by weight relative to 100 parts by weight of the benzodifuranone-based black pigment represented by the structural formula (4), and then the surface of the benzodifuranone-based black pigment represented by the structural formula (4) was coated by precipitating a silica hydrate thereon. Next, filtration and washing with water were repeated three times using a Nutche filter to remove a part of water soluble impurities, leading to purification. In order to remove ionic impurities, 50 g each of a cation exchange resin and an anion exchange resin (both of which are manufactured by Organo Corporation: Amberlite) were added to the aqueous pigment suspension liquid, followed by stirring for 12 hours and further filtration to obtain a black residue. The black residue was heated in an oven at an actual temperature of 90° C. for 6 hours under dry air to remove water leading to powderization, followed by dehydration sintering with heating in an oven at an actual temperature of 250° C. for 1 hour under dry air to form a coating layer made of silica.

Finally, a dry pulverization treatment was performed for 30 minutes using a jet mill for sizing to obtain 460.50 g of a benzodifuranone-based black pigment 2. The elements on the surface and the torn surface of the benzodifuranone-based black pigment 2 were analyzed by SEM-EDX, thus confirming that the pigment surface was covered with silicon atoms and oxygen atoms. As a result of thermally decomposition and removal of the organic component by firing in an electric furnace at an actual temperature of 800° C. for 6 hours, it was considered that the constituent components of the benzodifuranone-based black pigment 2 are composed of 100 parts of the benzodifuranone-based black pigment represented by the structural formula (4) as the nucleus and 10 parts by weight of silica as the covering material, based on the weight of the residue. The specific surface area of the benzodifuranone-based black pigment 2 by the BET method was 40 $m^2/g$.

Synthesis Example 4: Synthesis of Alkali Soluble Acrylic Resin Solution C

A mixed solution of 65.07 g of 2-hydroxyethyl methacrylate (0.50 mol), 211.45 g of benzyl methacrylate (1.20 mol), 25.83 g of methacrylic acid (0.30 mol), 5.00 g of 2,2'-azobis (isobutyronitrile) as the polymerization initiator and 200.00 g of PGMEA was fabricated. The mixed solution was maintained at a liquid temperature of 90° C. in a dry nitrogen stream and then added dropwise over 1 hour in 261.02 g of PGMEA under stirring using a funnel. The temperature of the solution was raised to 120° C. and maintained, and then the mixed solution was copolymerized while stirring until the weight-average molecular weight of the finally obtained copolymer became 8,000 to obtain a resin solution. The resin solution was cooled to 25° C. and then diluted with PGMEA so as to have the solid content of 30% by weight to obtain an alkali soluble acrylic resin solution C. The alkali soluble acrylic resin solution C is a PGMEA solution containing a copolymer of 2-hydroxyethyl methacrylate/benzyl methacrylate/methacrylic acid at a mol % ratio of 25/60/15.

Preparation Example 1: Production of Pigment Dispersion Liquid 1

37.50 g of the dispersant 1 and 53.57 g of ZCR-1569H (solid content of 70.00% by weight) were mixed with 783.93 g of PGMEA as the organic solvent, and after stirring for 10 minutes, 125.00 g of the benzodifuranone-based black pigment 2 was added, followed by stirring for 30 minutes to obtain a preliminary stirred solution. The preliminary stirred solution was sent to a bead mill filled with 0.4 mmφ zirconia beads ("TORAYCERAM" (registered trademark) manufactured by Toray Industries, Inc.), and a wet media dispersion treatment was performed by a circulation method for 30 minutes. Further, the solution was sent to a bead mill filled with 0.05 mmφ zirconia beads ("TORAYCERAM" (registered trademark) manufactured by Toray Industries, Inc.), and a wet media dispersion treatment was performed by a circulation method. After a lapse of 30 minutes, the pigment dispersion liquid was sampled by extracting an appropriate amount of the pigment dispersion liquid into a glass bottle every 15 minutes after the dispersion processing time has elapsed, and then set in a dynamic light scattering particle size distribution measuring device "SZ-100" and the average dispersion particle size was measured. Of the pigment dispersion liquids in which the average dispersion particle size is within the range of 100±10 nm 30 minutes after sampling, the pigment dispersion liquid with the shortest dispersion treatment time was regarded as "pigment dispersion 1". The pigment dispersion liquid 1 has a solid content of 20.00% by weight, and the solid component weight ratio is benzodifuranone-based black pigment 2/dispersant 1/ZCR-1569H of 100/30/30. The mixing amount (g) of each raw material and the average dispersion particle size are shown in Table 2.

TABLE 2

| Name of pigment dispersion liquid | Pigment Name | Pigment Weight (g) | Dispersant Name | Dispersant Weight (g) | Alkali soluble resin Name | Alkali soluble resin Weight (g) | Organic solvent Name | Organic solvent Weight (g) | Solid content of pigment dispersion liquid (% by weight) | Average dispersion particle size (nm) |
|---|---|---|---|---|---|---|---|---|---|---|
| Preparation Example 1 | Pigment dispersion liquid 1 | Benzodifuranone-based black pigment 2 | 125.00 | Dispersant 1 | 37.50 | ZCR-1569H | 53.57 | PGMEA | 783.93 | 20.00 | 101 |
| Preparation Example 2 | Pigment dispersion liquid 2 | Benzodifuranone-based black pigment 2 | 125.00 | Dispersant 2 | 37.50 | ZCR-1569H | 53.57 | PGMEA | 783.93 | 20.00 | 102 |
| Preparation Example 3 | Pigment dispersion liquid 3 | Benzodifuranone-based black pigment 2 | 125.00 | Dispersant 3 | 37.50 | ZCR-1569H | 53.57 | PGMEA | 783.93 | 20.00 | 99 |
| Preparation Example 4 | Pigment dispersion liquid 4 | Benzodifuranone-based black pigment 2 | 125.00 | Dispersant 4 | 37.50 | ZCR-1569H | 53.57 | PGMEA | 783.93 | 20.00 | 104 |

TABLE 2-continued

| Name of pigment dispersion liquid | Pigment Name | Weight (g) | Dispersant Name | Weight (g) | Alkali soluble resin Name | Weight (g) | Organic solvent Name | Weight (g) | Solid content of pigment dispersion liquid (% by weight) | Average dispersion particle size (nm) |
|---|---|---|---|---|---|---|---|---|---|---|
| Preparation Example 5 | Pigment dispersion liquid 5 | Benzodifuranone-based black pigment 2 | 125.00 | Dispersant 5 | 37.50 | ZCR-1569H | 53.57 | PGMEA | 783.93 | 20.00 | 99 |
| Preparation Example 6 | Pigment dispersion liquid 6 | Benzodifuranone-based black pigment 2 | 125.00 | Dispersant 6 | 37.50 | ZCR-1569H | 53.57 | PGMEA | 783.93 | 20.00 | 102 |
| Preparation Example 7 | Pigment dispersion liquid 7 | Benzodifuranone-based black pigment 2 | 125.00 | Dispersant 7 | 37.50 | ZCR-1569H | 53.57 | PGMEA | 783.93 | 20.00 | 100 |
| Preparation Example 8 | Pigment dispersion liquid 8 | Benzodifuranone-based black pigment 2 | 125.00 | Dispersant 8 | 37.50 | ZCR-1569H | 53.57 | PGMEA | 783.93 | 20.00 | 103 |

Preparation Examples 2 to 8: Production of Pigment Dispersion Liquids 2 to 8

Using the dispersants 2 to 8 instead of the dispersant 1, a wet media dispersion treatment was performed by the same procedure as in Preparation Example 1 to prepare disperse pigment liquids 2 to 8. The mixing amount (g) of each raw material and the average dispersion particle size are shown in Table 2.

Preparation Example 9: Production of Pigment Dispersion Solution 9

Using the dispersants 5 and 9 instead of the dispersant 1 so that the solid component weight ratio of dispersant 5:dispersant 9 became 2:1, a wet media dispersion treatment was performed by the same procedure as in Preparation Example 1 to prepare a pigment dispersion liquid 9. The mixing amount (g) of each raw material and the average dispersion particle size are shown in Table 3.

Preparation Example 10: Production of Pigment Dispersion Liquid 10

34.09 g of the dispersant 5 and 74.68 g of ZCR-1569H were mixed with 777.60 g of PGMEA, and after stirring for 10 minutes, 113.64 g of the benzodifuranone-based black pigment 1 was added, followed by stirring for 30 minutes to obtain a preliminary stirred solution. In the subsequent process, a wet media dispersion treatment was performed by the same procedure as in Preparation Example 1 to prepare a pigment dispersion liquid 10. The pigment dispersion liquid 10 has a solid content of 20.00% by weight, and the solid component weight ratio of benzodifuranone-based black pigment 1/dispersant 5/ZCR-1569H is 100/30/46. The mixing amount (g) of each raw material and the average dispersion particle size are shown in Table 3.

Preparation Example 11: Production of Pigment Dispersion Liquid 11

37.50 g of the dispersant 5 and 37.50 g of the alkali soluble polyimide resin A were mixed with 800.00 g of PGMEA, and after stirring for 10 minutes, 125.00 g of the benzodifuranone-based black pigment 2 was added, followed by stirring for 30 minutes to obtain a preliminary

TABLE 3

| Name of pigment dispersion liquid | Pigment or organic pigment derivative Name | Weight (g) | Dispersant Name | Weight (g) | Alkali soluble resin Name | Weight (g) | Organic solvent Name | Weight (g) | Solid content of pigment dispersion liquid (% by weight) | Average dispersion particle size (nm) |
|---|---|---|---|---|---|---|---|---|---|---|
| Preparation Example 9 | Pigment dispersion liquid 9 | Benzodifuranone-based black pigment 2 | 125.00 | Dispersant 5 Dispersant 9 | 25.00 62.50 | ZCR-1569H | 53.57 | PGMEA | 733.93 | 20.00 | 98 |
| Preparation Example 10 | Pigment dispersion liquid 10 | Benzodifuranone-based black pigment 1 | 113.64 | Dispersant 5 | 34.09 | ZCR-1569H | 74.68 | PGMEA | 777.60 | 20.00 | 101 |
| Preparation Example 11 | Pigment dispersion liquid 11 | Benzodifuranone-based black pigment 2 | 125.00 | Dispersant 5 | 37.50 | Alkali soluble polyimide resin A | 37.50 | PGMEA | 800.00 | 20.00 | 100 |
| Preparation Example 12 | Pigment dispersion liquid 12 | Pigment Orange 43 Pigment Blue 60 Pigment Blue 65 Pigment Red 179 Dispersion aid a | 25.00 31.25 31.25 37.50 3.75 | Dispersant 5 | 37.50 | ZCR-1569H | 48.21 | PGMEA | 785.54 | 20.00 | 108 | stirred solution. In the subsequent process, a wet media dispersion treatment was performed by the same procedure as in Preparation Example 1 to prepare a pigment dispersion liquid 11. The mixing amount (g) of each raw material and the average dispersion particle size are shown in Table 3.

Preparation Example 12: Production of Pigment Dispersion Liquid 12

37.50 g of the dispersant 5, 48.21 g of ZCR-1569H and 3.75 g of a dispersion aid a were mixed with 785.54 g of PGMEA, and after stirring for 10 minutes, 25.00 g of C.I. Pigment Orange 43 as the organic orange pigment, 31.25 g of C.I. Pigment Blue 60 as the organic blue pigment, 31.25 g of C.I. Pigment Blue 65 as the organic blue pigment and 37.50 g of C.I. Pigment Red 179 as the organic red pigment were added, followed by stirring for 30 minutes to obtain a preliminary stirred solution. In the subsequent process, a wet media dispersion treatment was performed by the same procedure as in Preparation Example 1 to prepare a pigment dispersion liquid 12. The pigment dispersion liquid 12 has a solid content of 20.00% by weight, and the solid component weight ratio of component (a-2)/dispersion aid a/dispersant 5/ZCR-1569H is 100/3/30/27. The mixing amount (g) of each raw material and the average dispersion particle size are shown in Table 3.

Preparation Example 13: Production of Pigment Dispersion Liquid 13

15.00 g of Solsperse 20000 and 45.00 g of the alkali soluble polyimide resin A were mixed with 850.00 g of MBA as the organic solvent, and after stirring for 10 minutes, 90.00 g of the benzodifuranone-based black pigment 1 was added, followed by stirring for 30 minutes to obtain a preliminary stirred solution. In the subsequent process, a wet media dispersion treatment was performed by the same procedure as in Preparation Example 1 to prepare a pigment dispersion liquid 13. The pigment dispersion liquid 13 has a solid content of 15.00% by weight, and the solid component weight ratio of benzodifuranone-based black pigment 1/Solsperse 20000/alkali soluble polyimide resin A was 100/16.67/50. The mixing amount (g) of each raw material and the average dispersion particle size are shown in Table 4.

Preparation Example 14: Production of Pigment Dispersion Liquid 14

125.00 g of DISPERBYK-LPN21116 (solid content of 40.00% by weight) and 71.43 g of ZCR-1569H were mixed with a mixed solvent (160.00 g of MB and 543.57 g of PGMEA), and after stirring for 10 minutes, 100.00 g of the benzodifuranone-based black pigment 1 was added, followed by stirring for 30 minutes to obtain a preliminary stirred solution. In the subsequent process, a wet media dispersion treatment was performed by the same procedure as in Preparation Example 1 to prepare a pigment dispersion liquid 14. The pigment dispersion liquid 14 has a solid content of 20.00% by weight, and the solid component weight ratio of benzodifuranone-based black pigment 1/DISPERBYK-LPN21116/ZCR-1569H is 100/50/50. The mixing amount (g) of each raw material and the average dispersion particle size are shown in Table 4.

Preparation Example 15: Production of Pigment Dispersion Liquid 15

125.00 g of DISPERBYK-LPN21116, 6.00 g of DISPERBYK-111 and 62.86 g of ZCR-1569H were mixed with a mixed solvent (160.00 g of MB and 546.14 g of PGMEA), and after stirring for 10 minutes, 100.00 g of the benzodifuranone-based black pigment 1 was added, followed by stirring for 30 minutes to obtain a preliminary stirred solution. In the subsequent process, a wet media dispersion treatment was performed by the same procedure as in Preparation Example 1 to prepare a pigment dispersion liquid 15. The pigment dispersion liquid 15 has a solid content of 20.00% by weight, and the solid component weight ratio of benzodifuranone-based black pigment 1/DISPERBYK-LPN21116/DISPERBYK-111/ZCR-1569H is 100/50/6/44. The mixing amount (g) of each raw material and the average dispersion particle size are shown in Table 4.

TABLE 4

| | Name of pigment dispersion liquid | Pigment Name | Pigment Weight (g) | Dispersant Name | Dispersant Weight (g) | Alkali soluble resin Name | Alkali soluble resin Weight (g) | Organic solvent Name | Organic solvent Weight (g) | Solid content of pigment dispersion liquid (% by weight) | Average dispersion particle size (nm) |
|---|---|---|---|---|---|---|---|---|---|---|---|
| Preparation Example 13 | Pigment dispersion liquid 13 | Benzodifuranone-based black pigment 1 | 90.00 | Solsperse 20000 | 15.00 | Alkali soluble polyimide resin A | 45.00 | MBA | 850.00 | 15.00 | 102 |
| Preparation Example 14 | Pigment dispersion liquid 14 | Benzodifuranone-based black pigment 1 | 100.00 | DISPERBYK-LPN21116 | 125.00 | ZCR-1569H | 71.43 | PGMEA MB | 543.57 160.00 | 20.00 | 101 |
| Preparation Example 15 | Pigment dispersion liquid 15 | Benzodifuranone-based black pigment 1 | 100.00 | DISPERBYK-LPN21116 DISPERBYK-111 | 125.00 6.00 | ZCR-1569H | 62.86 | PGMEA MB | 546.14 160.00 | 20.00 | 106 |
| Preparation Example 16 | Pigment dispersion liquid 16 | Benzodifuranone-based black pigment 2 | 125.00 | DISPERBYK-LPN21116 | 93.75 | ZCR-1569H | 53.57 | PGMEA | 727.68 | 20.00 | 107 |
| Preparation Example 17 | Pigment dispersion liquid 17 | Benzodifuranone-based black pigment 1 | 125.00 | — | — | ZCR-1569H | 107.14 | PGMEA | 767.86 | 20.00 | Not reach 100 ± 10 nm |

Preparation Example 16: Production of Pigment Dispersion Liquid 16

93.75 g of DISPERBYK-LPN21116 and 53.57 g of ZCR-1569H were mixed with 727.68 g of PGMEA, and after stirring for 10 minutes, 125.00 g of the benzodifuranone-based black pigment 2 was added, followed by stirring for 30 minutes to obtain a preliminary stirred solution. In the subsequent process, a wet media dispersion treatment was performed by the same procedure as in Preparation Example 1 to prepare a pigment dispersion liquid 15. The pigment dispersion liquid 15 has a solid content of 20.00% by weight, and the solid component weight ratio of the benzodifuranone-based black pigment 2/DISPERBYK-LPN21116/ZCR-1569H is 100/30/30. The mixing amount (g) of each raw material and the average dispersion particle size are shown in Table 4.

Preparation Example 17: Production of Pigment Dispersion Liquid 17

Without using the dispersant, 107.14 g of ZCR-1569H was mixed with 767.86 g of PGMEA, and after stirring for 10 minutes, 125.00 g of the benzodifuranone-based pigment 1 was added, followed by stirring for 30 minutes to obtain a preliminary stirred solution. In the subsequent process, an attempt was made to obtain a pigment dispersion liquid 17 by performing a wet media dispersion treatment in the same procedure as in Preparation Example 1. However, reaggregation remarkably occurred before reaching the average dispersion particle size within the range of 100±10 nm. Due to drastic increase in viscosity of the pigment dispersion liquid, the internal pressure of the pump increased, thus making it difficult to send the liquid into the vessel of the bead mill. Therefore, the wet media dispersion treatment had to be stopped, thus failing to obtain the pigment dispersion 17. The mixing amount (g) of each raw material is shown in Table 4.

Preparation Examples 18 to 19: Production of Pigment Dispersion Liquids 18 to 19

Using the dispersants 10 to 11 instead of the dispersant 1, a wet media dispersion treatment was performed by the same procedure as in Preparation Example 1 to prepare dispersion liquids 18 to 19. The mixing amount (g) of each raw material and the average dispersion particle size are shown in Table 5.

TABLE 5

| | Name of pigment dispersion liquid | Pigment Name | Pigment Weight (g) | Dispersant Name | Dispersant Weight (g) |
|---|---|---|---|---|---|
| Preparation Example 18 | Pigment dispersion liquid 18 | Benzodifuranone-based black pigment 2 | 125.00 | Dispersant 10 | 37.50 |
| Preparation Example 19 | Pigment dispersion liquid 19 | Benzodifuranone-based black pigment 2 | 125.00 | Dispersant 11 | 37.50 |
| Preparation Example 20 | Pigment dispersion liquid 20 | Benzodifuranone-based black pigment 2 | 125.00 | Dispersant 12 | 37.50 |
| Preparation Example 21 | Pigment dispersion liquid 21 | Benzodifuranone-based black pigment 2 | 125.00 | Solsperse 24000GR | 37.50 |
| Preparation Example 22 | Pigment dispersion liquid 22 | Benzodifuranone-based black pigment 2 | 125.00 | DISPERBYK-167 | 72.12 |
| Preparation Example 23 | Pigment dispersion liquid 23 | Pigment Orange 43<br>Pigment Blue 60<br>Pigment Blue 65<br>Pigment Red 179<br>Dispersion aid a | 25.00<br>31.25<br>31.25<br>37.50<br>3.75 | DISPERBYK-LPN21116 | 93.75 |
| Preparation Example 24 | Pigment dispersion liquid 24 | Benzodifuranone-based black pigment 2 | 125.00 | Dispersant 5 | 37.50 |

| | Alkali soluble resin Name | Alkali soluble resin Weight (g) | Organic solvent Name | Organic solvent Weight (g) | Solid content of pigment dispersion liquid (% by weight) | Average dispersion particle size (nm) |
|---|---|---|---|---|---|---|
| Preparation Example 18 | ZCR-1569H | 53.57 | PGMEA | 783.93 | 20.00 | 105 |
| Preparation Example 19 | ZCR-1569H | 53.57 | PGMEA | 783.93 | 20.00 | 98 |
| Preparation Example 20 | ZCR-1569H | 53.57 | PGMEA | 783.93 | 20.00 | Not reach 100 ± 10 nm |
| Preparation Example 21 | ZCR-1569H | 53.57 | PGMEA | 783.93 | 20.00 | Not reach 100 ± 10 nm |
| Preparation Example 22 | ZCR-1569H | 53.57 | PGMEA | 749.31 | 20.00 | 102 |
| Preparation Example 23 | ZCR-1569H | 48.21 | PGMEA | 729.29 | 20.00 | 108 |

TABLE 5-continued

| Preparation Example 24 | WR-301 | 89.29 | PGMEA | 748.21 | 20.00 | 102 |

Preparation Examples 20 to 21: Production of Pigment Dispersion Liquids 20 to 21

An attempt was made to obtain pigment dispersion liquids 20 to 21 by performing a wet media dispersion treatment in the same procedure as in Preparation Example 1 using the dispersant 12 and Solspace24000GR instead of the dispersant 1. However, reaggregation remarkably occurred before reaching the average dispersion particle size within the range of 100±10 nm. Due to drastic increase in viscosity of the pigment dispersion liquid, the internal pressure of the pump increased, thus making it difficult to send the liquid into the vessel of the bead mill. Therefore, the wet media dispersion treatment had to be stopped, thus failing to obtain the pigment dispersions 20 to 21. The mixing amount (g) of each raw material is shown in Table 5.

Preparation Example 22: Production of Pigment Dispersion Liquid 22

72.12 g of DISPERBYK-167 (solid content of 52.00% by weight) and 53.57 g of ZCR-1569H were mixed with 749.31 g of PGMEA, and after stirring for 10 minutes, 125.00 g of the benzodifuranone-based black pigment 2 was added, followed by stirring for 30 minutes to obtain a preliminary stirred solution. In the subsequent process, a wet media dispersion treatment was performed by the same procedure as in Preparation Example 1 to prepare a pigment dispersion liquid 22. The pigment dispersion liquid 22 has a solid content of 20.00% by weight, and the solid component weight ratio of benzodifuranone-based black pigment 1/DISPERBYK-167/ZCR-1569H was 100/30/30. The mixing amount (g) of each raw material and the average dispersion particle size are shown in Table 5.

Preparation Example 23: Production of Pigment Dispersion Liquid 23

93.75 g of DISPERBYK-LPN21116, 48.21 g of ZCR-1569H, and 3.75 g of the dispersion aid a were mixed with 729.29 g of PGMEA, and after stirring for 10 minutes, 25.00 g of C.I. Pigment Orange 43 as the organic orange pigment, 31.25 g of C.I. Pigment Blue 60 as the organic blue pigment, 31.25 g of C.I. Pigment Blue 65 as the organic blue pigment and 37.50 g of C.I. Pigment Red 179 as the organic red pigment were added, followed by stirring for 30 minutes to obtain a preliminary stirred solution. In the subsequent process, a wet media dispersion treatment was performed by the same procedure as in Preparation Example 1 to prepare a pigment dispersion liquid 23. The pigment dispersion liquid 23 has a solid content of 20.00% by weight, and the solid component weight ratio of component (a-2)/dispersion aid a/DISPERBYK-LPN21116/ZCR-1569H is 100/3/30/27. The mixing amount (g) of each raw material and the average dispersion particle size are shown in Table 5.

Preparation Example 24: Production of Pigment Dispersion Liquid 24

37.50 g of the dispersant 5 and 89.29 g of WR-301 (solid content of 42.00% by weight) as the alkali soluble cardo resin solution were mixed with 748.21 g of PGMEA, and after stirring for 10 minutes, 125.00 g of the benzodifuranone-based black pigment 2 was added, followed by stirring for 30 minutes to obtain a preliminary stirred solution. In the subsequent process, a wet media dispersion treatment was performed by the same procedure as in Preparation Example 1 to prepare a pigment dispersion liquid 24. The pigment dispersion liquid 24 has a solid content of 20.00% by weight, and the solid component weight ratio of benzodifuranone-based black pigment 2/dispersant 5/WR-301 is 100/30/30. The mixing amount (g) of each raw material and the average dispersion particle size are shown in Table 5.

Example 1: Preparation and Evaluation of Negative Photosensitive Composition 1

Under a yellow light, 0.18 g of NCI-831E as the photopolymerization initiator was added to a mixed solvent of 1.28 g of MBA and 12.66 g of PGMEA, and then dissolved therein by stirring for 3 minutes. To this, 1.29 g of ZCR-1569H and 0.60 g of the alkali soluble acrylic resin solution B were added, and then 0.23 g of DPCA-20 as the compound having no tertiary amino group and having two or more radically polymerizable groups in the molecule, 0.23 g of BP-4EAL and 0.72 g of EA-0250P (PGMEA solution with a solid content of 50% by weight) were added. Further, 0.90 g of a 5% by weight PGMEA solution of EMULGEN A-60 (manufactured by Kao Corporation) as the nonionic surfactant was added, followed by stirring for 10 minutes to obtain a mixed solution. This mixed solution and 11.93 g of the pigment dispersion liquid 1 were mixed, followed by stirring for 30 minutes to obtain a negative photosensitive composition 1. The solid content of the negative photosensitive composition 1 is 15.00% by weight, and the content of the benzodifuranone-based black pigment 2 in the solid component is 33.13% by weight (the content of the nucleus is 30.11% by weight). The mixing amount (g) of each raw material are shown in Table 6.

TABLE 6

| Name of negative photosensitive composition | Pigment dispersion liquid | | (d) Alkali soluble resin | | (c) Photosensitive agent Compound having no tertiary amino group and having two or more radically polymerizable groups in the molecule | |
|---|---|---|---|---|---|---|
| | Name | Weight (g) | Name | Weight (g) | Name | Weight (g) |
| Example 1 Negative photosensitive composition 1 | Pigment dispersion liquid 1 | 11.93 | ZCR-1569H Alkali soluble acrylic resin solution B | 1.29 0.60 | DPCA-20 BP-4EAL EA-0250P | 0.23 0.23 0.72 |

TABLE 6-continued

| | | | | | | |
|---|---|---|---|---|---|---|
| Example 2 | Negative photosensitive composition 2 | Pigment dispersion liquid 2 | 11.93 | ZCR-1569H Alkali soluble acrylic resin solution B | 1.29 0.60 | DPCA-20 BP-4EAL EA-0250P | 0.23 0.23 0.72 |
| Example 3 | Negative photosensitive composition3 | Pigment dispersion liquid 3 | 11.93 | ZCR-1569H Alkali soluble acrylic resin solution B | 1.29 0.60 | DPCA-20 BP-4EAL EA-0250P | 0.23 0.23 0.72 |
| Example 4 | Negative photosensitive composition 4 | Pigment dispersion liquid 4 | 11.93 | ZCR-1569H Alkali soluble acrylic resin solution B | 1.29 0.60 | DPCA-20 BP-4EAL EA-0250P | 0.23 0.23 0.72 |

| | (c) Photosensitive agent Photopolymerization initiator (NCI-831E) Weight (g) | Nonionic surfactant (solution in which solid content of A-60 is 5% by weight) solution Weight (g) | Solvent Name | Weight (g) | Solid content of negative photosensitive composition (% by weight) |
|---|---|---|---|---|---|
| Example 1 | 0.18 | 0.90 | MBA PGMEA | 1.28 12.66 | 15.00 |
| Example 2 | 0.18 | 0.90 | MBA PGMEA | 1.28 12.66 | 15.00 |
| Example 3 | 0.18 | 0.90 | MBA PGMEA | 1.28 12.66 | 15.00 |
| Example 4 | 0.18 | 0.90 | MBA PGMEA | 1.28 12.66 | 15.00 |

The surface of TEMPAX (manufactured by AGC Techno Glass Co., Ltd.) as the transparent glass substrate was coated with the negative photosensitive composition 1 using a spin coater at the rotation speed adjusted so that the thickness of the finally obtained cured film was 1.5 μm to obtain a coated film, and then the coated film thus obtained was prebaked at 100° C. under atmospheric pressure for 120 seconds using a hot plate (SCW-636, manufactured by Dainippon Screen Mfg. Co., Ltd.) to obtain a prebaked film. Using a both-surface alignment one-side surface exposure apparatus and an i-line path fighter was set therein, and then the whole surface of the prebaked film was irradiation with i-line of an ultrahigh-pressure mercury lamp at an exposure amount of 80 mJ/cm$^2$ (in terms of i-line) to obtain an exposed film. Then, development with an aqueous 2.38% by weight TMAH solution (development time was 1.5 times the necessary minimum development time) was performed using a small-size development apparatus for photolithography (AD-2000, manufactured by Takizawa Sangyo K.K.) followed by rinsing with deionized water for 30 minutes to obtain a developed film. Using a high-temperature inert gas oven (INH-9CD-S; manufactured by Koyo Thermo Systems Co., Ltd.), the developed film was heated in an air atmosphere at 230° C. for 30 seconds to obtain a substrate 1 for evaluation of an optical density, including a cured film having a thickness of 1.5 μm. The optical density (OD/μm) was evaluated by the above method and found to be 1.4. The thickness of the cured film means that, after measuring at three points in the plane of the cured film, the average value was rounded to one decimal place to afford a numerical value rounded to one decimal place, which is 1.5 μm.

The necessary minimum exposure amount of the negative photosensitive composition 1 was calculated by the above method, and further, the development residue on the transparent conductive film was evaluated using the same substrate.

A film of a silver alloy (an alloy composed of 99.00% by weight of silver and 1.00% by weight of copper) was formed on the whole surface of a 150 mm×150 mm non-alkali glass substrate by a sputtering method. In order to evaluate the surface condition of the silver alloy film as an external load history closer to that when the low crystalline ITO film is laminated, the silver alloy film was immersed in an aqueous 5% by weight oxalic acid solution maintained at a liquid temperature of 50° C. for 5 minutes. After shower washing with deionized water for 2 minutes, the film was dried with air blow. The silver alloy film was insoluble in the aqueous 5% by weight oxalic acid solution. After heating in a dry nitrogen atmosphere at 150° C. for 30 minutes, the substrate 1 which has only a silver alloy film having a thickness of 100 nm was obtained, and the maximum height difference (Rmax$^1$) on the surface of the silver alloy film before coating was measured by the above method and found to be 60.0 nm.

The surface of the silver alloy film of the substrate 1 which has only the silver alloy film having a thickness of 100 nm was coated with the negative photosensitive composition 1 after storage at 25° C. for 24 hours after preparation using a spin coater at the rotation speed adjusted so that a finally obtained cured film had a thickness of 1.5 μm to obtain a coated film, and the coated film thus obtained was prebaked at 100° C. under atmospheric pressure for 2 minutes using a hot plate to obtain a prebaked film. Using a both-surface alignment one-side surface exposure apparatus, the prebaked film was subjected to pattern exposure by irradiation with i-line (wavelength of 365 nm) of an ultrahigh-pressure mercury lamp at the minimum required exposure amount to obtain an exposed film. Then, paddle-type development with an aqueous 2.38% by weight TMAH solution (development time was 1.5 times the necessary minimum development time) was performed using a small-size development apparatus for photolithography, followed by rinsing with deionized water for 30 minutes and further drying by air blow to obtain a patterned developed film. As the curing step, using a high-temperature inert gas oven, the developed film was heated in an air atmosphere at 230° C. for 30 seconds to form a pixel division layer 1 on the surface of the silver alloy film. The maximum height difference ($Rmax^2$) of the surface of the silver alloy film located at the opening after forming the pixel division layer by the above method was measured and found to be 75.2 nm, and the difference ($Rmax^2-Rmax^1$) is 15.2 nm.

Separately, in order to consider the evaluation results of the negative photosensitive composition 1, as Reference Example 1, the maximum height difference of the substrate 1 ($Rmax^1$: 60.0 nm) including only a silver alloy film having a thickness of 100 nm alone was measured without using the negative photosensitive composition 1 after passing through the prebaking step, the exposure step, the development step and the curing step under the same processing conditions as those in formation of the pixel division layer 1, and found to be 86.0 nm. In other words, when the negative photosensitive composition 1 was not involved at all, the difference due to corrosion during the process was 26.0 nm, whereas the difference when the pixel division layer 1 was formed was decreased to 15.2 nm. In addition, since it was separately confirmed by using SEM that all the differences were caused by the local generation of the convex portions rather than the concave portions, it was considered that the negative photosensitive composition 1 has the action effect of suppressing the generation of the convex portions on the surface of the silver alloy film.

Next, the negative photosensitive composition 1 was stored in a freezer maintained at −20° C. under atmospheric pressure for 3 months, thawed in a water bath at a liquid temperature of 25° C. and then stirred on a shaker. The same evaluation was then performed, and the frozen storage stability of the negative photosensitive composition 1 was evaluated.

Table 7 collectively shows the evaluation results of the optical density, the development residue on the transparent conductive film, the change in maximum height difference on the surface of the silver alloy film, and the frozen storage stability.

TABLE 7

| | Name of negative photosensitive composition | After preparation of negative photosensitive composition | (1) Evaluation of optical density of cured film (OD/μm) | (2) Evaluation of development residue on transparent conductive film |
|---|---|---|---|---|
| Reference Example 1 | None | — | — | — |
| Example 1 | Negative photosensitive composition 1 | After storage at 25° C. for 24 hours | 1.4 | A |
| | | After storage in refrigerator (at −20° C.) for 3 months | 1.4 | A |
| Example 2 | Negative photosensitive composition 2 | After storage at 25° C. for 24 hours | 1.4 | A |
| | | After storage in refrigerator (at −20° C.) for 3 months | 1.4 | A |
| Example 3 | Negative photosensitive composition 3 | After storage at 25° C. for 24 hours | 1.4 | A |
| | | After storage in refrigerator (at −20° C.) for 3 months | 1.4 | A |
| Example 4 | Negative photosensitive composition 4 | After storage at 25° C. for 24 hours | 1.4 | A |
| | | After storage in refrigerator (at −20° C.) for 3 months | 1.4 | A |

| | (3) Evaluation of change in surface roughness of silver alloy film (nm) | | | | |
|---|---|---|---|---|---|
| | (i) Maximum height difference of surface of silver alloy film before coating ($Rmax^1$) | (ii) Maximum height difference of surface of silver alloy film located at openings after forming pixel division layer ($Rmax^2$) | Difference ($Rmax^2 - Rmax^1$) | Evaluation | (4) Evaluation of generation rate of off-pixel (%) |
| Reference Example 1 | 60.0 | 86.0 (substrate alone) | 26.0 | B | — |
| Example 1 | 60.0 | 65.2 | 5.2 | A | A |
| | 60.0 | 65.5 | 5.5 | A | A |
| Example 2 | 60.0 | 64.2 | 4.2 | AA | A |
| | 60.0 | 64.3 | 4.3 | AA | A |
| Example 3 | 60.0 | 68.2 | 8.2 | A | A |
| | 60.0 | 69.5 | 9.5 | A | A |
| Example 4 | 60.0 | 89.3 | 29.3 | B | A |
| | 60.0 | 117.6 | 57.6 | C | B |

Next, a top emission type organic EL display device including a cured film made of a cured product of the negative photosensitive composition 1 as a pixel division layer was fabricated by the following method, and the generation rate of off-pixel (%) was evaluated.

The fabrication process of a top emission type organic EL display device including a step of forming a pixel division layer is shown in Table 6.

A film of a silver alloy (an alloy composed of 99.00% by weight of silver and 1.00% by weight of copper) was formed on the whole surface of a non-alkali glass substrate 14 having a length of 70 mm and a width of 70 mm by a sputtering method. Using an alkali soluble novolac-based positive resist, the substrate was etched by immersing in a silver alloy etching solution SEA-1 at a liquid temperature of 30° C. to obtain a patterned silver alloy film 15 having a thickness of 100 nm. Further, an amorphous ITO film having a metastable phase was formed on the whole surface by a sputtering method. The substrate was immersed in an aqueous 5% by weight oxalic acid solution at a liquid temperature of 50° C. for 5 minutes using an alkali soluble novolac-based positive resist, shower washed with deionized water for 2 minutes, and then dried with air blow to obtain an amorphous ITO film with the same pattern which has a thickness of 10 nm. A low-temperature annealing treatment was performed at 150° C. for 30 minutes in a dry nitrogen atmosphere to obtain a low crystalline ITO film 16. By the above steps, a substrate 1 formed with a first electrode, including a first electrode composed of a laminated pattern of a silver alloy film/low crystalline ITO was obtained.

Using a spin coater, the surface of the substrate 1 formed with a first electrode was coated with the negative photosensitive composition 1 at the rotation speed adjusted so that the thickness of the finally obtained pixel division layer became 1.5 μm. Further, the coating film was prebaked at 100° C. under atmospheric pressure for 120 seconds using a hot plate to obtain a prebaked film. Using a both-surface alignment one-side surface exposure apparatus provided with an i-line path fighter, the prebaked film was subjected to pattern exposure was performed by irradiation at the minimum required exposure amount via a negative exposure mask to obtain an exposed film. Then, paddle-type development with an aqueous 2.38% by weight TMAH solution (development time was 1.5 times the necessary minimum development time) was performed using a small-size development apparatus for photolithography, followed by rinsing with deionized water for 30 minutes to obtain a patterned developed film. Using a high-temperature inert gas oven, the developed film was heated under air atmosphere at 230° C. for 30 seconds to obtain a substrate 1 formed with a pixel division layer, including a pixel division layer 17 having a thickness of 1.5 μm, in which 55 openings (length of 300 μm/width of 100 μm) are arranged in an area of 30 mm in length/30 mm in width in the center of the first electrode forming substrate.

Next, in order to form an organic EL layer 18 including a light emitting layer by the vacuum vapor deposition method, the substrate 1 formed with a pixel division layer was rotated to a vapor deposition source under vapor deposition conditions of vacuum degree of $1 \times 10^{-3}$ Pa or less and, first, a compound (HT-1) represented by the structural formula (61) was formed in a thickness of 10 nm as the hole injection layer, a compound (HT-2) represented by the structural formula (62) was formed in a thickness of 50 nm as the hole transporting layer. Then, a compound (GH-1) represented by the structural formula (63) as the host material was vapor-deposited and a compound (GD-1) represented by the structural formula (64) as the dopant material was vapor-deposited in a thickness of 40 nm on a light emitting layer. Then, a compound (ET-1) represented by the structural formula (66) and a compound (LiQ) represented by the structural formula (65) as the electron transporting material were laminated at a volume ratio of 1:1 in a thickness of 40 nm.

After the compound (LiQ) was vapor-deposited in a thickness of 2 nm, a pattern was vapor-deposited with a silver/magnesium alloy (volume ratio of 10:1), and a second electrode 19 having a thickness of 20 nm was formed so that 40 of 55 openings of the pixel division layer 1 could function as the light emitting pixel portion. Then, under low humidity/nitrogen atmosphere, a cap-shaped glass plate was bonded to seal using an epoxy resin-based adhesive to obtain a top emission type organic EL display device 1. The thickness of each layer constituting the organic EL layer 18 and the second electrode is much thinner than that of the pixel division layer mentioned above, and it is difficult to measure with high accuracy using a stylus type thickness measuring device. Therefore, the thickness was measured using a crystal oscillation type thickness monitor suitable for a thin film having a thickness of less than 100 nm, and the value obtained by rounding the average value of three points in the plane to one decimal place was regarded as the thickness.

[Chemical Formula 46]

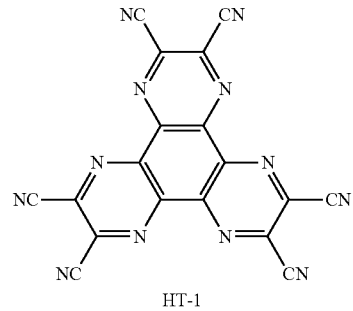

(61)

HT-1

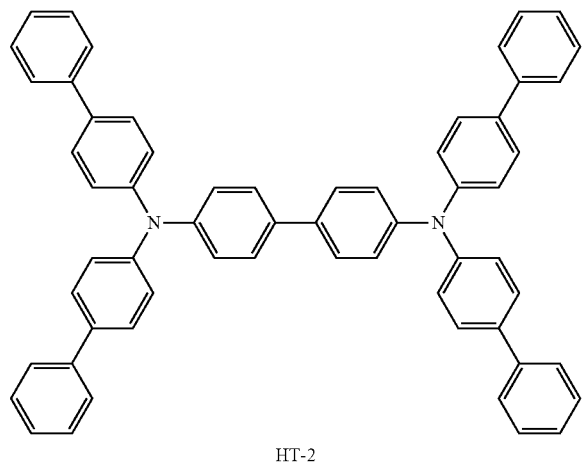

(62)

HT-2

-continued (63)

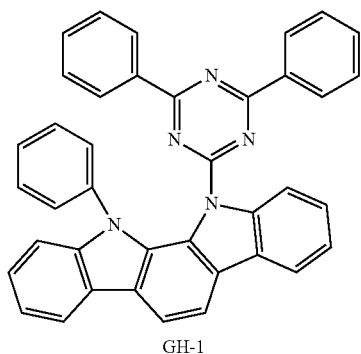

GH-1

[Chemical Formula 47]

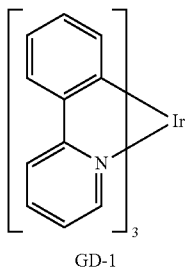

GD-1

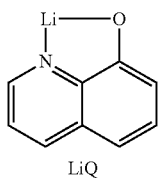

LiQ

-continued (66)

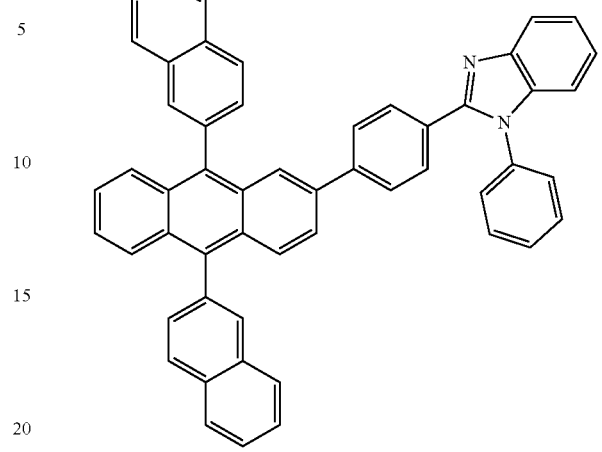

ET-1

By the same method, 9 parts of the same devices were additionally fabricated using the negative photosensitive composition 1, that is, 10 parts in total of the top emission type organic EL display devices 1 were fabricated and then the generation rate of off-pixel was evaluated by the above method. The evaluation results are shown in Table 7.

Examples 2 to 9: Preparation and Evaluation of Negative Photosensitive Compositions 2 to 9

Using the pigment dispersions 2 to 9 instead of the pigment dispersion 1, negative photosensitive compositions 2 to 9 were fabricated by the same procedure as in Example 1, and then the optical density, the development residue on the transparent conductive film, the change in maximum height difference on the surface of the silver alloy film, the frozen storage stability and the generation rate of off-pixel were evaluated by the above method. The solid content of all the negative photosensitive compositions 2 to 9 is 15.00% by weight, and the content of the benzodifuranone-based black pigment 2 in the solid component is 33.13% by weight. The mixing amount (g) of each raw material is shown in Table 6, Table 8 and Table 10, and the evaluation results are shown in Table 7, Table 9 and Table 11.

TABLE 8

| | Name of negative photosensitive composition | Pigment dispersion liquid | | (d) Alkali soluble resin | | (c) Photosensitive agent Compound having no tertiary amino group and having two or more radically polymerizable groups in the molecule | |
|---|---|---|---|---|---|---|---|
| | | Name | Weight (g) | Name | Weight (g) | Name | Weight (g) |
| Example 5 | Negative photosensitive composition 5 | Pigment dispersion liquid 5 | 11.93 | ZCR-1569H Alkali soluble acrylic resin solution B | 1.29 0.60 | DPCA-20 BP-4EAL EA-0250P | 0.23 0.23 0.72 |
| Example 6 | Negative photosensitive composition 6 | Pigment dispersion liquid 6 | 11.93 | ZCR-1569H Alkali soluble acrylic resin solution B | 1.29 0.60 | DPCA-20 BP-4EAL EA-0250P | 0.23 0.23 0.72 |
| Example 7 | Negative photosensitive composition 7 | Pigment dispersion liquid 7 | 11.93 | ZCR-1569H Alkali soluble acrylic resin | 1.29 0.60 | DPCA-20 BP-4EAL EA-0250P | 0.23 0.23 0.72 |

TABLE 8-continued

| | | | | | | | |
|---|---|---|---|---|---|---|---|
| Example 8 | Negative photosensitive composition 8 | Pigment dispersion liquid 8 | 11.93 | solution B ZCR-1569H Alkali soluble acrylic resin solution B | 1.29 0.60 | DPCA-20 BP-4EAL EA-0250P | 0.23 0.23 0.72 |

| | (c) Photosensitive agent Photopolymerization initiator (NCI-831E) Weight (g) | Nonionic surfactant (solution with solid content of 5% by weight of A-60) Weight (g) | Solvent Name | Weight (g) | Solid content of negative photosensitive composition (% by weight) |
|---|---|---|---|---|---|
| Example 5 | 0.18 | 0.90 | MBA PGMEA | 1.28 12.66 | 15.00 |
| Example 6 | 0.18 | 0.90 | MBA PGMEA | 1.28 12.66 | 15.00 |
| Example 7 | 0.18 | 0.90 | MBA PGMEA | 1.28 12.66 | 15.00 |
| Example 8 | 0.18 | 0.90 | MBA PGMEA | 1.28 12.66 | 15.00 |

TABLE 9

| | Name of negative photosensitive composition | After preparation of negative photosensitive composition | (1) Evaluation of optical density of cured film (OD/μm) | (2) Evaluation of development residue on transparent conductive film |
|---|---|---|---|---|
| Example 5 | Negative photosensitive composition 5 | After storage at 25° C. for 24 hours | 1.4 | A |
| | | After storage in refrigerator (at −20° C.) for 3 months | 1.4 | A |
| Example 6 | Negative photosensitive composition 6 | After storage at 25° C. for 24 hours | 1.4 | B |
| | | After storage in refrigerator (at −20° C.) for 3 months | 1.4 | B |
| Example 7 | Negative photosensitive composition 7 | After storage at 25° C. for 24 hours | 1.4 | B |
| | | After storage in refrigerator (at −20° C.) for 3 months | 1.4 | B |
| Example 8 | Negative photosensitive composition 8 | After storage at 25° C. for 24 hours | 1.4 | B |
| | | After storage in refrigerator (at −20° C.) for 3 months | 1.4 | B |

| | (3) Evaluation of change in surface roughness of silver alloy film (nm) | | | | |
|---|---|---|---|---|---|
| | (i) Maximum height difference of surface of silver alloy film before coating (Rmax$^1$) | (ii) Maximum height difference of surface of silver alloy film located at openings after forming pixel division layer (Rmax$^2$) | Difference (Rmax2 − Rmax1) | Evaluation | (4) Evaluation of generation rate of off-pixel (%) |
| Example 5 | 60.0 | 63.1 | 3.1 | AA | A |
| | 60.0 | 63.6 | 3.6 | AA | A |
| Example 6 | 60.0 | 97.3 | 37.3 | B | A |
| | 60.0 | 105.9 | 45.9 | B | A |
| Example 7 | 60.0 | 70.9 | 10.9 | B | A |
| | 60.0 | 85.2 | 25.2 | B | A |

TABLE 9-continued

| Example 8 | 60.0 | 123.7 | 63.7 | C | B |
| | 60.0 | 147.2 | 87.2 | C | B |

TABLE 10

| Name of negative photosensitive composition | Pigment dispersion liquid Name | Weight (g) | (d) Alkali soluble resin Name | Weight (g) | (c) Photosensitive agent Compound having no tertiary amino group and having two or more radically polymerizable groups in the molecule Name | Weight (g) |
|---|---|---|---|---|---|---|
| Example 9 | Negative photosensitive composition 9 | Pigment dispersion liquid 9 | 11.93 | ZCR-1569H | 1.29 | DPCA-20 | 0.23 |
| | | | | Alkali soluble acrylic resin solution B | 0.60 | BP-4EAL | 0.23 |
| | | | | | | EA-0250P | 0.72 |
| Example 10 | Negative photosensitive composition 10 | Pigment dispersion liquid 10 | 13.12 | ZCR-1569H | 0.95 | DPCA-20 | 0.23 |
| | | | | Alkali soluble acrylic resin solution B | 0.60 | BP-4EAL | 0.23 |
| | | | | | | EA-0250P | 0.72 |
| Example 11 | Negative photosensitive composition 11 | Pigment dispersion liquid 11 | 11.93 | ZCR-1569H | 0.13 | DPCA-20 | 0.23 |
| | | | | Alkali soluble polyimide resin A | 0.81 | BP-4EAL | 0.23 |
| | | | | Alkali soluble acrylic resin solution B | 0.60 | EA-0250P | 0.72 |
| Example 12 | Negative photosensitive composition 12 | Pigment dispersion liquid 12 | 11.93 | ZCR-1569H | 0.13 | DPCA-20 | 0.23 |
| | | | | Alkali soluble polyimide resin A | 0.81 | BP-4EAL | 0.23 |
| | | | | Alkali soluble acrylic resin solution B | 0.60 | EA-0250P | 0.72 |

| | (c) Photosensitive agent Photopolymerization initiator (NCI-831E) Weight (g) | Nonionic surfactant (solution with solid content of 5% by weight of A-60) Weight (g) | Solvent Name | Weight (g) | Solid content of negative photosensitive composition (% by weight) |
|---|---|---|---|---|---|
| Example 9 | 0.18 | 0.90 | MBA | 1.28 | 15.00 |
| | | | PGMEA | 12.66 | |
| Example 10 | 0.18 | 0.90 | MBA | 1.28 | 15.00 |
| | | | PGMEA | 11.81 | |
| Example 11 | 0.18 | 0.90 | MBA | 1.28 | 15.00 |
| | | | PGMEA | 13.01 | |
| Example 12 | 0.18 | 0.90 | MBA | 1.28 | 15.00 |
| | | | PGMEA | 13.01 | |

TABLE 11

| Name of negative photosensitive composition | After preparation of negative photosensitive composition | (1) Evaluation of optical density of cured film (OD/μm) | (2) Evaluation of development residue on transparent conductive film |
|---|---|---|---|
| Example 9 | Negative photosensitive composition 9 | After storage at 25° C. for 24 hours | 1.4 | AA |
| | | After storage in refrigerator (at −20° C.) for 3 months | 1.4 | AA |

TABLE 11-continued

| Example | | | | |
|---|---|---|---|---|
| Example 10 | Negative photosensitive composition 10 | After storage at 25° C. for 24 hours | 1.4 | B |
| | | After storage in refrigerator (at −20° C.) for 3 months | 1.4 | B |
| Example 11 | Negative photosensitive composition 11 | After storage at 25° C. for 24 hours | 1.4 | A |
| | | After storage in refrigerator (at −20° C.) for 3 months | 1.4 | A |
| Example 12 | Negative photosensitive composition 12 | After storage at 25° C. for 24 hours | 1.0 | B |
| | | After storage in refrigerator (at −20° C.) for 3 months | 1.0 | B |

(3) Evaluation of change in surface roughness of silver alloy film (nm)

| | (i) Maximum height difference of surface of silver alloy film before coating ($Rmax^1$) | (ii) Maximum height difference of surface of silver alloy film located at openings after forming pixel division layer ($Rmax^2$) | Difference ($Rmax^2 - Rmax^1$) | Evaluation | (4) Evaluation of generation rate of off-pixel (%) |
|---|---|---|---|---|---|
| Example 9 | 60.0 | 61.1 | 1.1 | AA | A |
| | 60.0 | 62.3 | 2.3 | AA | A |
| Example 10 | 60.0 | 125.5 | 65.5 | C | B |
| | 60.0 | 138.2 | 78.2 | C | B |
| Example 11 | 60.0 | 63.3 | 3.3 | AA | A |
| | 60.0 | 63.8 | 3.8 | AA | A |
| Example 12 | 60.0 | 88.7 | 28.7 | B | A |
| | 60.0 | 95.2 | 35.2 | B | A |

Example 10: Preparation and Evaluation of Negative Photosensitive Composition 10

Under a yellow light, 0.18 g of NCI-831E was added to a mixed solvent of 1.28 g of MBA and 11.81 g of PGMEA, and then dissolved therein by stirring for 3 minutes. To this, 0.95 g of ZCR-1569H and 0.60 g of an alkali soluble acrylic resin solution B were added, and then 0.23 g of DPCA-20, 0.23 g of BP-4EAL and 0.72 g of EA-0250P was added. Further, 0.90 g of a 5% by weight PGMEA solution of A-60 (manufactured by Kao Corporation) was added, followed by stirring for 10 minutes to obtain a mixed solution. This mixed solution and 13.12 g of the pigment dispersion liquid 10 were mixed, followed by stirring for 30 minutes to prepare a negative photosensitive composition 10. The optical density, the development residue on transparent conductive film, the change in maximum height difference of surface of silver alloy film, the frozen storage stability and the generation rate of off-pixel were evaluated by the above method. The solid content of the negative photosensitive composition 10 is 15.00% by weight, and the content of the benzodifuranone-based black pigment 1 in the solid component is 30.11% by weight. The mixing amount (g) of each raw material is shown in Table 10, and the evaluation results are shown in Table 11.

Example 11: Preparation and Evaluation of Negative Photosensitive Composition 11

Under a yellow light, 0.18 g of NCI-831E was added to a mixed solvent of 1.28 g of MBA and 13.01 g of PGMEA, and then dissolved therein by stirring for 3 minutes. To this, 0.13 g of ZCR-1569H, 0.81 g of an alkali soluble polyimide resin A and 0.60 g of an alkali soluble acrylic resin solution B were added, and then 0.23 g of DPCA-20, 0.23 g of BP-4EAL and 0.72 g of EA-0250P were added. Further, 0.90 g of a 5% by weight PGMEA solution of EMULGEN A-60 was added, followed by stirring for 10 minutes to obtain a mixed solution. This mixed solution and 11.93 g of the pigment dispersion 11 were mixed, followed by stirring for 30 minutes to prepare a negative photosensitive composition 11. The optical density, the development residue on transparent conductive film, the change in maximum height difference of surface of silver alloy film, the frozen storage stability and the generation rate of off-pixel were evaluated by the above method. The solid content of the negative photosensitive composition 11 is 15.00% by weight, and the content of the benzodifuranone-based black pigment 2 in the solid component is 33.13% by weight. The mixing amount (g) of each raw material is shown in Table 10, and the evaluation results are shown in Table 11.

Example 12: Preparation and Evaluation of Negative Photosensitive Composition 12

Using the pigment dispersion 12 instead of the pigment dispersion 11, a negative photosensitive composition 12 was prepared by the same procedure as in Example 11. Then, the optical density, the development residue on the transparent conductive film, the change in maximum height difference on the surface of the silver alloy film, the stability in freezing and storage and the generation rate of off-pixel were evaluated by the above method. The solid content of the negative photosensitive composition 12 is 15.00% by weight, and the content of the component (a-2) in the solid component is 30.11% by weight. The mixing amount (g) of each raw material is shown in Table 10, and the evaluation results are shown in Table 11.

Example 13: Preparation and Evaluation of Negative Photosensitive Composition 13

By the same procedure as in Example 5, except that the alkali soluble acrylic resin solution B was not used and replaced by ZCR-1569H, and the content of PGMEA was changed to 13.01 g, a negative photosensitive composition 13 was prepared. Then, the optical density, the development residue on the transparent conductive film, the change in maximum height difference on the surface of the silver alloy film, the frozen storage stability and the generation rate of off-pixel were evaluated by the above method. The solid content of the negative photosensitive composition 13 is 15.00% by weight, and the content of the benzodifuranone-based black pigment 2 in the solid component is 33.13% by weight. The mixing amount (g) of each raw material is shown in Table 12, and the evaluation results are shown in Table 13.

TABLE 12

| | Name of negative photosensitive composition | Pigment dispersion liquid | | (d) Alkali soluble resin | | (c) Photosensitive agent Compound having no tertiary amino group and having two or more radically polymerizable groups in the molecule | |
|---|---|---|---|---|---|---|---|
| | | Name | Weight (g) | Name | Weight (g) | Name | Weight (g) |
| Example 13 | Negative photosensitive composition 13 | Pigment dispersion liquid 5 | 11.93 | ZCR-1569H | 1.54 | DPCA-20 BP-4EAL EA-0250P | 0.23 0.23 0.72 |
| Example 14 | Negative photosensitive composition 14 | Pigment dispersion liquid 24 | 11.93 | WR-301 | 2.57 | DPCA-20 BP-4EAL EA-0250P | 0.23 0.23 0.72 |

| | (c) Photosensitive agent Photopolymerization initiator (NCI-831E) Weight (g) | Nonionic surfactant (solution with solid content of 5% by weight of A-60) Weight (g) | Solvent Name | Weight (g) | Solid content of negative photosensitive composition (% by weight) |
|---|---|---|---|---|---|
| Example 13 | 0.18 | 0.90 | MBA PGMEA | 1.28 13.01 | 15.00 |
| Example 14 | 0.18 | 0.90 | MBA PGMEA | 1.28 11.98 | 15.00 |

TABLE 13

| | Name of negative photosensitive composition | After preparation of negative photosensitive composition | (1) Evaluation of optical density of cured film (OD/μm) | (2) Evaluation of development residue on transparent conductive film |
|---|---|---|---|---|
| Example 13 | Negative photosensitive composition 13 | After storage at 25° C. for 24 hours | 1.4 | A |
| | | After storage in refrigerator (at −20° C.) for 3 months | 1.4 | A |
| Example 14 | Negative photosensitive composition 14 | After storage at 25° C. for 24 hours | 1.4 | A |
| | | After storage in refrigerator (at −20° C.) for 3 months | 1.4 | C |

TABLE 13-continued

| | (3) Evaluation of change in surface roughness of silver alloy film (nm) | | | | (4) Evaluation of generation rate of off-pixel (%) |
|---|---|---|---|---|---|
| | (i) Maximum height difference of surface of silver alloy film before coating (Rmax$^1$) | (ii) Maximum height difference of surface of silver alloy film located at openings after forming pixel division layer (Rmax$^2$) | Difference (Rmax$^2$ − Rmax$^1$) | Evaluation | Evaluation |
| Example 13 | 60.0 | 63.6 | 3.6 | A | A |
| | 60.0 | 64.5 | 4.5 | A | A |
| Example 14 | 60.0 | 77.3 | 17.3 | B | A |
| | 60.0 | 115.4 | 55.4 | C | B |

Example 14: Preparation and Evaluation of Negative Photosensitive Composition 14

Under a yellow light, 0.18 g of NCI-831E was added to a mixed solvent of 1.28 g of MBA and 11.98 g of PGMEA, and then dissolved therein by stirring for 3 minutes. To this, 2.57 g of WR-301, 0.23 g of DPCA-20, 0.23 g of BP-4EAL and 0.72 g of EA-0250P were added. Further, 0.90 g of a 5% by weight PGMEA solution of EMULGEN A-60 was added, followed by stirring for 10 minutes to obtain a mixed solution. This mixed solution and 11.93 g of the pigment dispersion liquid 24 were mixed, followed by stirring for 30 minutes to prepare a negative photosensitive composition 14. Then, the optical density, the development residue on transparent conductive film, the change in maximum height difference of surface of silver alloy film, the frozen storage stability and the generation rate of off-pixel were evaluated. The solid content of the negative photosensitive composition 14 is 15.00% by weight, and the content of the benzodifuranone-based black pigment 2 in the solid component is 33.13% by weight. The mixing amount (g) of each raw material is shown in Table 12, and the evaluation results are shown in Table 13.

Comparative Example 1: Preparation and Evaluation of Negative Photosensitive Composition 15

Under a yellow light, 0.18 g of NCI-831E was added to 11.42 g of MBA, and then dissolved therein by stirring for 3 minutes. To this, 0.80 g of an alkali soluble polyimide resin A and 0.45 g of dipentaerythritol hexaacrylate ("DPHA" in the table) were added, followed by stirring for 10 minutes to obtain a mixed solution. This formulation and 16.56 g of the pigment dispersion liquid 13 were mixed, followed by stirring for 30 minutes to prepare a negative photosensitive composition 15. Then, the optical density, the development residue on transparent conductive film, the change in maximum height difference of surface of silver alloy film, the frozen storage stability and the generation rate of off-pixel were evaluated by the above method. The solid content of the negative photosensitive composition 15 is 15.00% by weight, and the content of the benzodifuranone-based black pigment 1 in the solid component is 30.11% by weight. The mixing amount (g) of each raw material is shown in Table 14, and the evaluation results are shown in Table 15.

TABLE 14

| | Name of negative photosensitive composition | Pigment dispersion liquid Name | Weight (g) | (d) Alkali soluble resin Name | Weight (g) | (c) Photosensitive agent Compound having no tertiary amino group and having two or more radically polymerizable groups in the molecule Name | Weight (g) | Photopolymerization initiator Name |
|---|---|---|---|---|---|---|---|---|
| Comparative Example 1 | Negative photosensitive composition 15 | Pigment dispersion liquid 13 | 16.56 | Alkali soluble polyimide resin A | 0.80 | DPHA | 0.45 | — |
| Comparative Example 2 | Negative photosensitive composition 16 | Pigment dispersion liquid 13 | 16.56 | ZCR-1569H Alkali soluble acrylic resin solution B | 1.14 0.60 | DPCA-20 BP-4EAL EA-0250P | 0.23 0.23 0.72 | NCI-831E |
| Comparative Example 3 | Negative photosensitive composition 17 | Pigment dispersion liquid 14 | 23.76 | ZCR-1797H | 2.14 | DPHA-40H | 0.55 | OXE02 |
| Comparative Example 4 | Negative photosensitive composition 18 | Pigment dispersion liquid 15 | 21.86 | ZCR-1797H | 1.75 | DPHA | 0.87 | NCI-831E |

TABLE 14-continued

| | Name | | | Pigment dispersion liquid | | Alkali soluble resin | | Polymerizable compound | | Photopolymerization initiator |
|---|---|---|---|---|---|---|---|---|---|---|
| Comparative Example 5 | Negative photosensitive composition 19 | | | ZCR-1569H Alkali soluble acrylic resin solution B | 11.93 | | 1.29 0.60 | DPCA-20 BP-4EAL EA-0250P | 0.23 0.23 0.72 | NCI-831E |

| | (c) Photosensitive agent Photopolymerization initiator | Surfactant | | Additives (solution with solid content of 5% by weight of PM-21) | Solvent | | Solid content of negative photosensitive composition (% by weight) |
|---|---|---|---|---|---|---|---|
| | Weight (g) | Name | Weight (g) | Weight (g) | Name | Weight (g) | |
| Comparative Example 1 | 0.18 | — | — | — | MBA | 11.42 | 15.00 |
| Comparative Example 2 | 0.18 | Solution with solid content of 5% by weight of A-60 | 0.90 | — | PGMEA | 9.44 | 15.00 |
| Comparative Example 3 | 0.26 | Solution with solid content of 5% by weight of F-559 | 0.10 | 0.66 | MBA PGMEA | 1.14 3.03 | 22.00 |
| Comparative Example 4 | 0.26 | Solution with solid content of 5% by weight of F-559 | 0.10 | — | MBA PGMEA | 1.18 3.97 | 22.00 |
| Comparative Example 5 | 0.18 | Solution with solid content of 5% by weight of A-60 | 0.90 | — | MBA PGMEA | 1.28 12.66 | 15.00 |

TABLE 15

| | Name of negative photosensitive composition | After preparation of negative photosensitive composition | (1) Evaluation of optical density of cured film (OD/μm) | (2) Evaluation of development residue on transparent conductive film |
|---|---|---|---|---|
| Comparative Example 1 | Negative photosensitive composition 15 | After storage at 25° C. for 24 hours | 1.4 | D |
| | | After storage in refrigerator (at −20° C.) for 3 months | 1.3 | E |
| Comparative Example 2 | Negative photosensitive composition 16 | After storage at 25° C. for 24 hours | 1.4 | D |
| | | After storage in refrigerator (at −20° C.) for 3 months | 1.3 | D |
| Comparative Example 3 | Negative photosensitive composition 17 | After storage at 25° C. for 24 hours | 1.4 | D |
| | | After storage in refrigerator (at −20° C.) for 3 months | 1.4 | E |
| Comparative Example 4 | Negative photosensitive composition 18 | After storage at 25° C. for 24 hours | 1.4 | C |
| | | After storage in refrigerator (at −20° C.) for 3 months | 1.4 | D |
| Comparative Example 5 | Negative photosensitive composition 19 | After storage at 25° C. for 24 hours | 1.4 | B |
| | | After storage in refrigerator (at −20° C.) for 3 months | 1.4 | C |

TABLE 15-continued

| | (3) Evaluation of change in surface roughness of silver alloy film (nm) | | | | (4) Evaluation of generation rate of off-pixel (%) |
|---|---|---|---|---|---|
| | (i) Maximum height difference of surface of silver alloy film before coating ($Rmax^1$) | (ii) Maximum height difference of surface of silver alloy film located at openings after forming pixel division layer ($Rmax^2$) | Difference ($Rmax^2 - Rmax^1$) | Evaluation | |
| Comparative Example 1 | 60.0 | 199.6 | 139.6 | D | D |
| | 60.0 | 288.9 | 228.9 | E | E |
| Comparative Example 2 | 60.0 | 185.4 | 125.4 | D | D |
| | 60.0 | 227.6 | 167.6 | D | D |
| Comparative Example 3 | 60.0 | 343.3 | 283.3 | E | E |
| | 60.0 | 352.0 | 292.0 | E | E |
| Comparative Example 4 | 60.0 | 389.8 | 329.8 | E | E |
| | 60.0 | 455.0 | 395.0 | E | E |
| Comparative Example 5 | 60.0 | 298.6 | 238.6 | E | E |
| | 60.0 | 305.7 | 245.7 | E | E |

Comparative Example 2: Preparation and Evaluation of Negative Photosensitive Composition 16

Under a yellow light, 0.18 g of NCI-831E was added to 9.44 g of PGMEA, and then dissolved therein by stirring for 3 minutes. To this, 1.14 g of ZCR-1569H, 0.23 g of DPCA-20, 0.23 g of BP-4EAL and 0.72 g of EA-0250P were added. Further, 0.90 g of a 5% by weight PGMEA solution of EMULGEN A-60 was added, followed by stirring for 10 minutes to obtain a mixed solution. This mixed solution and 16.56 g of the pigment dispersion liquid 13 were mixed, followed by stirring for 30 minutes to prepare a negative photosensitive composition 16. Then, the optical density, the development residue on transparent conductive film, the change in maximum height difference of surface of silver alloy film, the frozen storage stability and the generation rate of off-pixel were evaluated by the above method. The solid content of the negative photosensitive composition 16 is 15.00% by weight, and the content of the benzodifuranone-based black pigment 1 in the solid component is 30.11% by weight. The mixing amount (g) of each raw material is shown in Table 14, and the evaluation results are shown in Table 15.

Comparative Example 3: Preparation and Evaluation of Negative Photosensitive Composition 17

Under a yellow light, 0.26 g of OXE02 as the photopolymerization initiator was added to a mixed solvent of 1.14 g of MBA and 3.03 g of PGMEA, and then dissolved therein by stirring for 3 minutes. To this, 2.14 g of ZCR-1797H and 0.55 g of DPHA-40H were added. Further, 0.66 g of a 5% by weight PGMEA solution of KAYAMER PM-21 as the methacryloyl group-containing phosphate was added, and 0.10 g of a 5% by weight PGMEA solution of MEGAFUCK F-559 (manufactured by DIC Corporation) as the surfactant was added, followed by stirring for 10 minutes to obtain a mixed solution. This mixed solution and 23.76 g of the pigment dispersion liquid 14 were mixed, followed by stirring for 30 minutes to prepare a negative photosensitive composition 17. Then, the optical density, the development residue on transparent conductive film, the change in maximum height difference of surface of silver alloy film, the frozen storage stability and the generation rate of off-pixel were evaluated by the above method. The solid content of the negative photosensitive composition 17 is 22.00% by weight, and the content of the benzodifuranone-based black pigment 1 in the solid component is 32.73% by weight. The mixing amount (g) of each raw material is shown in Table 14, and the evaluation results are shown in Table 15.

Comparative Example 4: Preparation and Evaluation of Negative Photosensitive Composition 18

Under a yellow light, 0.26 g of NCI-831E as the photopolymerization initiator was added to a mixed solvent of 1.18 g of MBA and 3.97 g of PGMEA, and then dissolved therein by stirring for 3 minutes. To this, 1.75 g of ZCR-1797H and 0.87 g of DPHA were added. Further, 0.10 g of a 5% by weight PGMEA solution of MEGAFUCK F-559 (manufactured by DIC Corporation) as the nonionic surfactant was added, followed by stirring for 10 minutes to obtain a mixed solution. This mixed solution and 21.86 g of the pigment dispersion liquid 15 were mixed, followed by stirring for 30 minutes to prepare a negative photosensitive composition 18. Then, the optical density, the development residue on transparent conductive film, the change in maximum height difference of surface of silver alloy film, the frozen storage stability and the generation rate of off-pixel were evaluated by the above method. The solid content of the negative photosensitive composition 18 is 22.00% by weight, and the content of the benzodifuranone-based black pigment 1 in the solid component is 30.11% by weight. The mixing amount (g) of each raw material is shown in Table 14, and the evaluation results are shown in Table 15.

Comparative Example 5: Preparation and Evaluation of Negative Photosensitive Composition 19

Using the pigment dispersion 16 instead of the pigment dispersion 1, a negative photosensitive composition 19 was prepared by the same procedure as in Example 1. Then, the optical density, the development residue on transparent conductive film, the change in maximum height difference of surface of silver alloy film, the frozen storage stability and the generation rate of off-pixel were evaluated by the above methods. The solid content of the negative photosensitive composition 19 is 15.00% by weight, and the content of the benzodifuranone-based black pigment 2 in the solid component is 33.13% by weight. The mixing amount (g) of each raw material is shown in Table 14, and the evaluation results are shown in Table 15.

Comparative Examples 6 to 8: Preparation and Evaluation of Negative Photosensitive Compositions 20 to 22

Using the pigment dispersion liquids 18, 19 and 22, respectively, instead of the pigment dispersion liquid 1, negative photosensitive compositions 20 to 22 were prepared by the same procedure as in Example 1. Then, the optical density, the development residue on transparent conductive film, the change in maximum height difference of surface of silver alloy film, the frozen storage stability and the generation rate of off-pixel were evaluated. The solid content of all of the negative photosensitive compositions 20 to 22 is 15.00% by weight, and the content of the benzodifuranone-based black pigment 2 in the solid component is 33.13% by weight. The mixing amount (g) of each raw material is shown in Table 16, and the evaluation results are shown in Table 17.

TABLE 16

|  | Name of negative photosensitive composition | Pigment dispersion liquid | | (d) Alkali soluble resin | | (c) Photosensitive agent Compound having no tertiary amino group and having two or more radically polymerizable groups in the molecule | |
|---|---|---|---|---|---|---|---|
|  |  | Name | Weight (g) | Name | Weight (g) | Name | Weight (g) |
| Comparative Example 6 | Negative photosensitive composition 20 | Pigment dispersion liquid 18 | 11.93 | ZCR-1569H Alkali soluble acrylic resin solution B | 1.29 0.60 | DPCA-20 BP-4EAL EA-0250P | 0.23 0.23 0.72 |
| Comparative Example 7 | Negative photosensitive composition 21 | Pigment dispersion liquid 19 | 11.93 | ZCR-1569H Alkali soluble acrylic resin solution B | 1.29 0.60 | DPCA-20 BP-4EAL EA-0250P | 0.23 0.23 0.72 |
| Comparative Example 8 | Negative photosensitive composition 22 | Pigment dispersion liquid 22 | 11.93 | ZCR-1569H Alkali soluble acrylic resin solution B | 1.29 0.60 | DPCA-20 BP-4EAL EA-0250P | 0.23 0.23 0.72 |
| Comparative Example 9 | Negative photosensitive composition 23 | Pigment dispersion liquid 23 | 11.93 | ZCR-1569H Alkali soluble acrylic resin solution B | 1.29 0.60 | DPCA-20 BP-4EAL EA-0250P | 0.23 0.23 0.72 |

|  | (c) Photosensitive agent Photopolymerization initiator | Nonionic surfactant (solution with solid content of 5% by weight of | Solvent | | Solid content of negative photosensitive |
|---|---|---|---|---|---|
|  | (NCI-831E) Weight (g) | A-60) Weight (g) | Name | Weight (g) | composition (% by weight) |
| Comparative Example 6 | 0.18 | 0.90 | MBA PGMEA | 1.28 12.66 | 15.00 |
| Comparative Example 7 | 0.18 | 0.90 | MBA PGMEA | 1.28 12.66 | 15.00 |
| Comparative Example 8 | 0.18 | 0.90 | MBA PGMEA | 1.28 12.66 | 15.00 |
| Comparative Example 9 | 0.18 | 0.90 | MBA PGMEA | 1.28 12.66 | 15.00 |

TABLE 17

|  | Name of negative photosensitive composition | After preparation of negative photosensitive composition | (1) Evaluation of optical density of cured film (OD/μm) | (2) Evaluation of development residue on transparent conductive film |
|---|---|---|---|---|
| Comparative Example 6 | Negative photosensitive composition 20 | After storage at 25° C. for 24 hours | 1.4 | E |
|  |  | After storage in refrigerator (at −20° C.) for 3 months | 1.3 | E |

TABLE 17-continued

| | | | | |
|---|---|---|---|---|
| Comparative Example 7 | Negative photosensitive composition 21 | After storage at 25° C. for 24 hours | 1.4 | D |
| | | After storage in refrigerator (at −20° C.) for 3 months | 1.3 | E |
| Comparative Example 8 | Negative photosensitive composition 22 | After storage at 25° C. for 24 hours | 1.4 | C |
| | | After storage in refrigerator (at −20° C.) for 3 months | 1.4 | D |
| Comparative Example 9 | Negative photosensitive composition 23 | After storage at 25° C. for 24 hours | 1.0 | C |
| | | After storage in refrigerator (at −20° C.) for 3 months | 1.0 | E |

| | (3) Evaluation of change in surface roughness of silver alloy film (nm) | | | | (4) Evaluation of generation rate of off-pixel (%) |
|---|---|---|---|---|---|
| | (i) Maximum height difference of surface of silver alloy film before coating ($Rmax^1$) | (ii) Maximum height difference of surface of silver alloy film located at openings after forming pixel division layer ($Rmax^2$) | Difference ($Rmax^2$ − $Rmax^1$) | Evaluation | |
| Comparative Example 6 | 60.0 | 239.5 | 179.5 | D | E |
| | 60.0 | 280.9 | 220.9 | E | E |
| Comparative Example 7 | 60.0 | 341.6 | 281.6 | E | E |
| | 60.0 | 358.9 | 298.9 | E | E |
| Comparative Example 8 | 60.0 | 245.0 | 185.0 | D | D |
| | 60.0 | 259.0 | 199.0 | D | D |
| Comparative Example 9 | 60.0 | 390.5 | 330.5 | E | E |
| | 60.0 | 476.0 | 416.0 | E | E |

Comparative Example 9: Preparation and Evaluation of Negative Photosensitive Composition 23

Using the pigment dispersion liquid 23 instead of the pigment dispersion liquid 1, a negative photosensitive composition 23 was prepared by the same procedure as in Example 1. Then, the optical density, the development residue on transparent conductive film, the change in maximum height difference of surface of silver alloy film, the frozen storage stability and the generation rate of off-pixel were evaluated by the above method. The solid content of the negative photosensitive composition 23 is 15.00% by weight, and the content of the component (a-2) in the solid component is 30.11% by weight. The mixing amount (g) of each raw material is shown in Table 16, and the evaluation results are shown in Table 17.

Example 15: Preparation and Evaluation of Negative Photosensitive Composition 24

Figure 7:
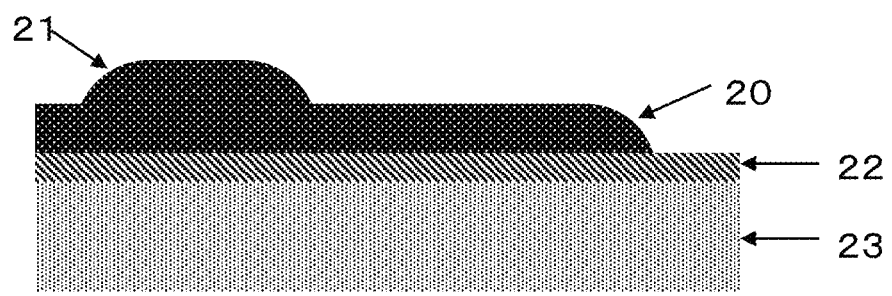
FIG. 7 is a cross-sectional view showing a substrate for forming a pixel division layer, which includes a thin film portion and a thick film portion fabricated in Example 15.

Under a yellow light, 0.18 g of a compound represented by the structural formula (31) as the photopolymerization initiator was added to a mixed solvent of 2.55 g of MBA and 12.91 g of PGMEA, and then dissolved therein by stirring for 3 minutes. To this, 0.95 g of ZCR-1569H and 3.00 g of an alkali soluble acrylic resin solution C were added, and then 0.23 g of DPCA-60 and 1.17 g of EA-0250P (PGMEA solution with a solid content of 50% by weight) were added, followed by stirring for 10 minutes to obtain a mixed solution. This mixed solution and 8.84 g of the pigment dispersion liquid 5 were mixed, followed by stirring for 30 minutes to obtain a negative photosensitive composition 24. Then, the optical density, the development residue on transparent conductive film, the change in maximum height difference of the surface of the silver alloy film and the frozen storage stability were evaluated by the above method. Except that the surface of the substrate formed with a first electrode was coated with a negative photosensitive composition 24 at the rotation speed adjusted so that a thin film portion had a thickness of 1.5 μm and a thick film portion had a thickness of 3.0 μm in the finally obtained pixel division layer, and that pattern exposure was performed with a fulltone exposure amount in halftone processing calculated by the above method via a negative halftone exposure mask including a semi-transmission portion having an i-line transmittance corresponding to 30% of a full transmission portion, the full transmission portion and a full light-shielding portion in the plane, a substrate formed with a pixel division layer, including a thin film portion having a thickness of 1.5 μm and a thick film portion having a thickness of 3.0 μm was obtained by the same method as in Example 1 (FIG. 7). The difference in thickness between the thin film portion and the thick film portion is 1.5 μm. Further, an organic EL display device was fabricated by the same method as in Example 1, and the generation rate (%) of off-pixel was evaluated. The solid content of the negative photosensitive composition 24 is 15.00% by weight, and the content of the benzodifuranone-based black pigment 2 in the solid component is 24.56% by weight (the content of the nucleus is 22.33% by weight). The mixing amount (g) of each raw material is shown in Table 18, and the evaluation results are shown in Table 19.

TABLE 18

| Name of negative photosensitive composition | Pigment dispersion liquid Name | Weight (g) | (d) Alkali soluble resin Name | Weight (g) | (c) Photosensitive agent Compound having no tertiary amino group and having two or more radically polymerizable groups in the molecule Name | Weight (g) |
|---|---|---|---|---|---|---|
| Example 15 Negative photosensitive composition 24 | Pigment dispersion liquid 5 | 8.84 | ZCR-1569H<br>Alkali soluble acrylic resin solution C | 0.95<br>3.00 | DPCA-60<br>EA-0250P | 0.23<br>1.17 |
| Example 16 Negative photosensitive composition 25 | Pigment dispersion liquid 5 | 8.84 | Alkali soluble polyimide resin A<br>Alkali soluble acrylic resin solution C | 1.11<br>1.50 | DPCA-60<br>EA-0250P | 0.23<br>1.17 |
| Comparative Example 10 Negative photosensitive composition 26 | Pigment dispersion liquid 14 | 10.05 | ZCR-1569H<br>Alkali soluble acrylic resin solution C | 0.60<br>3.00 | DPCA-60<br>EA-0250P | 0.23<br>1.17 |

| | (c) Photosensitive agent Photopolymerization initiator (compound represented by the structural formula (31)) Weight (g) | Thermal crosslinking agent (TEPIC-L) Weight (g) | Solvent Name | Weight (g) | Solid content of negative photosensitive composition (% by weight) |
|---|---|---|---|---|---|
| Example 15 | 0.18 | 0.18 | MBA<br>PGMEA | 2.55<br>12.91 | 15.00 |
| Example 16 | 0.18 | 0.18 | MBA<br>PGMEA | 2.55<br>14.24 | 15.00 |
| Comparative Example 10 | 0.18 | 0.18 | MBA<br>PGMEA | 2.55<br>12.05 | 15.00 |

TABLE 19

| | Name of negative photosensitive composition | After preparation of negative photosensitive composition | (1) Evaluation of optical density of cured film (OD/μm) | (2) Evaluation of development residue on transparent conductive film |
|---|---|---|---|---|
| Example 15 | Negative photosensitive composition 24 | After storage at 25° C. for 24 hours | 1.0 | A |
| | | After storage in refrigerator (at −20° C.) for 3 months | 1.0 | A |
| Example 16 | Negative photosensitive composition 25 | After storage at 25° C. for 24 hours | 1.0 | A |
| | | After storage in refrigerator (at −20° C.) for 3 months | 1.0 | A |
| Comparative Example 10 | Negative photosensitive composition 26 | After storage at 25° C. for 24 hours | 1.0 | D |
| | | After storage in refrigerator (at −20° C.) for 3 months | 1.0 | E |

TABLE 19-continued

| | (3) Evaluation of change in surface roughness of silver alloy film (nm) | | | | (4) Evaluation of generation rate of off-pixel (%) |
|---|---|---|---|---|---|
| | (i) Maximum height difference of surface of silver alloy film before coating (Rmax$^1$) | (ii) Maximum height difference of surface of silver alloy film located at openings after forming pixel division layer (Rmax$^2$) | Difference (Rmax$^2$ − Rmax$^1$) | Evaluation | |
| Example 15 | 60.0 | 61.9 | 1.9 | AA | A |
| | 60.0 | 62.5 | 2.5 | AA | A |
| Example 16 | 60.0 | 62.0 | 2.0 | AA | A |
| | 60.0 | 62.2 | 2.2 | AA | A |
| Comparative Example 10 | 60.0 | 367.6 | 307.6 | E | E |
| | 60.0 | 373.2 | 313.2 | E | E |

Example 16: Preparation and Evaluation of Negative Photosensitive Composition 25

Using the alkali soluble polyimide resin A instead of ZCR-1569H, a negative photosensitive composition 25 was prepared by the same procedure as in Example 15. Then, the optical density, the development residue on transparent conductive film, the change in maximum height difference of surface of silver alloy film and the frozen storage stability were evaluated by the above method. Further, by the same method as in Example 15, a substrate formed with a pixel division layer, including a thin film portion having a thickness of 1.5 μm and a thick film portion having a thickness of 3.0 μm was obtained, and the generation rate of off-pixel was evaluated. The solid content of the negative photosensitive composition 25 is 15.00% by weight, and the content of the benzodifuranone-based black pigment 2 in the solid component is 24.56% by weight (the content of the nucleus is 22.33% by weight). The mixing amount (g) of each raw material is shown in Table 18, and the evaluation results are shown in Table 19.

Comparative Example 10: Preparation and Evaluation of Negative Photosensitive Composition 26

Using the pigment dispersion liquid 14 instead of the pigment dispersion liquid 5, a negative photosensitive composition 26 was prepared by the same procedure as in Example 15. Then, the optical density, the development residue on transparent conductive film, the change in maximum height difference of surface of silver alloy film and the frozen storage stability were evaluated by the above method. Further, by the same method as in Example 15, a substrate formed with a pixel division layer, including a thin film portion having a thickness of 1.5 μm and a thick film portion having a thickness of 3.0 μm was obtained. An organic EL display device was fabricated by the same method as in Example 1, and the generation rate of off-pixel was evaluated. The solid content of the negative photosensitive composition 26 is 15.00% by weight, and the content of the benzodifuranone-based black pigment 1 in the solid component is 22.33% by weight. The mixing amount (g) of each raw material is shown in Table 18, and the evaluation results are shown in Table 19.

Comparative Example 11

The above negative photosensitive composition 17 was prepared again with the same mixing amount and halftone processing was attempted, but the film peeling was remarkable, thus failing to fabricate an organic EL display device including a pixel division layer which includes a thin film portion having a thickness of 1.5 μm and a thick film portion having a thickness of 3.0 μm.

It can be seen that, in Examples 1 to 16, not only the developability on the transparent conductive film is excellent as compared with Comparative Examples 1 to 10, but also the maximum height difference (Rmax$^2$) on the surface of the silver alloy film can be reduced. It can also be seen that the generation rate of generation rate in the organic EL display device can be suppressed to a low level. Furthermore, the frozen storage stability is also excellent and the performance as a photosensitive composition is maintained. The above results reveal that the photosensitive composition or the negative photosensitive composition of the present invention is very useful.

REFERENCE SIGNS LIST

1: TFT
2: Wiring line
3: TFT insulating layer
4: Planarization layer
5: First electrode
6: Substrate
7: Contact hole
8: Pixel division layer
9: Light emitting pixel
10: Second electrode
11: Pixel division layer
12: Silver alloy film
13: Non-alkali glass substrate
14: Non-alkali glass substrate
15: Silver alloy film
16: Low crystallinity ITO film
17: Pixel division layer
18: Organic EL layer
19: Second electrode
20: Thin film portion in pixel division layer
21: Thick film portion in pixel division layer
22: First electrode
23: Non-alkali glass substrate

The invention claimed is:
1. A negative photosensitive composition comprising:
   (a-1) an organic black pigment or (a-2) a mixed organic black pigment,

(b) a resin having two or more tertiary amino groups in the molecule, and
(c) a photosensitive agent, wherein
the component (b) contains a resin having a structure represented by formula (16):

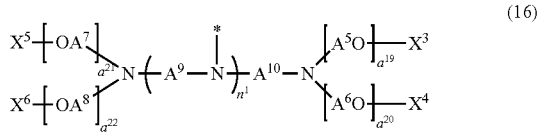

wherein, in formula (16),
* represents a bonding site to a carbon atom,
$A^5O$, $A^6O$, $OA^7$ and $OA^8$ each independently represent an oxyalkylene group having 1 to 5 carbon atoms,
$A^9$ and $A^{10}$ each independently represent an alkylene group having 2 to 6 carbon atoms,
$n^1$ is an integer and represents 0 to 7,
$X^3$ to $X^6$ each independently represent a hydrogen atom or a hydrocarbon group having 1 to 5 carbon atoms, and
$a^{19}$ to $a^{22}$ are integers and each independently represent 1 to 100.

2. The negative photosensitive composition according to claim 1, wherein the composition contains the organic black pigment (a-1) that contains a benzodifuranone-based black pigment represented by formula (2) or formula (3):

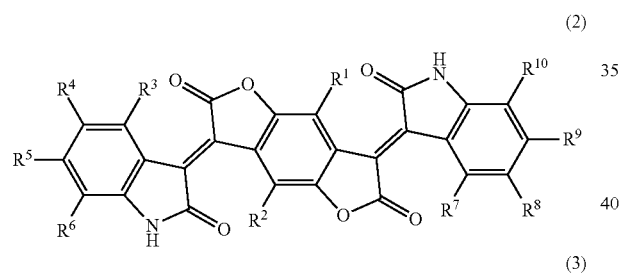

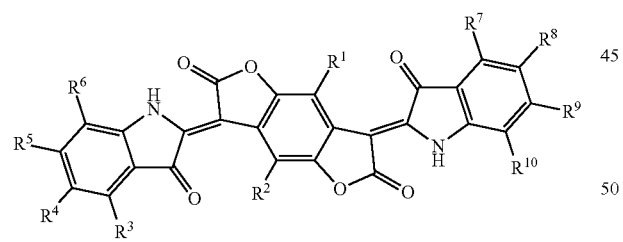

wherein, in formula (2) and formula (3),
$R^1$ and $R^2$ each independently represent a hydrogen atom or a methyl group, and
$R^3$, $R^4$, $R^5$, $R^6$, $R^7$, $R^8$, $R^9$, $R^{10}$ each independently represent a hydrogen atom or an alkyl group having 1 to 12 carbon atoms.

3. The negative photosensitive composition according to claim 2, wherein the benzodifuranone-based black pigment represented by formula (2) or formula (3) includes a coating layer on the surface thereof, and the coating layer contains at least one coating material selected from the group consisting of silica, metal oxide and metal hydroxide.

4. The negative photosensitive composition according to claim 1, wherein the resin having a structure represented by formula (16) contains a resin in which the value obtained by dividing (the total number of mols of repeating units containing an oxyalkylene group having 1 and 2 carbon atoms) by (the total number of mols of repeating units containing an oxyalkylene group having 3 to 5 carbon atoms) is 0.76 to 4.00.

5. The negative photosensitive composition according to claim 1, further comprising (d) an alkali soluble resin that contains an alkali soluble polyimide resin and/or an alkali soluble epoxy (meth)acrylate resin.

6. The negative photosensitive composition according to claim 1, wherein the component (b) further contains a resin having a structure represented by formula (22):

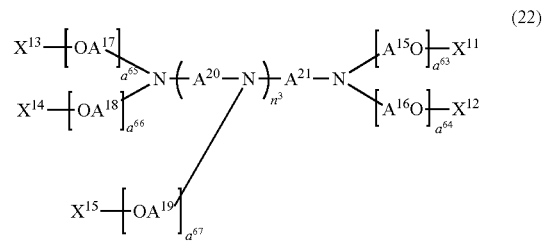

wherein, in formula (22),
$A^{15}O$, $A^{16}O$, $OA^{17}$, $OA^{18}$ and $OA^{19}$ each independently represent an oxyalkylene group having 1 to 5 carbon atoms,
$A^{20}$ and $A^{21}$ each independently represent an alkylene group having 2 to 6 carbon atoms,
$n^3$ is an integer and represents 0 to 9,
$X^{11}$ to $X^{15}$ each independently represent a hydrogen atom, a hydrocarbon group having 1 to 5 carbon atoms, a group represented by formula (23) or a group represented by formula (24), in which at least one of $X^{11}$ and $X^{12}$ and at least one of $X^{13}$ and $X^{14}$ is an organic group represented by formula (23) or an organic group represented by formula (24), and
$a^{63}$ to $a^{67}$ are integers and each independently represent 1 to 100:

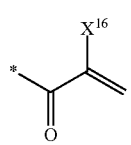

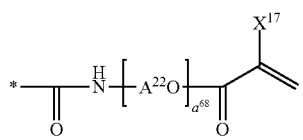

wherein, in formula (23),
* represents a bonding site to an oxygen atom, and
$X^{16}$ represents a hydrogen atom or a methyl group; and
wherein, in formula (24),
* represents a bonding site to an oxygen atom,
$X^{17}$ represents a hydrogen atom or a methyl group,
$A^{22}O$ represents an oxyalkylene group having 1 to 5 carbon atoms, and
$a^{68}$ is an integer and represents 1 to 5.

7. The negative photosensitive composition according to claim 5, wherein the component (d) further contains an alkali soluble acrylic resin including a structural unit represented by formula (39):

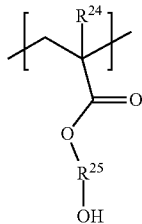
(39)

wherein, in formula (39),
$R^{24}$ represents a hydrogen atom or a methyl group, and
$R^{25}$ is a divalent linking group and represents a hydrocarbon group having 2 to 6 carbon atoms.

8. The photosensitive composition or the negative photosensitive composition according to claim 1, which is used for forming a pixel division layer.

9. A pixel division layer comprising a cured product of the photosensitive composition or the negative photosensitive composition according to claim 1.

10. An organic EL display device comprising, in addition to the pixel division layer according to claim 9, a first electrode, a light emitting pixel and a second electrode, wherein the first electrode includes a silver alloy film.

11. An organic EL display device comprising a pixel division layer containing a resin which has two or more tertiary amino groups in the molecule and has a structure represented by formula (16):

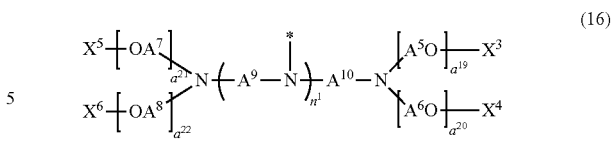
(16)

wherein, in formula (16),
* represents a bonding site to a carbon atom,
$A^5O$, $A^6O$, $oA^7$ and $OA^8$ each independently represent an oxyalkylene group having 1 to 5 carbon atoms,
$A^9$ and $A^{10}$ each independently represent an alkylene group having 2 to 6 carbon atoms,
$n^1$ is an integer and represents 0 to 7,
$X^3$ to $X^6$ each independently represent a hydrogen atom or a hydrocarbon group having 1 to 5 carbon atoms, and
$a^{19}$ to $a^{22}$ are integers and each independently represent 1 to 100.

12. The organic EL display device according to claim 11, wherein the organic EL display device is a top emission type.

13. The organic EL display device according to claim 11, wherein the pixel division layer includes a thin film portion having a thickness of 0.5 1 μm or more and less than 2.0 1 μm and a thick film portion having a thickness of 2.0 μm or more and 5.0 1 μm or less, and also includes a portion in which a difference in thickness between the thin film portion and the thick film portion is 1.0 1 μm or more.

14. The photosensitive composition or the negative photosensitive composition according to claim 2, wherein in formula (16) $n^1$ is an integer and represents 1 to 7.

* * * * *